(12) United States Patent
Ohori et al.

(10) Patent No.: US 11,624,760 B2
(45) Date of Patent: Apr. 11, 2023

(54) METHOD FOR CONTROLLING DEVICES PROVIDED WITH COMMUNICATION FUNCTION, AND DEVICE USED IN IMPLEMENTING THE METHOD

(71) Applicant: DAIHEN Corporation, Osaka (JP)

(72) Inventors: Akihiro Ohori, Osaka (JP); Nobuyuki Hattori, Osaka (JP)

(73) Assignee: DAIHEN Corporation, Osaka (JP)

( * ) Notice: Subject to any disclaimer, the term of this patent is extended or adjusted under 35 U.S.C. 154(b) by 118 days.

(21) Appl. No.: 17/320,895

(22) Filed: May 14, 2021

(65) Prior Publication Data

US 2021/0270874 A1    Sep. 2, 2021

Related U.S. Application Data

(63) Continuation of application No. 16/285,501, filed on Feb. 26, 2019, now Pat. No. 11,029,345, which is a
(Continued)

(30) Foreign Application Priority Data

Jul. 25, 2013  (JP) ................................. 2013-154536
Aug. 2, 2013   (JP) ................................. 2013-161243
(Continued)

(51) Int. Cl.
     *G01R 19/25*          (2006.01)
(52) U.S. Cl.
     CPC ................................ *G01R 19/2513* (2013.01)
(58) Field of Classification Search
     CPC ......... Y02E 40/20; Y02E 40/70; Y02E 60/00; H02J 13/00002; H02J 13/00022;
     (Continued)

(56) References Cited

U.S. PATENT DOCUMENTS 6,250,091 B1   6/2001   Jerome
6,647,026 B1   11/2003  Tanaka
(Continued)

FOREIGN PATENT DOCUMENTS

JP   50-26402 B    9/1975
JP   57-55726 A    4/1982
(Continued)

OTHER PUBLICATIONS

Olfati-Saber et al. "Consensus and Cooperation in Networked Multi-Agent Systems". Proceedings of the IEEE, vol. 95, No. 1, January 2997, pp. 215-233.
(Continued)

*Primary Examiner* — Feba Pothen
*Assistant Examiner* — Brent J Andrews
(74) *Attorney, Agent, or Firm* — Hamre, Schumann, Mueller & Larson, P.C.

(57) ABSTRACT

A measurement device that performs a predetermined measurement task together with a plurality of other measurement devices is provided. This measurement device is provided with a sampling phase generator for generating a sampling phase for instructing a timing of sampling, and a communication unit for communicating with at least one of the plurality of other measurement devices. The communication unit transmits the sampling phase generated by the sampling phase generator to at least one of the plurality of other measurement devices. The sampling phase generator is configured to generate a third sampling phase, using an operation that is based on a generated first sampling phase and a second sampling phase received by the communication unit from at least one of the plurality of other measurement devices.

14 Claims, 47 Drawing Sheets

Related U.S. Application Data continuation of application No. 14/338,952, filed on Jul. 23, 2014, now Pat. No. 10,247,764.

(30) Foreign Application Priority Data

| Aug. 7, 2013 | (JP) | ................................. 2013-164073 |
| Aug. 12, 2013 | (JP) | ................................. 2013-167635 |
| Aug. 12, 2013 | (JP) | ................................. 2013-167636 |
| Aug. 12, 2013 | (JP) | ................................. 2013-167637 |
| Feb. 12, 2014 | (JP) | ................................. 2014-024227 |
| Mar. 27, 2014 | (JP) | ................................. 2014-065167 |

(58) Field of Classification Search
CPC ...... H02J 2300/22; H02J 3/1842; H02J 3/381; H02J 3/388; Y04S 10/123; Y04S 10/22; Y04S 10/30; Y04S 40/126
See application file for complete search history.

(56) References Cited

U.S. PATENT DOCUMENTS

| 2006/0069522 | A1 | 3/2006 | Bruno |
| 2011/0170527 | A1* | 7/2011 | Yamamoto ........ H04W 56/0035 370/338 |
| 2011/0292819 | A1* | 12/2011 | Ekbal .................... G01S 13/765 370/252 |
| 2012/0076245 | A1 | 3/2012 | Kitano |
| 2012/0271576 | A1 | 10/2012 | Kamel et al. |
| 2013/0229735 | A1 | 9/2013 | Rostron |
| 2014/0008986 | A1 | 1/2014 | Miyauchi et al. |

FOREIGN PATENT DOCUMENTS

| JP | 58-79340 A | 5/1983 |
| JP | 63-99646 A | 4/1988 |
| JP | 64-39843 A | 2/1989 |
| JP | 4-268841 A | 9/1992 |
| JP | 4-287532 A | 10/1992 |
| JP | 04287532 A * | 10/1992 |
| JP | 9-9510 A | 1/1997 |
| JP | 9-230952 A | 9/1997 |
| JP | 10-94174 A | 4/1998 |
| JP | 10-155240 A | 6/1998 |
| JP | 10-290574 A | 10/1998 |
| JP | 2000-101597 A | 4/2000 |
| JP | 2000-209872 A | 7/2000 |
| JP | 2000-358831 A | 12/2000 |
| JP | 2004-304868 A | 10/2004 |
| JP | 2005-167823 A | 6/2005 |
| JP | 2007-124797 A | 5/2007 |
| JP | 2008-43184 A | 2/2008 |
| JP | 2009-89534 A | 4/2009 |
| JP | 2009089534 A * | 4/2009 |
| JP | 2010-63337 A | 3/2010 |
| JP | 2010-63338 A | 3/2010 |
| JP | 2010-68630 A | 3/2010 |
| JP | 2011-217442 A | 10/2011 |
| JP | 2012-50215 A | 3/2012 |
| JP | 2012-181769 A | 9/2012 |
| WO | 2012/132948 A1 | 10/2012 |

OTHER PUBLICATIONS

Mitani. "Power System Observation by using Synchronized Phasor Measurements as a Smart Device". IEEJ Trans. PE, vol. 130, No. 9, 2010, pp. 791-794, and English abstract.

Office Action received in the corresponding Japanese Patent application, dated Feb. 28, 2017, 3 pages.

Office Action issued in corresponding Japanese Patent Application No. 2013-164073, dated May 2, 2017 (3 pages).

Office Action issued in corresponding Japanese Patent Application No. 2013-167636, dated May 2, 2017 (2 pages).

Office Action issued in the corresponding Japanese Patent Application, dated Jun. 6, 2017 (8 pages).

Office Action received in corresponding Japanese Patent application, dated Jan. 9, 2018 (4 pages).

Office Action issued in the correspondence Japanese Patent Application, dated Jan. 30, 2018 (8 pages).

Office Action issued in the corresponding Japanese Patent Application, dated May 8, 2018 (3 pages).

Office Action issued in the corresponding Japanese Patent application, dated Jul. 10, 2018 (3 pages).

Office Action received in the corresponding Japanese Patent application, dated Oct. 2, 2018 (5 pages).

Office Action received in the corresponding Japanese Patent application, dated Nov. 26, 2019, and corresponding machine translation (27 pages).

* cited by examiner

METHOD FOR CONTROLLING DEVICES PROVIDED WITH COMMUNICATION FUNCTION, AND DEVICE USED IN IMPLEMENTING THE METHOD

BACKGROUND OF THE INVENTION

1. Field of the Invention

The present invention relates to a method for controlling a plurality of devices provided with a communication function. Also, the present invention relates to a device that is used in implementing the method.

2. Description of Related Art

In recent years, distributed power sources such as solar power and wind power are becoming more widely used. However, with power sources utilizing such renewable energy, power supply tends to be unstable, and there is concern that an existing electric power grid will become unstable when such power sources are connected to the electric power grid on a large-scale. As a countermeasure to this, conventionally, a plurality of measurement devices are disposed in the electric power grid, and the power supply situation is constantly monitored.

The plurality of measurement devices need to perform a predetermined measurement at the same timing. It has been proposed to utilize the time information of a GPS (Global Positioning System), for example, in order to match the timing of measurement devices provided at separate locations. Alternatively, proposals such as matching the timing of the measurement devices by separately providing a monitoring device for comprehensively managing the plurality of measurement devices, or using one of the plurality of measurement devices as a master device and placing the other devices under the management of the master device have been made.

However, there is a problem with the above conventional methods in that the system as a whole tends to become large-scale and costs increase. Another problem is a lack of flexibility in dealing with situations in which there is a fault (or a program change) involving one or more of the devices.

DOCUMENT LIST

Document 1: Yasunori MITANI, "Power System Observation by using Synchronized Phasor Measurements as a Smart Device", IEEJ Transactions on Power and Energy, Vol. 130(2010), No. 9, pp. 791-794.
Document 2: Reza OLFATI-SABER, J. Alex FAX, and Richard M. MURRAY, "Consensus and Cooperation in Networked Multi-Agent Systems", Proceedings of the IEEE, Vol. 95(2007), No. 1.
Document 3: Mehran MESBAHI and Magnus EGERSTEDT, "Graph Theoretic Methods in Multi-agent Networks", Princeton University Press (2010).
Document 4: JP-A-2010-68630
Document 5: JP-A-2000-358331
Document 6: JP-A-1998-94174
Document 7: JP-A-2009-89534
Document 8: JP-A-1997-230952
Document 9: JP-A-2011-217442

SUMMARY OF THE INVENTION

The present invention is proposed under the circumstances described above. In view of this, the present invention has an object to provide a technology that can, with respect to a plurality of devices that perform a predetermined task at a plurality of locations, control the timing of the task or the like, without providing a specific management device.

According to one embodiment of the present invention, a device that performs a predetermined task together with a plurality of other devices is provided. This device is provided with an internal value generator for generating a prescribed internal value, and a communication unit for communicating with at least one of the plurality of devices. The internal value generator is configured to generate a third internal value, based on a first internal value generated by the internal value generator and a second internal value received by the communication unit from at least one of the plurality of the other devices.

According to another embodiment of the present invention, a measurement device that performs a predetermined task together with a plurality of other measurement devices is provided. This measurement device is provided with a sampling phase generator for generating a sampling phase for instructing a timing of sampling, and a communication unit for communicating with at least one of the plurality of other measurement devices. The communication unit is configured to transmit the sampling phase generated by the sampling phase generator to at least one of the plurality of other measurement devices. The sampling phase generator is configured to generate a third sampling phase, using an operation that is based on a generated first sampling phase and a second sampling phase received by the communication unit from at least one of the plurality of other measurement devices.

Preferably, the sampling phase generator is provided with an operation unit for performing an operation that is based on the first sampling phase and the second sampling phase, an addition unit for adding an operation result that is output by the operation unit to a predetermined angular frequency, and outputting an addition result as a corrected angular frequency, and an integration unit for calculating a sampling phase by integrating the corrected angular frequency.

Preferably, the operation unit is configured to subtract the first sampling phase from the second sampling phase, and to add together all subtraction results.

Preferably, the operation unit is configured to subtract the first sampling phase from the second sampling phase and add together all subtraction results to obtain a predetermined addition value, and to divide the addition value by the number of other measurement devices with which the communication unit communicates.

Preferably, the operation unit is configured to subtract the first sampling phase from the second sampling phase and add together all subtraction results to obtain a predetermined addition value, and to multiply the addition value by the first sampling phase.

Preferably, the operation unit is configured to subtract the first sampling phase from the second sampling phase and add together all subtraction results to obtain a predetermined addition value, and to multiply the addition value by the square of the first sampling phase.

Preferably, the measurement device is further provided with a voltage sensor for detecting a voltage, a sampling unit for performing sampling that is based on a sampling phase on a voltage signal detected by the voltage sensor, and outputting a digital signal, and a phase calculation unit for calculating a phase of the voltage based on the digital signal.

Alternatively, the measurement device is further provided with a voltage sensor for detecting a voltage, a current sensor for detecting a current, a sampling unit for performing sampling that is based on a sampling phase on a voltage signal detected by the voltage sensor and a current signal detected by the current sensor, and outputting respective digital signals, and an active power calculation unit for calculating active power based on the digital signal of the voltage signal and the digital signal of the current signal.

Alternatively, the measurement device is further provided with a temperature sensor for detecting a temperature, and a sampling unit for performing sampling that is based on the sampling phase on a temperature signal detected by the temperature sensor, and outputting a digital signal.

According to another embodiment of the present invention, an electric power grid monitoring system is provided. This system includes a plurality of measurement devices that are respectively disposed in a plurality of locations of an electric power grid, each measurement device having a configuration such as described above. Furthermore, this electric power grid monitoring system is provided with a monitoring device for monitoring a state of the electric power grid, based on a measurement result that is input from each measurement device.

According to another embodiment of the present invention, a measurement method for matching a timing of measurement in a plurality of measurement devices disposed in a plurality of locations is provided. This method causes each measurement device to perform a first step of generating a sampling phase, a second step of transmitting the sampling phase generated in the first step to at least one other measurement device, and a third step of receiving a sampling phase transmitted from at least one other measurement device. In each measurement device, the sampling phase is generated by an operation that is based on the sampling phase generated in the first step and the sampling phase received in the third step.

Other features and advantages of the present invention will be more fully understood from the following detailed description, taken in conjunction with the accompanying drawings.

DESCRIPTION OF THE PREFERRED EMBODIMENTS

Hereinafter, embodiments according to various aspects of the present invention will be described in detail with reference to the drawings.

<First Aspect>

Conventionally, distributed power sources that are based on power generation techniques utilizing renewable energy (solar power, wind power, etc.) have been used. Such distributed power sources are readily affected by factors such as season, time and weather. Thus, there is a possibility that power supply will become unstable when distributed power sources occupy a large proportion of the electric power grid. As a countermeasure against this, it has been conceived to install various measurement devices at suitable locations in the electric power grid and constantly monitor the state of the electric power grid. Each measurement device monitors physical quantities such as active power, reactive power, the voltage of power transmission/distribution lines, and the frequency/phase of AC signals.

The physical quantities need to be measured at the same timing in each of the measurement devices which are installed at separate locations. Document 1 (see the document list in the Description of Related Art) proposes utilizing the time information of a GPS (Global Positioning System), in order to match the timing of a plurality of measurement devices. That is, Document 1 teaches using the GPS as a master and comprehensively managing (controlling) a plurality of devices (measurement devices) under the GPS.

In contrast, according to the first aspect of the present invention, it is possible to match the measurement timing, without using GPS, as will be described below. That is, it is possible to match the measurement timing of a plurality of measurement devices that are not in a master/slave relationship (that are in an equal relationship).

Figure 1:
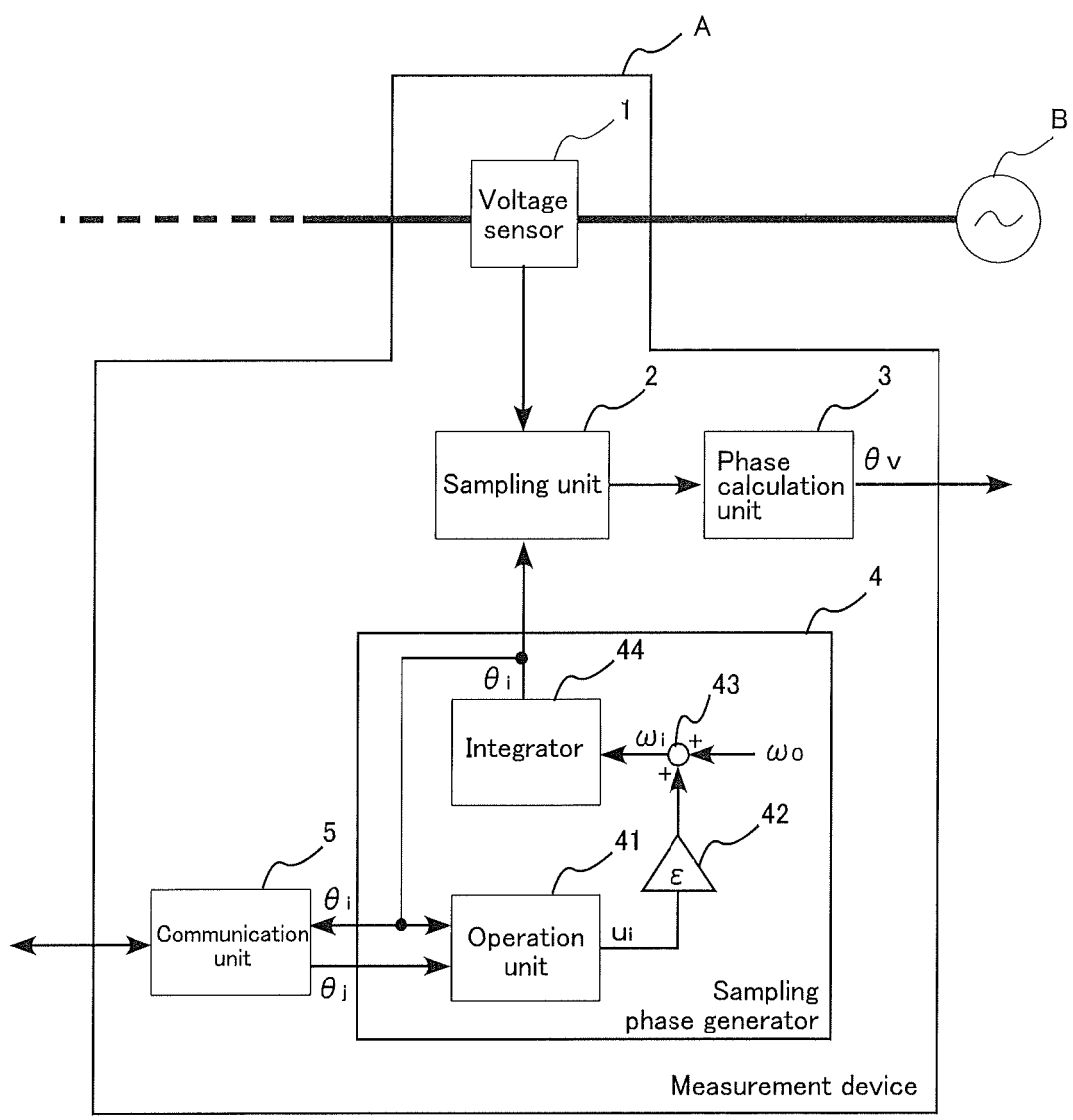
FIG. 1 is a diagram illustrating a measurement device according to a first embodiment of a first aspect.
Figure 2:
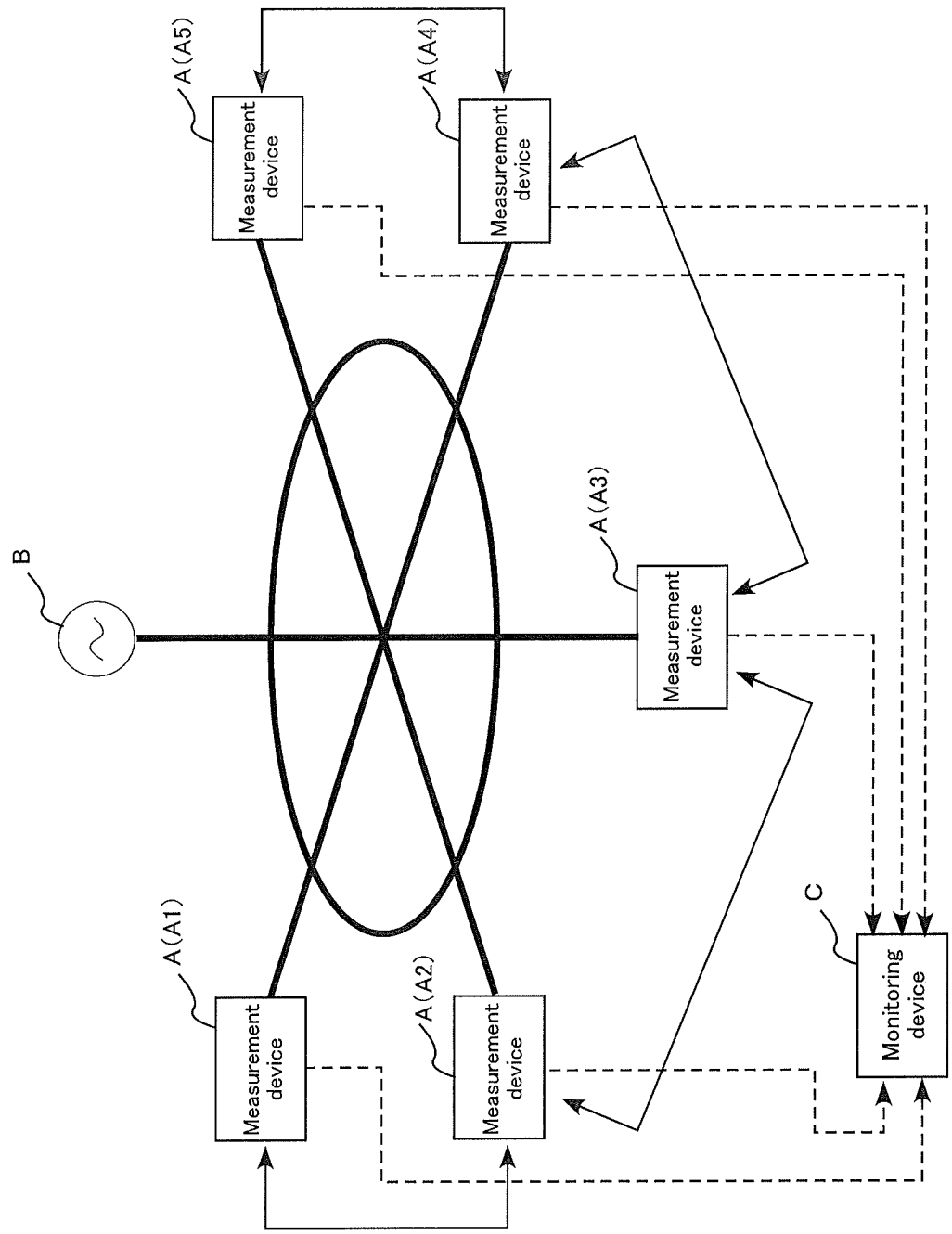
FIG. 2 shows an electric power grid in which a plurality of measurement devices are disposed.

FIG. 1 is a diagram for illustrating a measurement device A according to a first embodiment of the first aspect of the present invention, and shows a state where the measurement device A is disposed on an electrical line (power distribution line or power transmission line) of an electric power grid B. FIG. 2 shows the electric power grid monitoring system in which measurement devices A are disposed on a plurality of electrical lines of the electric power grid B. Note that the measurement devices A may be disposed in the electric outputs of homes or buildings.

As shown in FIG. 1, the measurement device A is provided with a voltage sensor 1, a sampling unit 2, a phase calculation unit 3, a sampling phase generation unit 4, and a communication unit 5. The measurement device A calculates a phase $\theta v$ of the voltage based on a voltage signal detected by the voltage sensor 1.

The voltage sensor 1 is disposed on an electrical line, and detects a voltage signal at the disposition position. The detected voltage signal is output to the sampling unit 2.

The sampling unit 2 discretizes and converts the voltage signal that is input from the voltage sensor 1 into a digital signal ("digital voltage signal"). The sampling unit 2 performs sampling based on a sampling phase $\theta_i$ that is input from the sampling phase generation unit 4. Specifically, sampling is performed whenever the sampling phase $\theta_i$ is "0". Note that the timing at which sampling is performed is not limited to when the sampling phase $\theta_i$ is "0". Also, a configuration may be adopted in which sampling is performed whenever the sampling phase $\theta_i$ has been "0" a predetermined number of times.

The phase calculation unit 3 calculates the phase $\theta v$ of the voltage based on the digital voltage signal that is input from the sampling unit 2.

Figure 3:
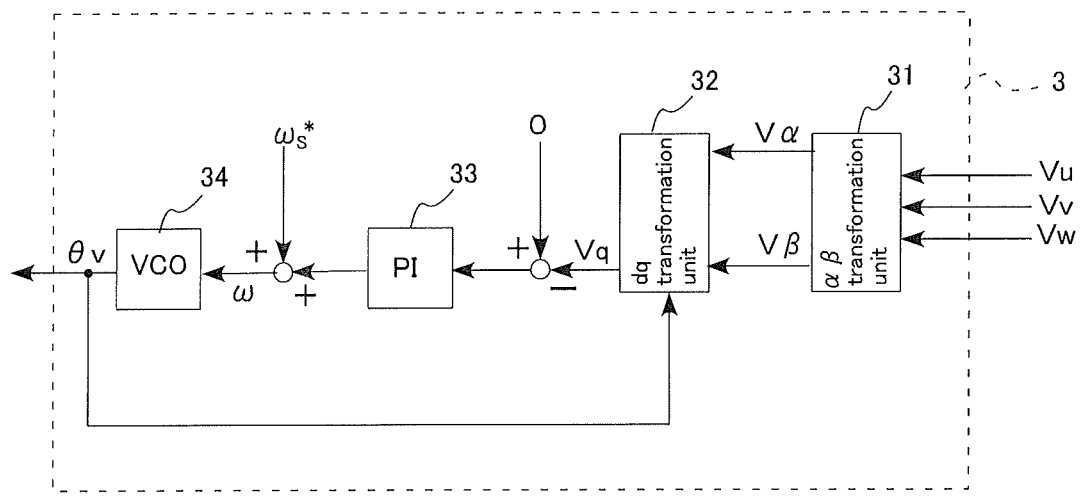
FIG. 3 shows an internal configuration of a phase calculation unit.

FIG. 3 shows the internal configuration of the phase calculation unit 3.

The phase calculation unit 3 calculates the phase by a so-called PLL (Phase Locked Loop) method, based on three-phase voltage signals, and is provided with an $\alpha\beta$ transformation unit 31, a dq transformation unit 32, a PI control unit 33, and a VCO (Voltage Controlled Oscillator) 34. The $\alpha\beta$ transformation unit 31 converts three-phase digital voltage signals Vu, Vv, and Vw that are input from the sampling unit 2 into two-phase voltage signals $V\alpha$ and $V\beta$. The dq transformation unit 32 receives input of the voltage signals $V\alpha$ and $v\beta$ from the $\alpha\beta$ transformation unit 31, and input of the phase $\theta v$ from the VCO 34. The dq transformation unit 32 calculates an in-phase component Vd with the phase $\theta v$ and a phase difference component Vq of the voltage signals $V\alpha$ and $V\beta$. The PI control unit 33 performs PI control (Proportional-Integral control) so that the phase difference component Vq will be zero, and outputs a correction value. A corrected angular frequency obtained by adding this correction value to a target angular frequency $\omega_s^*$ of the voltage signal is output to the VCO 34. The VCO 34 outputs a phase $\theta v$ that depends on the input to the dq transformation unit 32. As a result of this feedback control, the phase $\theta v$ is locked when the phase difference component Vq is zero. At this time, the phase $\theta v$ matches the phase of the voltage. This phase $\theta v$ is output as the phase $\theta v$ of the input voltage signals.

Note that the phase calculation unit 3 shown in FIG. 3 is merely intended as an example, and is not limited thereto. For example, the phase calculation unit 3 may calculate the phase using a zero-crossing method.

The phases $\theta v$ calculated by the phase calculation unit 3 are collected in a monitoring device C (see FIG. 2) via an Internet connection or the like, for example, and are used for monitoring the state of the electric power grid B, and the like.

The sampling phase generation unit 4 generates a sampling phase $\theta_i$ for instructing the timing of the sampling by the sampling unit 2. The sampling phase generation unit outputs the generated sampling phase $\theta_i$ to the communication unit 5 and the sampling unit 2. The sampling phase generation unit 4 will be discussed in detail later.

The communication unit 5 communicates with other measurement devices A. The communication unit 5 receives input of the sampling phase $\theta_i$ generated by the sampling phase generation unit 4, and transmits the input sampling phase $\theta_i$ to the communication unit 5 of another measurement device A. Also, the communication unit 5 outputs a sampling phase $\theta_j$ received from the communication unit 5 of another measurement device A to the sampling phase generation unit 4. Note that the communication method is not limited, and may be wired communication or may be wireless communication.

As shown in FIG. 2, a plurality of measurement devices A are disposed on electrical lines of the electric power grid B. In FIG. 2, only five measurement devices A (A1 to A5) are shown for ease of description, but there are actually many more measurement devices A disposed in the electric power grid B.

The solid line arrows shown in FIG. 2 indicate pairs of measurement devices A that perform mutual communication (direct communication). As shown in the diagram, (the communication unit 5 of) each measurement device A is configured to perform mutual communication with (the communication unit 5 of) at least one measurement device A, among the other measurement devices A disposed in the electric power grid B. Specifically, the measurement device A1 performs mutual communication with only the measurement device A2, and the measurement device A2 performs mutual communication with only the measurement device A1 and the measurement device A3. Also, the measurement device A3 performs mutual communication with only the measurement device A2 and the measurement device A4, the measurement device A4 performs mutual communication with only the measurement device A3 and the measurement device A5, and the measurement device A5 performs mutual communication with only the measurement device A4. According to this configuration, although the measurement device A1, for example, does not perform mutual communication with the measurement device A3, a communication path via the measurement device A2 exists between the measurement device A1 and the measurement device A3. Thus, in the present embodiment, even though each measurement device A does not need to perform mutual communication with all of the other measurement devices A, the measurement devices A are in a state where a communication path exists between two arbitrary measurement devices A ("interlinked state").

In the interlinked state, the communication unit 5 of the measurement device A2, for example, transmits a sampling phase $\theta_2$ generated by the sampling phase generation unit 4 to the communication units 5 of the measurement devices A1 and A3. Also, the communication unit 5 of the measurement device A2 receives a sampling phase $\theta_3$ from the communication unit 5 of the measurement device A3, and receives a sampling phase $\theta_1$ from the communication unit 5 of the measurement device A1.

The monitoring device C monitors the state of the electric power grid B. The monitoring device C receives input of the phases $\theta y$ of voltages from the measurement devices A1 to A5 (see the dashed arrows shown in FIG. 2), and monitors the state of the electric power grid B based on these phases $\theta v$. Note that the measurement devices A1 to A5 actually also measure voltage, frequency, active power, reactive power and the like in addition to the phase of the voltage, and this information is also input to the monitoring device C.

Next, the sampling phase generation unit 4 of each measurement device A will be described in detail.

The sampling phase generation unit 4 generates the sampling phase $\theta_i$, using a generated sampling phase $\theta_i$ and a sampling phase $\theta_j$ of another measurement device A that is input from the communication unit 5. Even if the sampling phase $\theta_i$ differs from the sampling phase $\theta_j$, the sampling phase $\theta_i$ and the sampling phase $\theta_j$ converge to a common sampling phase as a result of the operational processing of the sampling phase generation unit 4 being repeated. As shown in FIG. 1, the sampling phase generation unit 4 is provided with an operation unit 41, a multiplier 42, an adder 43, and an integrator 44.

The operation unit 41 performs an operation that is based on the following equation (1). That is, the operation unit 41 subtracts the sampling phase $\theta_i$ generated by the sampling phase generation unit 4 from each sampling phase $\theta_j$ that is input from the communication unit 5, and outputs an operation result $u_i$ obtained by adding together all the subtraction results to the multiplier 42.

$$u_i = \sum_j (\theta_j - \theta_i) \qquad (1)$$

For example, in the case of the measurement device A2 (see FIG. 2), the operation unit 41 calculates the following equation (2), and outputs an operation result $u_2$.

$$\begin{aligned} u_2 &= \sum_{j=1,3} (\theta_j - \theta_2) \\ &= (\theta_1 - \theta_2) + (\theta_3 - \theta_2) \\ &= \theta_1 + \theta_3 - 2\theta_2 \end{aligned} \qquad (2)$$

The multiplier 42 multiplies the operation result $u_i$ that is input from the operation unit 41 by a predetermined coefficient $\varepsilon$, and outputs the multiplication result to the adder 43. The coefficient E is a value that satisfies $0<\varepsilon<1/d_{max}$, and is set in advance. When the number of other measurement devices A that (the communication unit 5 of) each measurement device A communicates with is given as $d_i$, $d_{max}$ is the maximum number of $d_i$ among all the measurement devices A. That is, $d_{max}$ is the number of sampling phases $\theta_j$ that are input to the communication unit 5 of the measurement device A that communicates with the largest number of other measurement devices A. In the example shown in FIG. 2, $d_1=1$ for the measurement device A1 because mutual communication is performed with only the measurement device A2, and $d_2=2$ for the measurement device A2 because mutual communication is performed with only the measurement devices A1 and A3. Similarly, $d_3=2$, $d_4=2$, and $d_5=1$. Therefore, $d_{max}=2$. Note that the operation result $u_i$ is multiplied by the coefficient $\varepsilon$ in order to prevent too large a variation in the sampling phase $\theta_i$ due to a corrected angular frequency $\omega_i$ becoming too large (or too small). Accordingly, in the case where processing by the sampling phase generation unit 4 is continuous time processing, the multiplier 42 need not be provided.

The adder 43 adds the input from the multiplier 42 to a predetermined angular frequency $\omega_0$, and outputs the addition result to the integrator 44 as the corrected angular frequency $\omega_i$. The angular frequency $\omega_0$ corresponds to the sampling frequency. The integrator 44 generates the sampling phase $\theta_i$ by integrating the corrected angular frequency $\omega_i$ that is input from the adder 43, and outputs the generated sampling phase $\theta_i$. The integrator 44 generates the sampling phase $\theta_i$ by adding the corrected angular frequency $\omega_i$ to the sampling phase $\theta_i$ generated last time. Also, the integrator 44 outputs the sampling phase $\theta_i$ as a value in the range $(-\pi < \theta_i \leq \pi)$. Note that setting of the range of the sampling phase $\theta_i$ is not limited thereto, and the range may be set as $(0 \leq \theta_i < 2\pi)$, for example. The sampling phase $\theta_i$ is output to the sampling unit 2, the communication unit 5, and the operation unit 41.

In the present embodiment, the sampling phase generation unit 4 generates the sampling phase $\theta_i$, using a generated sampling phase $\theta_i$ and a sampling phase $\theta_j$ of another measurement device A that is input from the communication unit 5. If the sampling phase $\theta_i$ is larger than the arithmetic mean value of the sampling phases $\theta_j$, the operation result $u_i$ that is output by the operation unit 41 will be a negative value. This results in the corrected angular frequency $\omega_i$ being less than the predetermined angular frequency $\omega_0$, and the amount of change in the sampling phase $\theta_i$ being reduced. On the other hand, if the sampling phase $\theta_i$ is smaller than the arithmetic mean value of sampling phases $\theta_j$, the operation result $u_i$ that is output by the operation unit 41 will be a positive value. This results in the corrected angular frequency $\omega_i$ being greater than the predetermined angular frequency $\omega_0$, and the amount of change in the sampling phase $\theta_i$ being increased. In other words, the sampling phase $\theta_i$ approaches the arithmetic mean value of the sampling phases $\theta_j$. As a result of this processing being performed by each of the measurement devices A, the sampling phase $\theta_i$ of each measurement device A converges to the same value. The sampling phase $\theta_i$ changes over time, and can be thought of as combining of a component that changes according to the angular frequency $\omega_0$ and a component that changes so as to compensate for shift in the initial phase. As a result of the latter component converging to the same value $\theta\alpha$, the sampling phase $\theta_i$ of each measurement device A also converges to the same value (see Documents 2 and 3). It has also been demonstrated that the convergence value $\theta\alpha$ is the arithmetic mean value of the initial values of the sampling phases $\theta_i$ of the measurement devices A, as shown in the following equation (3), where n is the number of measurement devices A disposed in the electric power grid B, and $\theta_i$ is the initial value of the sampling phase of the measurement device Ai.

$$\theta_\alpha = \frac{1}{n}\sum_{i=1}^{n}\theta_i(0) \quad (3)$$

Note that, in the present embodiment, the case where the processing by the sampling phase generation unit 4 is performed at a cycle T of 1 second will be described. In the case where the cycle T is 0.1 seconds, for example, adding the input from the multiplier 42 with the adder 43 results in a ¹⁄₁₀th increase in the angular frequency $\omega_0$. That is, $T\omega_0$ is input instead of $\omega_0$. This similarly applies to the cycle of processing by the various phase generation units in the following embodiments.

Figure 4A:
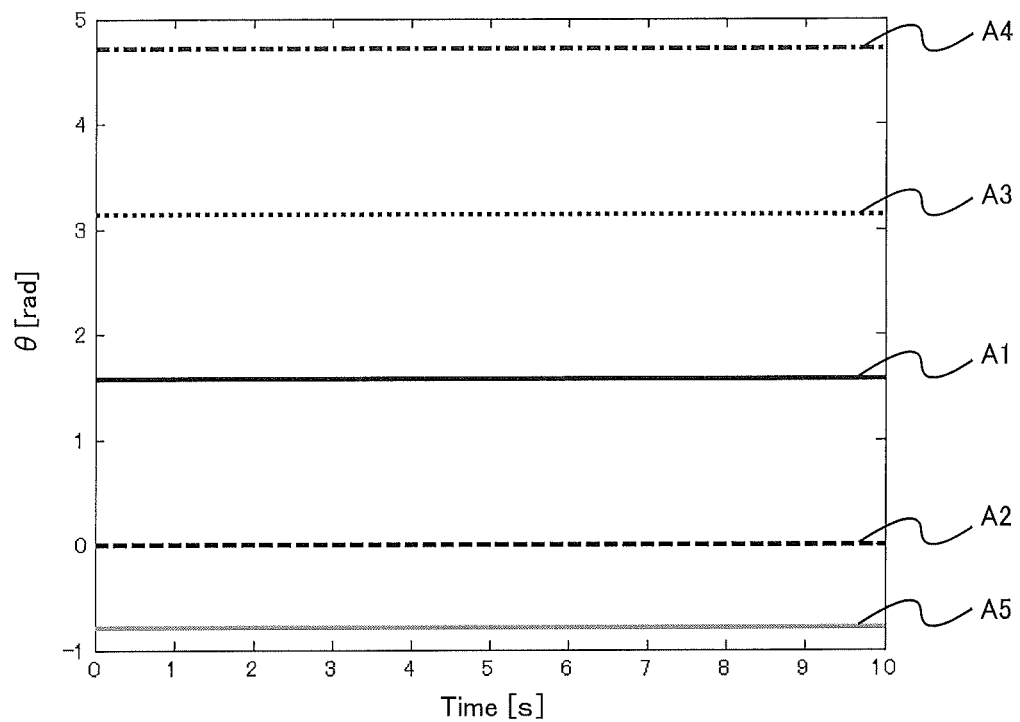
FIGS. 4A and 4B show a simulation result relating to a change in the sampling phase of the plurality of measurement devices.
Figure 4B:
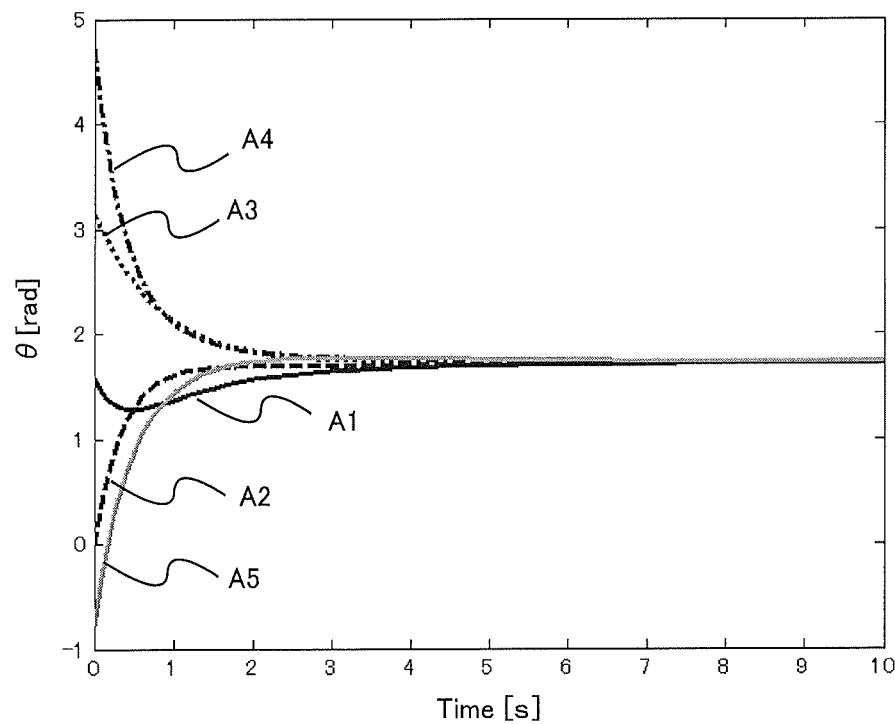

Next, simulation that confirms the convergence of the sampling phase $\theta_i$ in the measurement devices A1 to A5 will be described, with reference to FIGS. 4A and 4B.

In the simulation, the initial values of the sampling phases $\theta_1$ to $\theta_5$ of the measurement devices A1 to A5 are set to $\theta_1=\pi/2$, $\theta_2=0$, $\theta_3=\pi$, $\theta_4=3\pi/2$, and $\theta_5=-\pi/4$, respectively. FIG. 4A shows the result in the case where synchronization of the sampling phase $\theta_i$ is not performed (i.e., in the case where the operation unit 41 and the communication unit 5 shown in FIG. 1 are not provided), and FIG. 4B shows the result in the case where synchronization of the sampling phase $\theta_i$ is performed (i.e., in the case of the configuration shown in FIG. 1). These diagrams respectively show the time response of the sampling phases $\theta_1$ to $\theta_5$ of the measurement devices A1 to A5 excluding the component that changes according to the angular frequency $\omega_0$. In the case where synchronization of the sampling phase $\theta_i$ is not performed, the sampling phases do not change from the initial values, as shown in FIG. 4A. On the other hand, in the case where synchronization of the sampling phase $\theta_i$ is performed, the sampling phases converge to "$11\pi/20$", which is the arithmetic mean value of the initial values, as shown in FIG. 4B.

Thus, according to the present embodiment, the sampling phase $\theta_i$ of each measurement device A disposed in the electric power grid B converges to the same value. Accordingly, each measurement device A is able to perform sampling at the same timing as the other measurement devices A by performing sampling based on the sampling phase $\theta_i$. Each measurement device A is thereby able to measure the voltage phase at the same timing, even if disposed in separate locations to each other.

Also, according to the present embodiment, the individual measurement devices A do not need to perform communication using GPS, because the abovementioned technical effects are achieved if each of the measurement devices A performs mutual communication with at least one other measurement device A, and all the measurement devices A are in the "interlinked state" described above.

Note that although the case where the component that changes so as to compensate for shift in the initial phase of the sampling phase $\theta_i$ of the measurement device A is converged to the arithmetic mean value of the initial value of the sampling phases $\theta_i$ of the measurement devices A was described in the above embodiment, the present invention is not limited thereto. The convergence value $\theta\alpha$ of the sampling phase can take other values, depending on the operational equation that is set in the operation unit 41.

For example, if the operational equation that is set in the operation unit 41 is the following equation (4), the convergence value $\theta\alpha$ will take a value such as shown in the following equation (5), where $d_i$ is the number of other measurement devices A with which the communication unit 5 communicates (i.e., the number of sampling phases $\theta_j$ that are input to the communication unit 5). In other words, the convergence value $\theta\alpha$ is the weighted mean of values obtained by weighting the initial values of the sampling phases $\theta_i$ according to the number of communication partners.

$$u_i = \frac{1}{d_i}\sum_{j}(\theta_j - \theta_i) \quad (4)$$

-continued $$\theta_\alpha = \frac{\sum_{i=1}^{n} d_i \theta_i(0)}{\sum_{i=1}^{n} d_i} \quad (5)$$

Also, in the case where the operational equation that is set in the operation unit 41 is the following equation (6), the convergence value $\theta\alpha$ will be as shown in the following equation (7). This is the geometric mean value of the initial values of the sampling phases $\theta_i$.

$$u_i = \theta_i \sum_j (\theta_j - \theta_i) \quad (6)$$

$$\theta_\alpha = \sqrt[n]{\prod_{i=1}^{n} \theta_i(0)} \quad (7)$$

Also, in the case where the operational equation that is set in the operation unit 41 is the following equation (8), the convergence value $\theta\alpha$ will be as shown in the following equation (9). This is the harmonic mean value of the initial values of the sampling phases $\theta_i$.

$$u_i = \theta_i^2 \sum_j (\theta_i - \theta_j) \quad (8)$$

$$\theta_\alpha = \frac{n}{\sum_{i=1}^{n} \frac{1}{\theta_i(0)}} \quad (9)$$

Also, in the case where the operational equation that is set in the operation unit 41 is the following equation (10), the convergence value $\theta\alpha$ will be as shown in the following equation (11). This is the mean value of order P of the initial values of the sampling phases $\theta_i$.

$$u_i = \frac{1}{P\theta_i^{P-1}} \sum_j (\theta_j - \theta_i) \quad (10)$$

$$\theta_\alpha = \sqrt[P]{\sum_{i=1}^{n} \frac{1}{n} \theta_i(0)^P} \quad (11)$$

Figure 5:
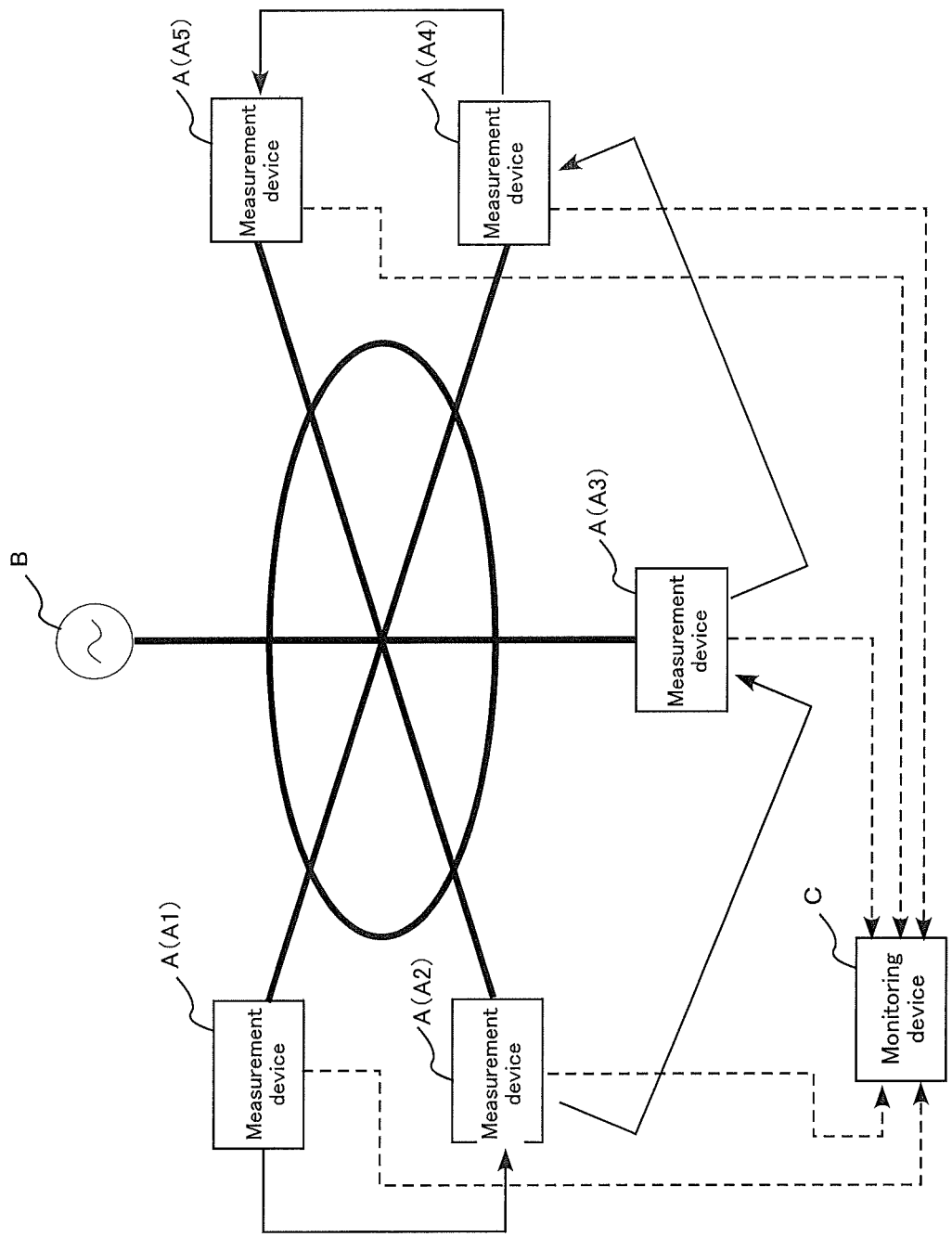
FIG. 5 is an illustrative diagram showing an example of a communication state of the plurality of measurement devices.

Note that although the case where two measurement devices A perform mutual communication was described in the above embodiment, the present invention is not limited thereto, and one-way communication may be performed between two measurement devices A. For example, in the example shown in FIG. 5, transmission from the measurement device A1 to the measurement device A2 is performed between the measurement device A1 and the measurement device A2, but transmission in the opposite direction (transmission from the measurement device A2 to the measurement device A1) is not performed. That is, the measurement device A1 performs only transmission with respect to the measurement device A2. Next, the measurement device A2 receives communication from the measurement device A1, but performs only transmission with respect to the measurement device A3 (i.e., transmission from the measurement device A3 to the measurement device A2 is not performed). Similarly, the measurement device A3 receives communication from the measurement device A2, but performs only transmission with respect to the measurement device A4. The measurement device A4 receives communication from the measurement device A3, but performs only transmission with respect to the measurement device A5. The measurement device A5 only receives communication from the measurement device A4, and does not perform transmission to any of the other measurement devices A1 to A4. Synchronization of the sampling phase $\theta_i$ is also possible with such forms of communication. Generally, a condition for being able to synchronize the sampling phase $\theta_i$ is a state in which an arbitrary measurement device A disposed in the electric power grid B can be reached by following the transmission destinations from a measurement device A disposed in the electric power grid B (a state including the "spanning tree" in graph theory).

In the first embodiment, the case was described where the phase calculation unit 3 calculates the voltage phase, but the present invention is not limited thereto. The measurement device A may be operated as a frequency measurement device by configuring the phase calculation unit 3 to calculate the voltage frequency. Also, the measurement device A may be operated as a voltage measurement device by directly outputting the digital voltage signal that is output from the sampling unit 2. Similarly, the measurement device A may be operated as a current measurement device by providing a current sensor and directly outputting the digital current signal that is output from the sampling unit 2. Furthermore, the measurement device A may be operated as an active power measurement device that calculates and outputs active power, or as a reactive power measurement device that calculates and outputs reactive power, utilizing the voltage signal that is detected by the voltage sensor 1 and the current signal that is detected by the current sensor. The case where the measurement device A is operated as an active power measurement device will be described below.

Figure 6:
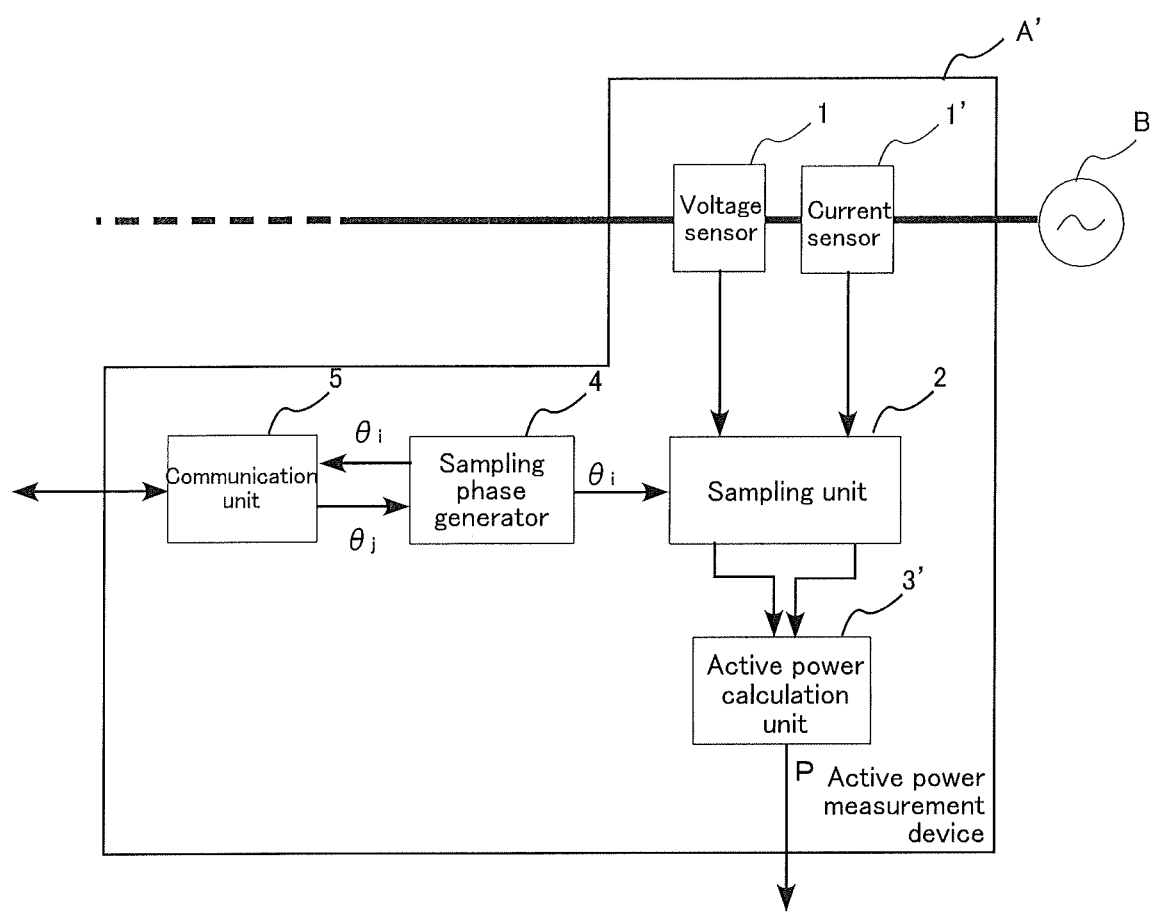
FIG. 6 is a diagram illustrating a measurement device according to a second embodiment of the first aspect.

FIG. 6 is a diagram illustrating a measurement device (active power measurement device) A' according to a second embodiment of the first aspect of the present invention. In the diagram, the same reference signs are given to constituent elements that are the same as or similar to the measurement device A according to the first embodiment.

The active power measurement device A' differs from the measurement device A according to the first embodiment in being provided with a current sensor 1', and in being provided with an active power calculation unit 3' instead of the phase calculation unit 3.

The current sensor 1' is disposed on an electrical line, and detects the current signal at the disposition position. The detected current signal is output to the sampling unit 2. The sampling unit 2 further performs sampling that is based on the sampling phase $\theta_i$ on the current signal that is input from current sensor 1', and converts the sampling result to a digital signal.

The active power calculation unit 3' calculates an active power P, based on the digital voltage signal and the digital current signal that are input from the sampling unit 2.

Figure 7:
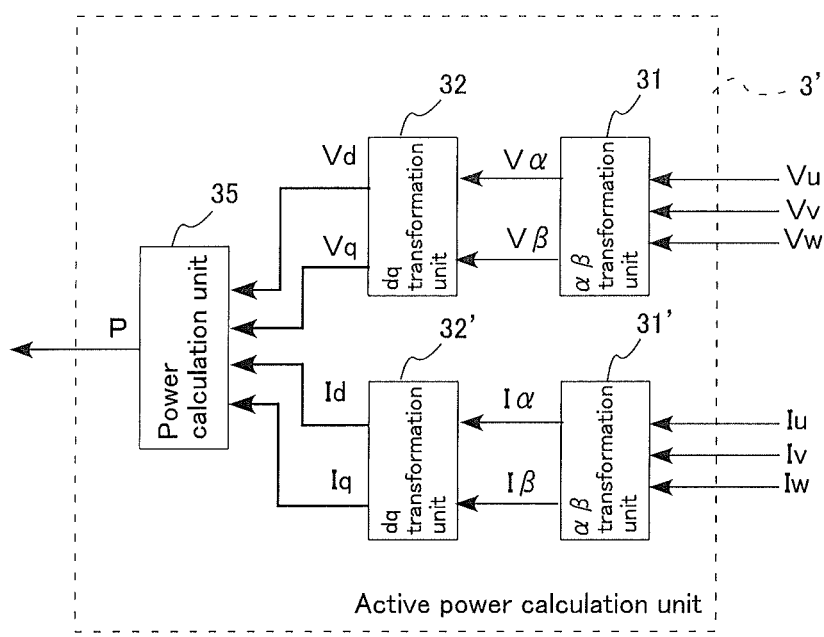
FIG. 7 shows an internal configuration of an active power calculation unit.

FIG. 7 shows the internal configuration of the active power calculation unit 3'. The active power calculation unit 3' calculates the active power P, based on three-phase voltage signals and current signals, and is provided with $\alpha\beta$ transformation units 31 and 31', dq transformation unit 32 and 32', and a power calculation unit 35.

The $\alpha\beta$ transformation unit 31 is similar to the $\alpha\beta$ transformation unit 31 shown in FIG. 3, and converts three-phase digital voltage signals Vu, Vv and Vw that are input from the sampling unit 2 to two-phase voltage signals Vα and Vβ. Also, the dq transformation unit 32 is similar to the dq transformation unit 32 shown in FIG. 3, and receives input of the voltage signals Vα and Vβ from the αβ transformation unit 31, and calculates an in-phase component Vd and a phase difference component Vq. The αβ transformation unit 31' converts three-phase digital current signals Iu, Iv and Iw that are input from the sampling unit to two-phase current signals Iα and Iβ. Also, the dq transformation unit 32' receives input of the current signals Iα and Iβ from the αβ transformation unit 31', and calculates an in-phase component Id and an phase difference component Iq.

The power calculation unit 35 calculates the active power P, based on the following equation (12), from the in-phase component Vd and the phase difference component Vq that are input from the dq transformation unit 32 and the in-phase component Id and the phase difference component Iq that are input from the dq transformation unit 32'.

$$P = Vd \cdot Id + Vq \cdot Iq \tag{12}$$

Note that the active power calculation unit 3' shown in FIG. 7 is merely intended as an example, and the present invention is not limited thereto. For example, a configuration may be adopted in which the active power P is computed from the voltage signals Vα and vβ and the current signals Iα and Iβ, or in which the active power P is computed from the digital voltage signals Vu, Vv and Vw and the digital current signals Iu, Iv and Iw.

The sampling phases $\theta_i$ of all the active power measurement devices A' can also be synchronized in the second embodiment, if each of the active power measurement devices A' performs mutual communication with at least one active power measurement device A', and the communication state of the active power measurement devices A' is the interlinked state. Accordingly, similar effects to the first embodiment can also be generated in the second embodiment. Also, if reactive power is calculated instead of active power being calculated by the active power calculation unit 3', the active power measurement device A' can be operated as a reactive power measurement device.

In the above first and second embodiments, the case was described where electrical information of different locations in an electric power grid B is measured, but the present invention is not limited thereto. The present invention can also be applied in the case of measuring various information (e.g., temperature, solar irradiance, humidity, atmospheric pressure, etc.) other than electrical information. The case where the measurement device A is operated as a temperature measurement device will be described below.

Figure 8:
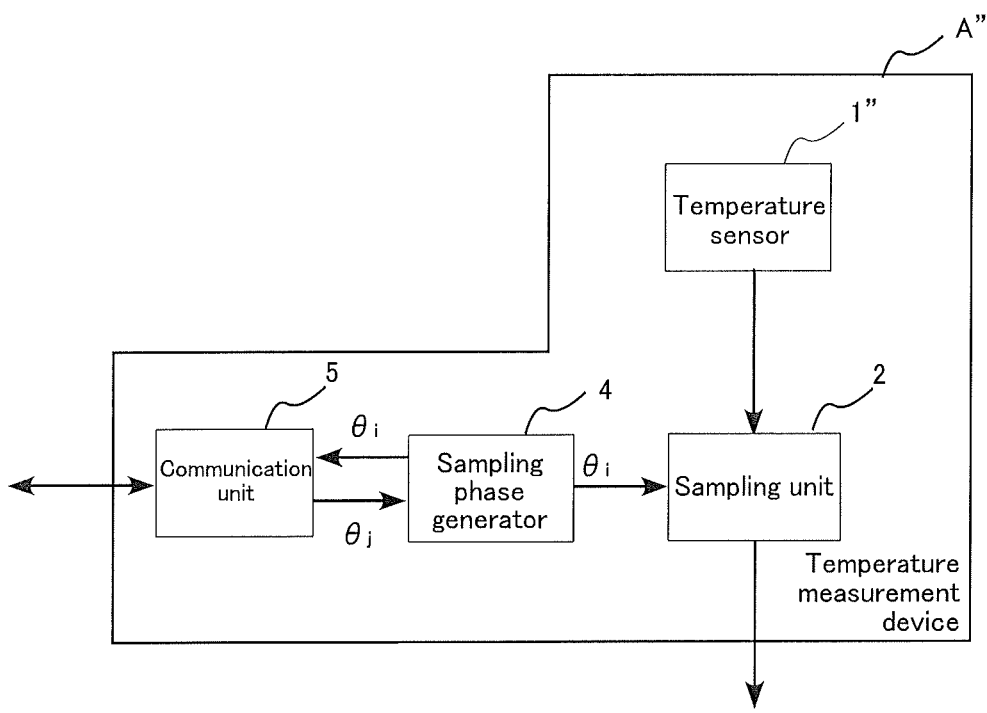
FIG. 8 is a diagram illustrating a measurement device according to a third embodiment of the first aspect.

FIG. 8 is a diagram illustrating a measurement device (temperature measurement device) A" according to a third embodiment of the first aspect of the present invention. In the diagram, the same reference signs are given to constituent elements that are the same as or similar to the measurement device A according to the first embodiment (see FIG. 1).

The temperature measurement device A" differs from the measurement device A according to the first embodiment in being provided with a temperature sensor 1" instead of the voltage sensor 1, and in not being provided with the phase calculation unit 3.

The temperature sensor 1" detects the temperature at the disposition position, and utilizes a thermistor or a thermocouple, for example. A voltage signal ("temperature signal") that depends on the detected temperature is output to the sampling unit 2. The sampling unit 2 performs sampling that is based on the sampling phase $\theta_i$ on the temperature signal that is input from temperature sensor 1", and converts the sampling result to a digital signal.

The sampling phases $\theta_i$ of all the temperature measurement devices A" can also be synchronized in the third embodiment, if each of the temperature measurement devices A" performs mutual communication with at least one temperature measurement device A", and the communication state of the temperature measurement devices A" is the interlinked state. Accordingly, similar effects to the first embodiment can also be generated in the third embodiment.

As described above, according to the first aspect of the present invention, a sampling phase generator generates a new sampling phase, using an operation result that is based on a sampling phase that the sampling phase generator has generated itself and a sampling phase of another measurement device received by a communication unit. As a result of the sampling phase generator of each measurement device performing this processing, the sampling phases of all the measurement devices converge to the same value. By performing sampling based on this common sampling phase, each measurement device is able to perform sampling at the same timing as the other measurement devices. This enables a plurality of measurement devices disposed in different locations to match the timing of measurement without using GPS.

<Second Aspect>

Generally, a distributed power source (e.g., home solar electric power system) is connected to the electric power grid of an electric power utility in order to supply excess power to that electric power grid (this connected state is referred to as "grid interconnection"). Also, the flow of active power from the distributed power source to the electric power grid of the electric power utility is known as "reverse power flow". With this grid interconnection, the distributed power source performs power adjustment through controlling the output current, by using the phase of the voltage ("grid voltage") of the electric power grid as its internal phase (see Document 4).

On the other hand, in the case where power supply from the electric power grid has stopped due to a natural disaster or the like (or where there is no electric power grid on an outlying island, etc.), the distributed power source needs to operate autonomously. In such cases, the distributed power source cannot use the phase of the grid voltage, and thus generates the phase itself and performs output voltage control using this phase ("internal phase").

In an electric power system in which a plurality of distributed power sources are connected in parallel, the internal phase of each distributed power source needs to be synchronized, when the distributed power sources are operating autonomously. One technique for achieving this is called the "centralized monitoring method". With this method, a monitoring device for collectively monitoring the distributed power sources is provided, and the internal phase of each distributed power source is synchronized by this monitoring device. Specifically, first, each distributed power source transmits an internal phase that it has generated itself to the monitoring device. The monitoring device calculates a "target internal phase", lased on the internal phase of each received distributed power source, and transmits this target internal phase to each distributed power source. Each distributed power source then performs control for adjusting the internal phase to the target internal phase.

Another technique for synchronizing the internal phase of each distributed power source is called the "master-slave method". With this method, one distributed power source (master) acts as a monitoring device, and is configured to output the target internal phase to the other distributed power sources (slaves).

However, the centralized monitoring method and the master-slave method mentioned above have the following problems. First, in the case of the centralized monitoring method, a monitoring device has to be separately provided in addition to the distributed power sources. Also, while the monitoring device needs to communicate with all the distributed power sources being monitored, realizing this involves problems in terms of cost as well as technical problems. For example, in the case of wired communication, a communication line needs to be laid between the monitoring device and each distributed power source. In the case of wireless communication, a communication line as a tangible object is not required, but it is necessary to ensure that the radio waves are not blocked by obstacles or the like. Also, the control program of the monitoring device needs to be changed, in the case where the number of distributed power sources varies. In the case of the master-slave method, a monitoring device does not need to be separately provided, but the master needs to communicate with each slave. Also, the control program of the master needs to be changed in the case where the number of slaves varies.

In contrast, according to the second aspect of the present invention, the internal phases of a plurality of distributed power sources can be synchronized, without employing the centralized monitoring method or the master-slave method, as will be described below.

Figure 9:
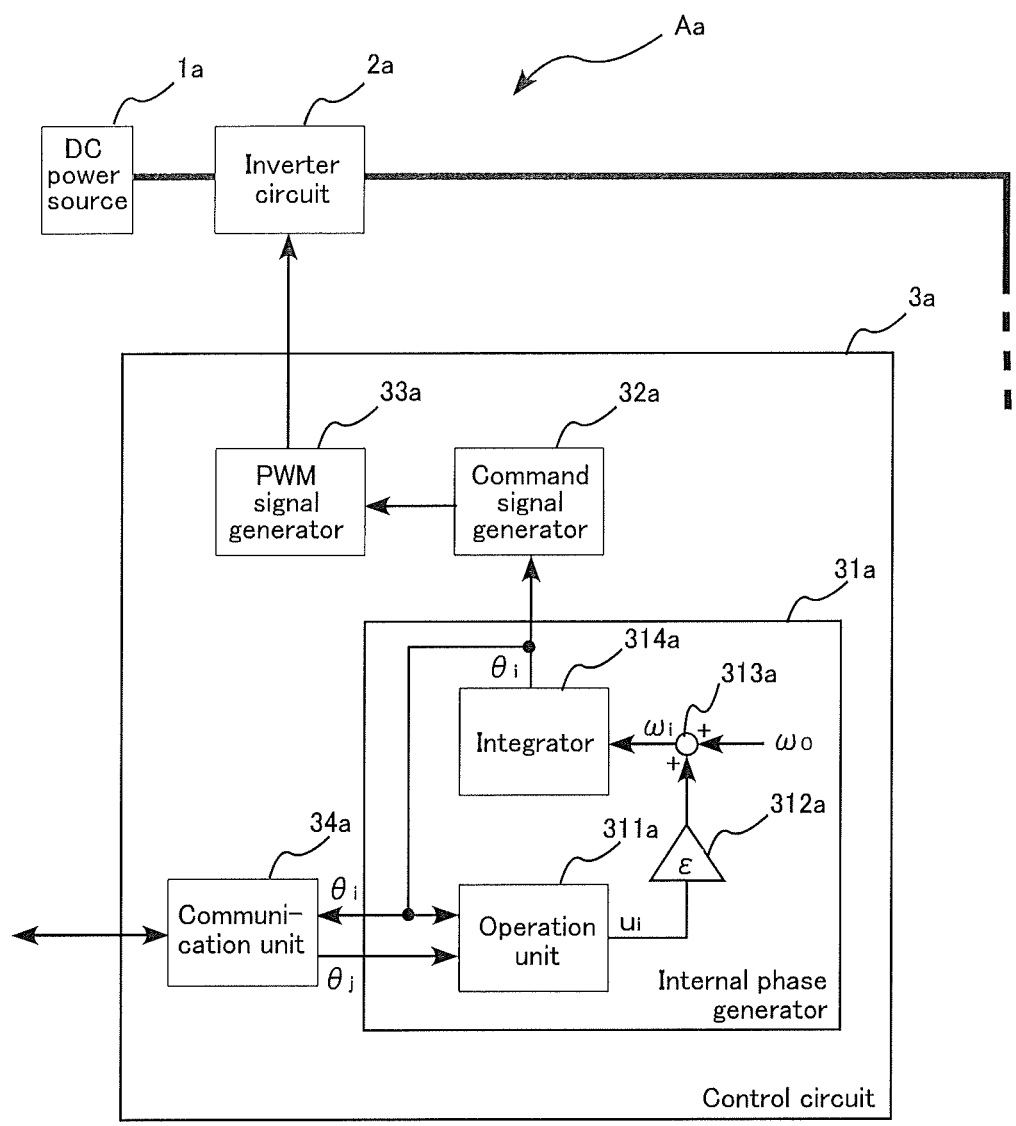
FIG. 9 is a diagram illustrating a distributed power source according to a first embodiment of a second aspect.
Figure 10:
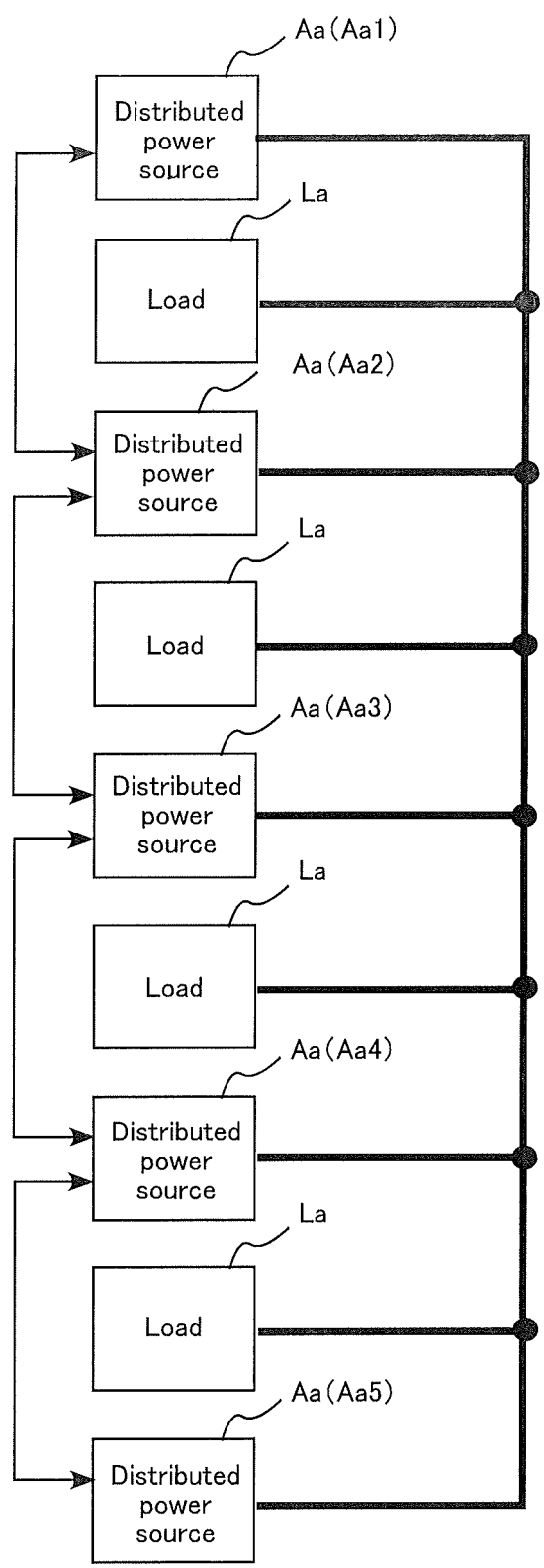
FIG. 10 shows an electric power system in which a plurality of distributed power sources are connected in parallel according to the first embodiment of the second aspect.

FIG. 9 is a diagram illustrating a distributed power source according to a first embodiment of the second aspect of the present invention. FIG. 10 shows an electric power system in which a plurality of distributed power sources are connected in parallel.

As shown in FIG. 9, a distributed power source Aa is provided with a DC power source 1a, an inverter circuit 2a, and a control circuit 3a. In the distributed power source Aa, DC power that is output by the DC power source 1a is converted into AC power and output by the inverter circuit 2a. Note that, although not shown, a transformer is provided on the output side of the inverter circuit 2a. In the present embodiment, the inverter circuit 2a and the control circuit 3a are packaged as an inverter device (so-called power conditioner).

The DC power source 1a outputs DC power, and is provided with a solar cell, for example. The DC power source 1a outputs the generated DC power to the inverter circuit 2a. Note that the DC power source 1a may be a fuel cell, a storage battery, an electric double-layer capacitor or a lithium ion battery, instead of a solar cell. Also, the DC power source 1a may include an AC generator (diesel engine generator, micro gas turbine generator, wind turbine generator, etc.). In this case, AC power generated by the AC generator is output after being converted into DC power.

The inverter circuit 2a converts the DC power that is input from the DC power source 1a into AC power and outputs the AC power. Although not appearing in the diagram, the inverter circuit 2a is provided with a PWM control inverter and a filter. The PWM control inverter is a three-phase inverter provided with three pairs of six switching elements in total, and converts DC power into AC power by switching each switching element ON and OFF based on a PWM signal that is input from the control circuit 3a. The filter removes the high frequency component caused by the switching. Note that the inverter circuit 2a is not limited to the above. For example, the PWM control inverter may be a single-phase inverter or may be a multilevel inverter. Also, instead of PWM control, another method may be used such as phase shift control.

The control circuit 3a controls the inverter circuit 2a, and is realized by a microcomputer and the like, for example. The control circuit 3a generates the PWM signal based on the input voltage, output voltage, output current and the like of the inverter circuit 2a that are detected by various sensors provided in the distributed power source Aa, and outputs the generated PWM signal to the inverter circuit 2a. The control circuit 3a is provided with an internal phase generation unit 31a, a command signal generation unit 32a, a PWM signal generation unit 33a, and a communication unit 34a.

The internal phase generation unit 31a generates an internal phase $\theta_i$ that is used in order to generate a command signal. The internal phase generation unit 31a will be discussed in detail later.

The command signal generation unit 32a generates a command signal for performing output voltage control. The command signal generation unit 32a performs so-called three-phase to two-phase transformation ($\alpha\beta$ transformation) and rotating coordinate transformation (dq transformation) on three-phase voltage signals obtained by detecting the output voltage of the inverter circuit 2a, and transforms the three-phase voltage signals into signals of a d-axis component and a q-axis component. Three-phase to two-phase transformation is processing for transforming three-phase AC signals into equivalent two-phase AC signals, with the three-phase AC signals being transformed into an AC signal having an $\alpha$-axis component and an AC signal having a $\beta$-axis component by being respectively broken down into the components of the orthogonal $\alpha$-axis and $\beta$-axis in a stationary orthogonal coordinate system (hereinafter, "stationary coordinate system"), and the components of each axis being added together. Also, rotating coordinate transformation is processing for transforming the two-phase ($\alpha$-axis component and $\beta$-axis component) signal of a stationary coordinate system into a two-phase (d-axis component and q-axis component) signal of a rotating coordinate system. The rotating coordinate system is an orthogonal coordinate system that has a d-axis and a q-axis that are orthogonal, and rotates at a predetermined angular velocity. Rotating coordinate transformation is performed based on the internal phase $\theta_i$ that is input from the internal phase generation unit 31a.

The command signal generation unit 32a extracts only the DC component from the d-axis component and the q-axis component of the voltage signal, performs control processing separately on each, and performs stationary coordinate transformation (inverse dq transformation) and two-phase to three-phase transformation (inverse $\alpha\beta$ transformation) on the two compensation signals to obtain three compensation signals. Stationary coordinate transformation involves performing the inverse processing of rotating coordinate transformation, and two-phase to three-phase transformation involves performing the inverse processing of three-phase to two-phase transformation. Stationary coordinate transformation is performed based on the internal phase $\theta_i$ that is input from the internal phase generation unit 31a. The command signal generation unit 32a generates three command signals from the sine wave signal generated based on the internal phase $\theta_i$ that is input from the internal phase generation unit 31a and the three compensation signals, and outputs the generated command signals to the PWM signal generation unit 33a. The command signal generation unit 32a controls the input voltage of the inverter circuit 2a.

Note that, in the present embodiment, the distributed power source Aa is described as being a three-phase system, but may be a single-phase system. In the case of a single-phase system, the command signal generation unit 32a need only be configured to control a single-phase voltage signal obtained by detecting the output voltage of the inverter circuit 2a.

The PWM signal generation unit 33a generates a PWM signal. The PWM signal generation unit 33a generates the PWM signal using a triangular wave comparison method, based on a carrier signal and the command signal that is input from the command signal generation unit 32a. For example, a pulse signal that is high if the command signal is greater than the carrier signal and low if the command signal is less than or equal to the carrier signal is generated as the PWM signal. The generated PWM signal is output to the inverter circuit 2a. Note that the PWM signal generation unit 33a is not limited to the case where the PWM signal is generated using the triangular wave comparison method, and may generate the PWM signal with a hysteresis method, for example.

The communication unit 34a communicates with other distributed power sources Aa. The communication unit 34a receives input of the internal phase $\theta_i$ generated by the internal phase generation unit 31a, and transmits the input internal phase $\theta_i$ to the communication unit 34a of another distributed power source Aa. Also, the communication unit 34a outputs an internal phase $\theta_j$ received from the communication unit 34a of another distributed power source Aa to the internal phase generation unit 31a. The method of communication between two distributed power sources may be wired communication or may be wireless communication.

As shown in FIG. 10, the distributed power source Aa is connected in parallel with other distributed power sources Aa in an electric power system. FIG. 10 shows a state in which five distributed power sources Aa (Aa1 to Aa5) and four loads La are connected. Note that more distributed power sources Aa and loads La are connected in an actual electric power system.

The arrows shown in FIG. 10 indicate communication. The distributed power source Aa1 communicates with only the distributed power source Aa2, and the distributed power source Aa2 communicates with only the distributed power source Aa1 and the distributed power source Aa3. Also, the distributed power source Aa3 communicates with only the distributed power source Aa2 and the distributed power source Aa4, the distributed power source Aa4 communicates with only the distributed power source Aa3 and the distributed power source Aa5, and the distributed power source Aa5 communicates with only the distributed power source Aa4. Thus, for the illustrated electric power system to function appropriately, the distributed power sources Aa need only be in a state where the communication unit 34a of each distributed power source Aa communicates with the communication unit 34a of at least one distributed power source Aa among the other distributed power sources Aa, and a communication path exists between two arbitrary distributed power sources Aa ("interlinked state"). That is, one distributed power source Aa does not need to communicate with all of the other distributed power sources Aa connected to the electric power system.

For example, in the case of the distributed power source Aa2, an internal phase $\theta_2$ generated by the internal phase generation unit 31a is transmitted to the communication units 34a of the distributed power sources Aa1 and Aa3 by the communication unit 34a of the distributed power source Aa2. Also, the distributed power source Aa2 receives an internal phase $\theta_1$ transmitted from the communication unit 34a of the distributed power source Aa1, and an internal phase $\theta_3$ transmitted from the communication unit 34a of the distributed power source Aa3.

Next, the internal phase generation unit 31a of each distributed power source Aa will be described in detail.

The internal phase generation unit 31a generates the internal phase $\theta_i$, using a generated internal phase $\theta_i$ and an internal phase $\theta_j$ of another distributed power source Aa that is input from the communication unit 34a. Even if the internal phase $\theta_i$ differs from the internal phase $\theta_j$, the internal phase $\theta_i$ and the internal phase $\theta_j$ converge to a common internal phase as a result of the operational processing of the internal phase generation unit 31a being repeated. Equations that are used at the time of this processing are the same as equations (1) to (11) used in the first aspect, as will be understood from the following description.

As shown in FIG. 9, the internal phase generation unit 31a is provided with an operation unit 311a, a multiplier 312a, an adder 313a, and an integrator 314a.

The operation unit 311a performs an operation based on the following equation (1). That is, the operation unit 311a subtracts the internal phase $\theta_i$ generated by the internal phase generation unit 31a from each internal phase $\theta_j$ that is input from the communication unit 34a, and outputs an operation result $u_i$ obtained by adding together all the subtraction results to the multiplier 312a.

$$u_i = \sum_j (\theta_j - \theta_i) \tag{1}$$

For example, in the case of the distributed power source Aa2 (see FIG. 10), the operation unit 311a performs the operation of the following equation (2), and outputs an operation result $u_2$.

$$u_2 = \sum_{j=1,3} (\theta_j - \theta_2) \tag{2}$$
$$= (\theta_1 - \theta_2) + (\theta_3 - \theta_2)$$
$$= \theta_1 + \theta_3 - 2\theta_2$$

The multiplier 312a multiplies the operation result $u_i$ that is input from the operation unit 311a by a predetermined coefficient $\varepsilon$, and outputs the multiplication result to the adder 313a. The coefficient $\varepsilon$ is a value that satisfies $0<\varepsilon<1/d_{max}$, and is set in advance. When the number of other distributed power sources Aa that the communication unit 34a communicates with is given as $d_i$, $d_{max}$ is the maximum number of $d_i$ among all the distributed power sources Aa connected to the electric power system. In other words, $d_{max}$ is the number of internal phases $\theta_j$ that are input to the communication unit 34a of the distributed power source Aa that communicates with the largest number of other distributed power sources Aa, among the distributed power sources Aa connected to the electric power system. Note that the operation result $u_i$ is multiplied by the coefficient $\varepsilon$ in order to prevent too large a variation in the internal phase $\theta_i$ due to the corrected angular frequency $\omega_i$ becoming too large (or too small). Accordingly, in the case where processing by the internal phase generation unit 31a is continuous time Processing, the multiplier 312a need not be provided.

The adder 313a adds the input from the multiplier 312a to a predetermined angular frequency $\omega_0$, and outputs the addition result to the integrator 314a as the corrected angular frequency $\omega_i$. The integrator 314a generates the internal phase $\theta_i$ by integrating the corrected angular frequency $\omega_i$ that is input from the adder 313a, and outputs the generated internal phase $\theta_i$. The integrator 314a generates the internal phase $\theta_i$ by adding the corrected angular frequency $\omega_i$ to the internal phase $\theta_i$ generated last time. Also, the integrator 314a outputs the internal phase $\theta_i$ as a value in the range ($-\pi < \theta_i \leq \pi$). Note that the setting of the range of the internal phase $\theta_i$ is not limited thereto, and the range may be set as ($0 \leq \theta_i < 2\pi$), for example. The internal phase $\theta_i$ is output to the command signal generation unit 32a, the communication unit 34a, and the operation unit 311a.

In the present embodiment, the control circuit 3a was described as being realized as a digital circuit, but may be realized as an analog circuit. Also, the processing that is performed by each unit may be designed by a program, and a computer may be operated as the control circuit 3a by causing the computer to execute the program. Also, the program may be recorded on a recording medium, and the computer may be operated to read the program.

In the present embodiment, the internal phase generation unit 31a generates the internal phase $\theta_i$, using a generated internal phase $\theta_i$ and an internal phase $\theta_j$ of another distributed power source Aa that is input from the communication unit 34a. In the case where the internal phase $\theta_i$ is larger than the arithmetic mean value of the internal phases $\theta_j$, the operation result $u_i$ that is output by the operation unit 311a will be a negative value. This results in the corrected angular frequency $\omega_i$ being smaller than the predetermined angular frequency $\omega_0$, and the amount of change in the internal phase $\theta_i$ decreasing. On the other hand, in the case where the internal phase $\theta_i$ is smaller than the arithmetic mean value of the internal phases $\theta_j$, the operation result $u_i$ that is output by the operation unit 311a will be a positive value. This results in the corrected angular frequency $\omega_i$ being larger than the predetermined angular frequency $\omega_0$, and the amount of change in the internal phase $\theta$, increasing. In other words, the internal phase $\theta_i$ approaches the arithmetic mean value of the internal phases $\theta_j$. As a result of this processing being performed by each of the distributed power sources Aa, the internal phase $\theta$, of each distributed power source Aa converges to the same value. The internal phase $\theta_i$ changes over time, and can be thought of as combining a component that changes according to the angular frequency $\omega_0$ and a component that changes so as to compensate for shift in the initial phase. As a result of the latter component converging to the same value $\theta\alpha$, the internal phase $\theta_i$ of each distributed power source Aa also converges to the same value (see Documents 2 and 3). It has also been demonstrated that the convergence value $\theta\alpha$ is the arithmetic mean value of the initial values of the internal phases $\theta_i$ of distributed power sources Aa, as shown in the following equation (3), where n is the number of distributed power sources Aa connected to the electric power system, and the following equation (3) shows the arithmetic mean value being calculated by adding together all the initial values of the internal phases $\theta_1$ to $\theta_n$ of the distributed power sources Aa1 to Aan and dividing the result by n.

$$\theta_\alpha = \frac{1}{n}\sum_{i=1}^{n}\theta_i(0) \quad (3)$$

The convergence of the internal phase $\theta_i$ in the electric power system shown in FIG. 10 can be shown by simulation, similarly to the case of the sampling phase previously described with reference to FIGS. 4A and 4B. Note that because the internal phases $\theta_1$ to $\theta_5$ need only be respectively read for the sampling phases $\theta_1$ to $\theta_5$, a detailed description relating to the simulation will be omitted.

According to the present embodiment, the internal phases $\theta_i$ of all the distributed power sources Aa converge to the same value, as a result of each of the distributed power sources Aa connected to the electric power system performing mutual communication with at least one distributed power source Aa (located nearby, for example), and the electric power system being in the interlinked state. In other words, it is not necessary for one of the distributed power sources Aa or a monitoring device to communicate with all the other distributed power sources Aa. Accordingly, the system does not become large-scale. Also, even in the case where there is a fault with one of the distributed power sources Aa or where one of the distributed power sources Aa is removed, the internal phase $\theta_i$ can be synchronized if all the other distributed power sources Aa can communicate with any of the distributed power sources Aa, and the electric power system is in the interlinked state. Also, in the case where a distributed power source Aa is added, that distributed power source Aa need only be able to communicate with at least one distributed power source Aa. Accordingly, it is possible to respond flexibly to an increase or decrease in distributed power sources Aa.

Note that although the case where a component that changes so as to compensate for shift in the initial, phase of the internal phase $\theta_i$ of the distributed power source Aa is converged to the arithmetic mean value of the initial values of the internal phases $\theta_i$ of the distributed power sources Aa was described in the first embodiment, the present invention is not limited thereto. The convergence value $\theta\alpha$ can take other values, depending on the operational equation that is set in the operation unit 311a.

For example, in the case where the operational equation that is set in the operation unit 311a is the following equation (4), the convergence value $\theta\alpha$ will be a value such as shown in the following equation (5), where $d_i$ is the number of other distributed power sources Aa with which the communication unit 34a communicates, that is, the number of internal phases $\theta_j$ that are input to the communication unit 34a. In other words, the convergence value $\theta\alpha$ is the weighted mean value of the initial values of the internal phases $\theta_i$ of the distributed power sources Aa, which are weighted according to the number of communication partners.

$$u_i = \frac{1}{d_i}\sum_j(\theta_j - \theta_i) \quad (4)$$

$$\theta_\alpha = \frac{\sum_{i=1}^{n}d_i\theta_i(0)}{\sum_{i=1}^{n}d_i} \quad (5)$$

Also, in the case where the operational equation that is set in the operation unit 311a is the following equation (6), the convergence value $\theta\alpha$ will be the geometric mean value of the initial values of the internal phases $\theta_i$ of the distributed power sources Aa, as shown in the following equation (7).

$$u_i = \theta_i \sum_j (\theta_j - \theta_i) \qquad (6)$$

$$\theta_\alpha = \sqrt[n]{\prod_{i=1}^n \theta_i(0)} \qquad (7)$$

Also, in the case where the operational equation that is set in the operation unit 311a is the following equation (8), the convergence value θα will be the harmonic mean value of the initial values of the internal phases $\theta_i$ of the distributed power sources Aa, as shown in the following equation (9).

$$u_i = \theta_i^2 \sum_j (\theta_i - \theta_j) \qquad (8)$$

$$\theta_\alpha = \frac{n}{\sum_{i=1}^n \frac{1}{\theta_i(0)}} \qquad (9)$$

Also, in the case where the operational equation that is set in the operation unit 311a is the following equation (10), the convergence value θα will be the mean value of order P of the initial values of the internal phases $\theta_i$ of the distributed power sources Aa, as shown in the following equation (11).

$$u_i = \frac{1}{P\theta_i^{P-1}} \sum_j (\theta_j - \theta_i) \qquad (10)$$

$$\theta_\alpha = \sqrt[P]{\sum_{i=1}^n \frac{1}{n} \theta_i(0)^P} \qquad (11)$$

Figure 11:
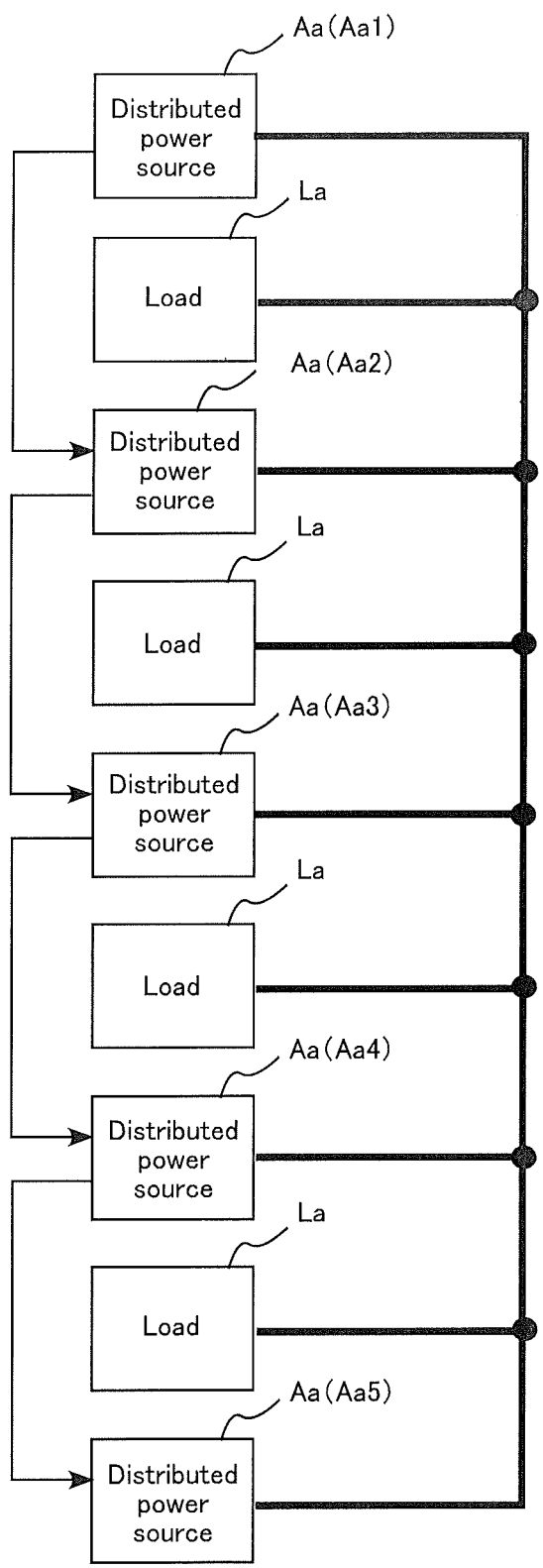
FIG. 11 is a diagram illustrating another communication state of distributed power sources connected in parallel in an electric power system.

Note that although the case where each distributed power source Aa performs mutual communication was described in the first embodiment, the present invention is not limited thereto, and one-way communication may be performed. Specifically, as shown in FIG. 11, the distributed power source Aa1 only transmits to the distributed power source Aa2. The distributed power source Aa2 only receives from the distributed power source Aa1, and only transmits to the distributed power source Aa3. The distributed power source Aa3 only receives from the distributed power source Aa2, and only transmits to the distributed power source Aa4. The distributed power source Aa4 only receives from the distributed power source Aa3, and only transmits to the distributed power source Aa5. The distributed power source Aa5 only receives from the distributed power source Aa4. Even in this case, the internal phase $\theta_i$ can be synchronized. More generally, a condition for being able to synchronize the internal phase $\theta_i$ is a state in which an arbitrary distributed power source Aa connected to the electric power system can be reached by following the transmission destinations from a certain distributed power source Aa connected to the electric power system (a state including the "spanning tree" in graph theory).

In the first embodiment, the case was described where the electric power system to which the distributed power source Aa is connected always operates autonomously, but the present invention is not limited thereto. The present invention can also be applied in the case where the electric power system to which the distributed power source Aa is connected is ordinarily interconnected to an electric power grid. This case will be described below.

Figure 12:
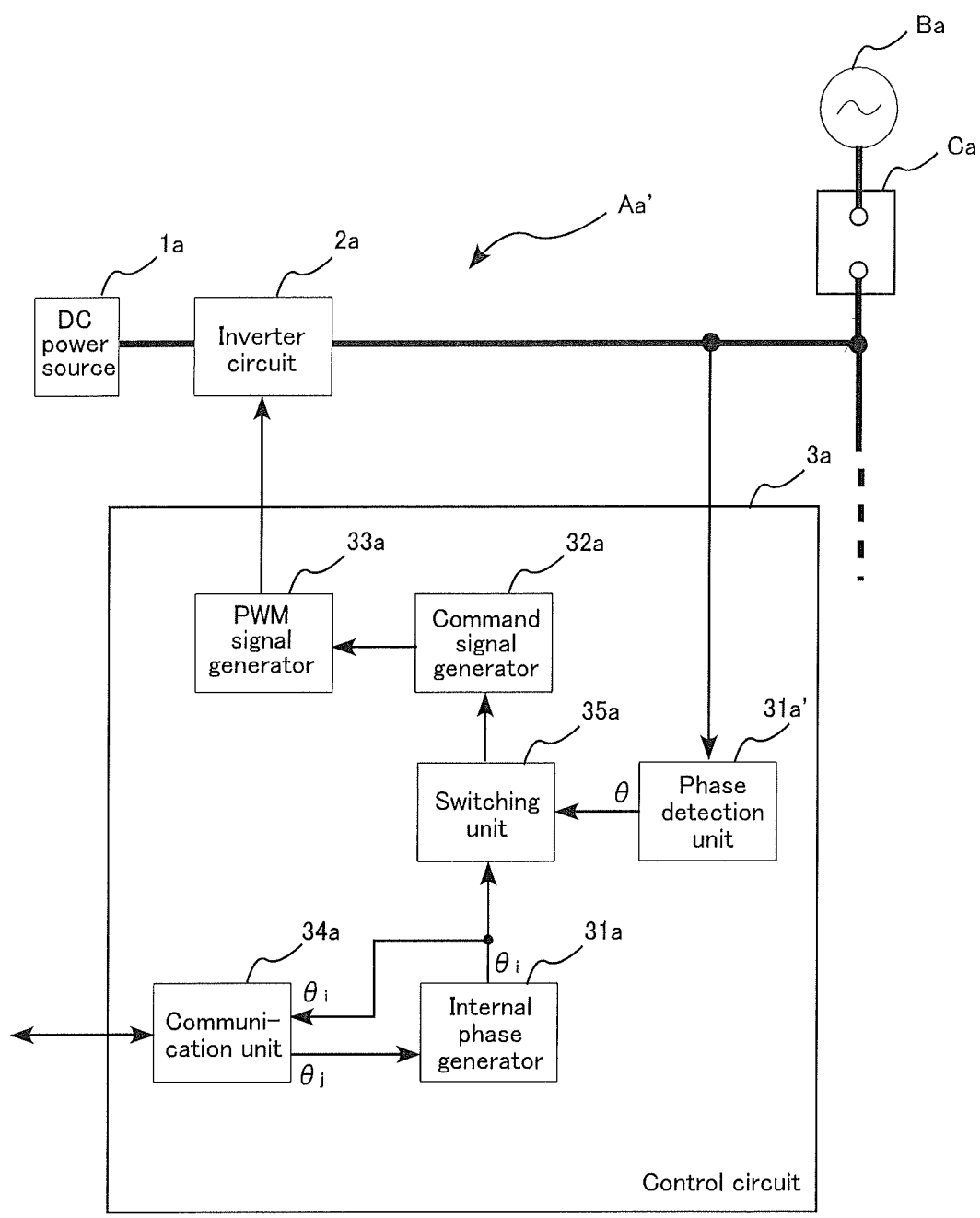
FIG. 12 is a diagram illustrating a distributed power source according to a second embodiment of the second aspect.

FIG. 12 is a diagram illustrating a distributed power source according to a second embodiment of the second aspect of the present invention. In the diagram, the same reference signs are given to constituent elements that are the same as or similar to the distributed power source Aa (see FIG. 9) according to the first embodiment. A distributed power source Aa' according to the second embodiment differs from the distributed power source Aa according to the first embodiment in that the internal phase that is used is changed depending on whether or not the distributed power source Aa' is interconnected to the electric power grid Ba. As shown in FIG. 12, the distributed power source Aa' according to the second embodiment is provided with a phase detection unit 31a' and a switching unit 35a.

The phase detection unit 31a' detects a phase θ from the voltage signal of the grid voltage, and outputs the detected phase θ to the switching unit 35a. The detection position of the voltage signal of the phase detection unit 31a' is between the inverter circuit 2a and a circuit breaker Ca, and in the case where the distributed power source Aa' is interconnected to the electric power grid Ba, the voltage at the detection position will be the grid voltage.

The switching unit 35a, in the case where the distributed power source Aa' is interconnected to the electric power grid Ba, outputs the phase θ of the grid voltage detected by the phase detection unit 31a' to the command signal generation unit 32a. On the other hand, if the electric power system to which the distributed power source Aa is connected is separated from the electric power grid Ba by the circuit breaker Ca, the switching unit 35a outputs the internal phase $\theta_i$ generated by the internal phase generation unit 31a to the command signal generation unit 32a.

Also, the command signal generation unit 32a performs output current control if the distributed power source Aa' is interconnected to the electric power grid Ba, and performs output voltage control if the distributed power source Aa' is separated from the electric power grid Ba.

In the second embodiment, the electric power system operates autonomously, similarly to the first embodiment, in the case where the electric power system to which the distributed power source Aa' is connected is separated from the electric power grid Ba by the circuit breaker Ca. The internal phases $\theta_i$ of all the distributed power sources Aa' can also be synchronized in this case, if each of the distributed poker sources Aa' performs mutual communication with at least one distributed power source Aa', and the distributed power sources in the electric power system are in the interlinked state.

As described above, according to the second aspect of the present invention, an internal phase generator of each distributed power source generates a new internal phase, using an operation result that is based on an internal phase that the internal phase generator has generated itself and an internal phase of another distributed power source. As a result of the internal phase generator of each distributed power source performing this processing, the internal phases of all the distributed power sources ultimately converge to the same value. Each of the distributed power sources need only perform mutual communication with at least one distributed power source (located nearby, for example), and it is not necessary for one of the distributed power sources or a monitoring device to communicate with all the other distributed power sources. Accordingly, the system does not become large-scale. Also, even in the case where there is a fault with one of the distributed power sources, the internal phase can be synchronized if all the other distributed power sources can communicate with any of the distributed power sources. Furthermore, it is possible to respond flexibly to an increase or decrease in distributed power sources.

<Third Aspect>

Various requirements need to be satisfied in the case where a distributed power source is interconnected to an electric power grid. If the distributed power source is interconnected to the electric power grid on condition of there being reverse power flow, an islanding detection circuit for preventing islanding needs to be provided. Islanding is where a distributed power source continues to supply power to the load of a power distribution grid, in the case where the power distribution grid to which the distributed power source was interconnected has become separated from the electric power grid. The islanding detection circuit, in the case of detecting that the distributed power source is in an islanding state, issues an instruction for separating the distributed power source from the power distribution grid, and stops supply of power from the distributed power source to the load. There are passive methods and active methods of detecting islanding, and various detection methods have been developed.

Active methods of detecting islanding include slip mode frequency shift, QC mode frequency shift, active power variation, and reactive power variation. According to these methods, a periodic minute variation in voltage (or reactive power, active power, frequency, etc.) is actively provided by the distributed power source, and islanding is detected according to the change in detected frequency (or voltage, etc.) (e.g., see Document 5).

In the case where a plurality of distributed power sources are connected in parallel to the power distribution grid, it may not be possible to detect islanding, due to interference between the islanding detection circuits of the distributed power sources. In other words, the change that is detected may not reach a level at which it is determined that islanding is occurring, as a result of the minute variations provided by the islanding detection circuits cancelling each other out. In order to avoid this, a method for synchronizing the timing of the minute variations has been proposed.

In the case where a plurality of distributed power sources are interconnected to the same power distribution grid, the timing phase of the islanding detection circuit of each distributed power source needs to be synchronized. Techniques for this purpose include the "centralized monitoring method" and the "master-slave method", as also mentioned in the second aspect of the present invention. For example, Document 6 discloses timing synchronization using the master-slave method.

The fact that there are problems with the "centralized monitoring method" and the "master-slave method" has already been mentioned. According to the third aspect of the present invention, an islanding detection circuit that can resolve such problems is provided.

Figure 13:
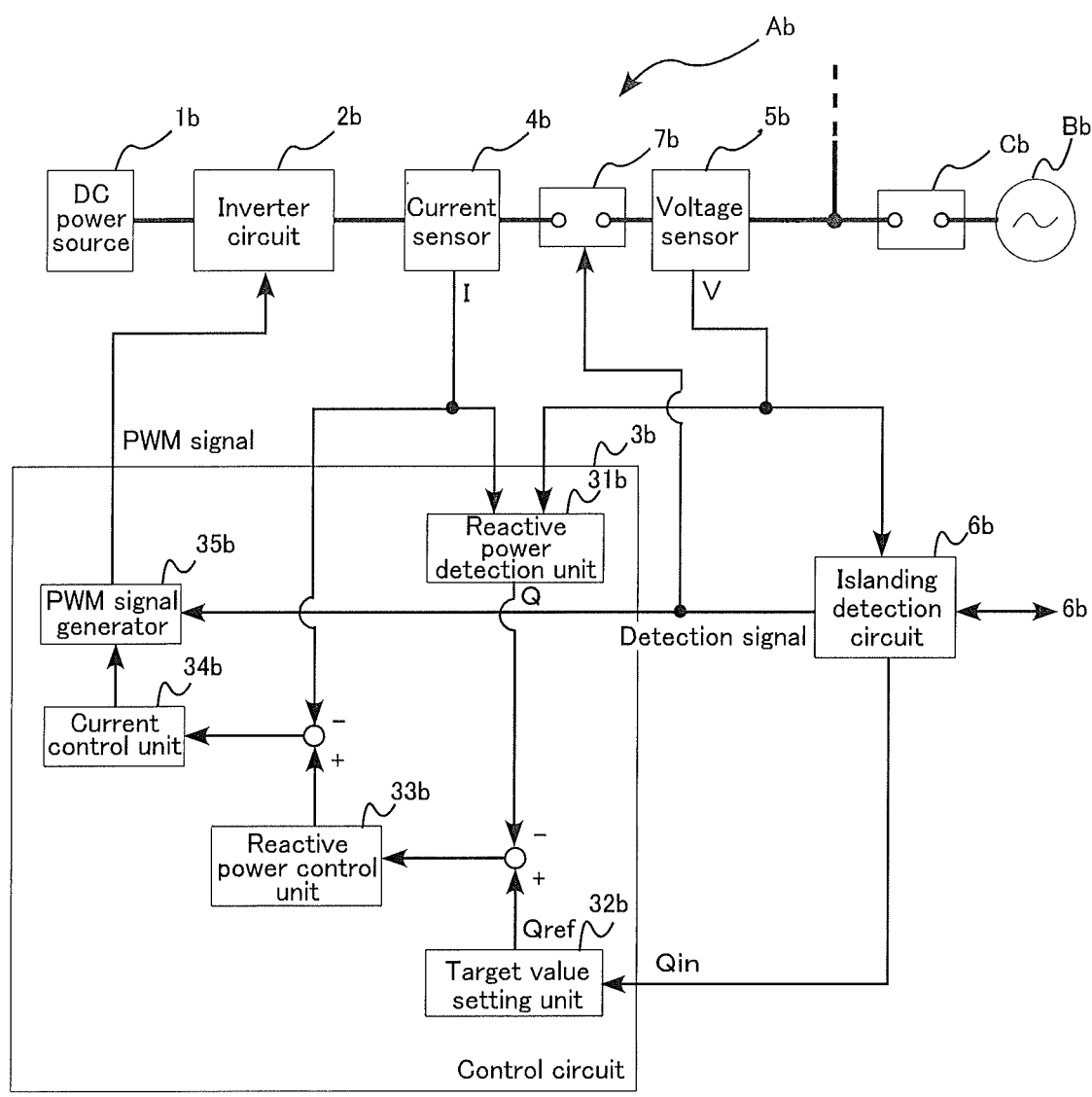
FIG. 13 is a diagram illustrating a distributed power source provided with an islanding detection circuit according to a first embodiment of a third aspect.
Figure 14:
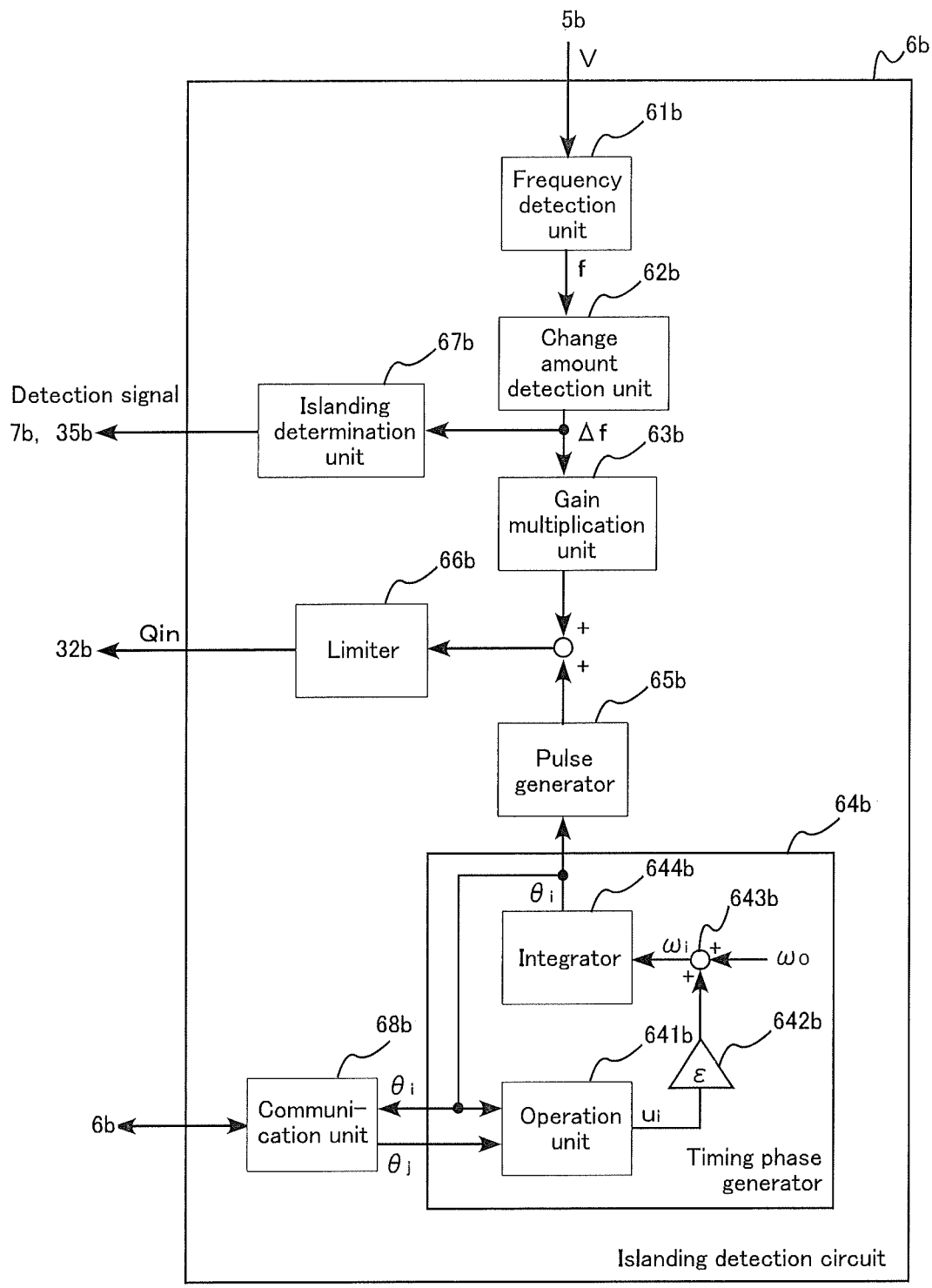
FIG. 14 is a functional block diagram for illustrating an internal configuration of an islanding detection circuit according to the first embodiment of the third aspect.
Figure 15:
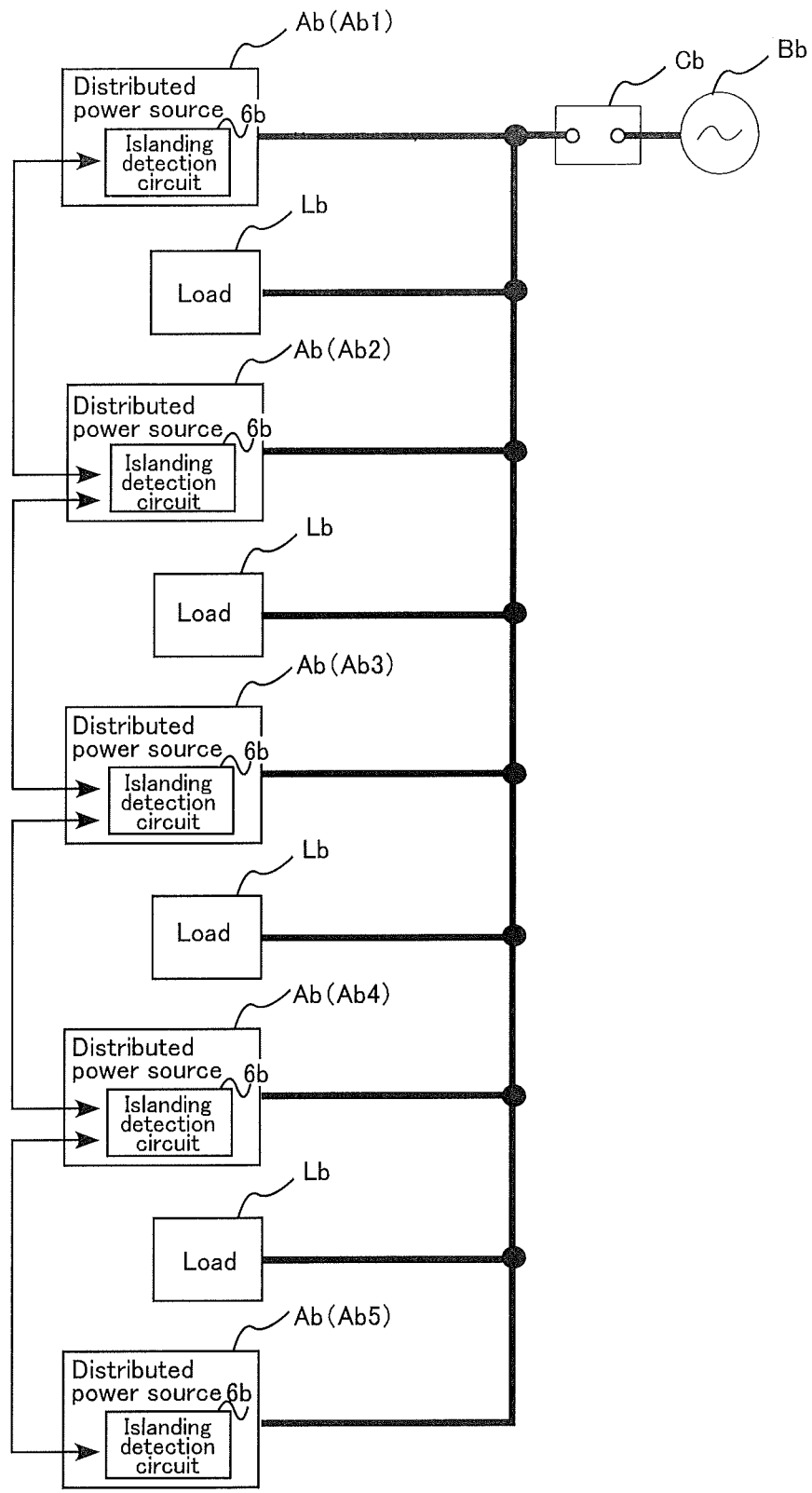
FIG. 15 shows an electric power system in which a plurality of distributed power sources are connected in parallel according to the first embodiment of the third aspect.

FIG. 13 is a diagram illustrating a distributed power source provided with an islanding detection circuit according to a first embodiment of the third aspect of the present invention. FIG. 14 is a functional block diagram for illustrating the internal configuration of the islanding detection circuit. FIG. 15 shows an electric power system in which a plurality of distributed power sources are connected in parallel.

As shown in FIG. 13, a distributed power source Ab is provided with a DC power source $1b$, an inverter circuit $2b$, a control circuit $3b$, a current sensor $4b$, a voltage sensor $5b$, an islanding detection circuit $6b$, and an interconnection circuit breaker $7b$. The distributed power source Ab is interconnected to the power distribution grid via the interconnection circuit breaker $7b$. The power distribution grid is interconnected to an electric power grid Bb via a distribution line breaker Cb. In the distributed power source Ab, DC power that is output by the DC power source $1b$ is converted into AC power and output by the inverter circuit $2b$, and the output AC power is supplied to a load Lb (see FIG. 15) connected to the power distribution grid. Power is also supplied to the load Lb from the electric power grid Bb.

Also, the distributed power source Ab is a system with reverse power flow, and also supplies AC power to the electric power grid Bb. Note that, although not shown, a transformer is provided on the output side of the inverter circuit $2b$. In the present embodiment, the inverter circuit $2b$, the control circuit $3b$, the current sensor $4b$, the voltage sensor $5b$, the islanding detection circuit $6b$ and the interconnection circuit breaker $7b$ are packaged as an inverter device (so-called power conditioner).

The DC power source $1b$ outputs DC power, and is provided with a solar cell, for example. The DC power source $1b$ outputs the generated DC power to the inverter circuit $2b$. Note that the DC power source $1b$ may be a fuel cell, a storage battery, an electric double-layer capacitor or a lithium ion battery, instead of a solar cell. Also, the DC power source $1b$ may include an AC generator (diesel engine generator, micro gas turbine generator, wind turbine generator, etc.). In this case, AC power generated by the AC generator is output after being converted into DC power.

The inverter circuit $2b$ converts the DC power that is input from the DC power source $1b$ into AC power and outputs the AC power. The inverter circuit $2b$ is provided with a PWM control inverter and a filter that are not shown. The PWM control inverter is a single-phase inverter provided with two pairs of four switching elements in total that are not shown, and converts DC power into AC power by switching each switching element ON and OFF based on a PWM signal that is input from the control circuit $3b$. The filter removes the high frequency component caused by the switching. Note that the inverter circuit $2b$ is not limited thereto. For example, the PWM control inverter may be a three-phase inverter or may be a multilevel inverter. Also, instead of PWM control, another method may be used such as phase shift control.

The control circuit $3b$ controls the inverter circuit $2b$, and is realized by a microcomputer and the like, for example. The control circuit $3b$ generates the PWM signal based on a current signal I that is input from the current sensor $4b$, a voltage signal V that is input from the voltage sensor $5b$, and a variation signal Qin that is input from the islanding detection circuit $6b$, and outputs the generated PWM signal to the inverter circuit $2b$. The control circuit $3b$ is provided with a reactive power detection unit $31b$, a target value setting unit $32b$, a reactive power control unit $33b$, a current control unit $34b$, and a PWM signal generation unit $35b$.

The reactive power detection unit $31b$ detects the reactive power at an interconnection point where the distributed power source Ab is interconnected to the power distribution grid (hereinafter, simply "interconnection point"). The reactive power detection unit $31b$ receives input of the current signal I obtained by the current flowing through the interconnection point being detected and digitally converted by the current sensor $4b$ and the voltage signal V obtained by the voltage at the interconnection point being detected and digitally converted by the voltage sensor $5b$, and calculates a reactive power value Q. Note that the current sensor $4b$ need only be configured to detect the current that flows through the interconnection point, and thus may be disposed downstream of the interconnection circuit breaker $7b$. Also, the voltage sensor 5b need only be configured to detect the voltage at the interconnection point, and thus may be disposed upstream of the interconnection circuit breaker 7b.

The target value setting unit 32b sets a target value Qref. A basic target value $Q_0$, which is a target value for controlling the reactive power value Q is set in advance in the target value setting unit 32b. In the present embodiment, "0" is set as the basic target value $Q_0$ so that the power factor will be "1". The target value setting unit 32b sets the target value Qref by adding the variation signal Qin that is input from the islanding detection circuit 6b to the basic target value $Q_0$ (=$Q_0$+Qin).

The reactive power control unit 33b receives input of a deviation (Qref−Q) between the reactive power value Q that is output from the reactive power detection unit 31b and the target value Qref that is output from the target value setting unit 32b, and outputs a correction value for adjusting the deviation to "0" as a correction value signal.

The current control unit 34b receives input of the current signal I that is input from the current sensor 4b and a deviation from the correction value signal that is input from the reactive power control unit 33b, and outputs a correction value for adjusting the deviation to "0" as a command value signal to the PWM signal generation unit 35b.

The PWM signal generation unit 35b generates the PWM signal using the triangular wave comparison method, based on the command value signal that is input from the current control unit 34b and a carrier signal generated as a triangular wave signal of a predetermined frequency (e.g., 4 kHz). For example, a pulse signal that is high if the command value signal is greater than the carrier signal and low if the command value signal is less than or equal to the carrier signal is generated as the PWM signal. The generated PWM signal is output to the inverter circuit 2b. Note that the PWM signal generation unit 35b is not limited to the case where the PWM signal is generated using the triangular wave comparison method, and may generate the PWM signal with a hysteresis method, for example. Also, the PWM signal generation unit 35b stops generation of the PWM signal, in the case where a detection signal is input from the islanding detection circuit 6b. The detection signal is a signal that is output when islanding is detected by the islanding detection circuit 6b. Power conversion by the inverter circuit 2b stops as a result of input of the PWM signal from the PWM signal generation unit 35b stopping.

The control circuit 3b outputs a PWM signal for regulating the reactive power value Q to the target value Qref to the inverter circuit 2b. The inverter circuit 2b regulates the reactive power value Q to the target value Qref by performing power conversion based on the PWM signal.

Note that the control circuit 3b is not limited to the above configuration, and need only be configured to generate a PWM signal that is capable of controlling the reactive power value Q. For example, the control circuit 3b may perform feedback control of a signal or value other than the current signal I and the reactive power value Q (e.g., voltage signal V, active power value, output voltage value of the DC power source 1b).

In the present embodiment, the distributed power source Ab was described as being a single-phase system, but may be a three-phase system. In this case, the reactive power detection unit 31b need only be configured to calculate the reactive power value Q based on three-phase signals that are respectively input from the current sensor 4b and the voltage sensor 5b. Also, the current control unit 34b need only be configured to perform three-phase to two-phase transformation (4 transformation) and rotating coordinate transformation (dq transformation) on the three-phase current signals that are input from the current sensor 4b, and to output three command value signals by performing inverse transformation on the correction values for the two axial components. At this time, the current control unit 34b need only be configured to substitute in one of the axial components and to use the deviation between that axial component and the reactive power value Q.

In the present embodiment, the control circuit 3b was described as being realized as a digital circuit, but may be realized as an analog circuit. Also, the processing that is performed by each unit may be designed by a program, and a computer may be operated as the control circuit 3b by causing the computer to execute the program. Also, the program may be recorded on a recording medium, and the computer may be operated to read the program.

The interconnection circuit breaker 7b breaks the interconnection between the distributed power source Ab and the power distribution grid. The interconnection circuit breaker 7b is normally closed, and the distributed power source Ab is interconnected to the power distribution grid. However, in the case where a detection signal is input from the islanding detection circuit 6b, the interconnection circuit breaker 7b is opened and breaks the interconnection between the distributed power source Ab and the power distribution grid. The islanding state of the distributed power source Ab is thereby avoided.

The islanding detection circuit 6b detects islanding, and is realized by a microcomputer and the like, for example. The islanding detection circuit 6b outputs a detection signal if islanding is detected. The detection signal output by the islanding detection circuit 6b is input to the PWM signal generation unit 35b and the interconnection circuit breaker 7b.

As shown in FIG. 14, the islanding detection circuit 6b is provided with a frequency detection unit 61b, a change amount detection unit 62b, a gain multiplication unit 63b, a timing phase generation unit 64b, a pulse generation unit 65b, a limiter 66b, and an islanding determination unit 67b. Note that, in FIG. 14, only the configuration for islanding detection according to the present invention is shown. The islanding detection circuit 6b is actually also provided with a configuration for islanding detection by another active method or a configuration for islanding detection by a passive method.

The frequency detection unit 61b detects a frequency f of the voltage at the interconnection point, based on the voltage signal V that is input from the voltage sensor 5b, and outputs the result to the change amount detection unit 62b. The change amount detection unit 62b detects the amount of change Δf in the frequency f that is input from the frequency detection unit 61b, and outputs the detected amount of change Δf to the gain multiplication unit 63b and the islanding determination unit 67b. The gain multiplication unit 63b multiplies the amount of change Δf that is input from the change amount detection unit 62b by a positive feedback gain K, and outputs the multiplication result.

The timing phase generation unit 64b generates a timing phase $\theta_i$ of the islanding detection circuit 6b. The timing phase $\theta_i$ is for determining the timing for providing the periodic variation to the output of the inverter circuit 2b. The timing phase generation unit 64b will be discussed in detail later.

Figure 16:
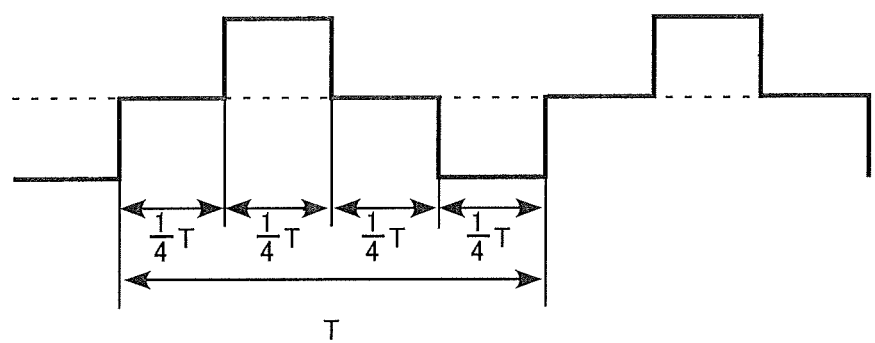
FIG. 16 is a diagram illustrating an example of a pulse signal that is generated by a pulse generation unit.

The pulse generation unit 65b generates a pulse signal according to the timing phase $\theta_i$ that is input from the timing phase generation unit 64b. In the present embodiment, a pulse signal that repeatedly switches between a positive value and a negative value is generated, and a period during which the value of the pulse signal is zero between the positive value and the negative value is provided. That is, a pulse signal that is zero for a ¼ period of the cycle T, a positive value for the following ¼ period, zero for the following ¼ period, and a negative value for following ¼ period is generated (see FIG. 16). Note that the pulse signal that is generated by the pulse generation unit 65b is not limited thereto, and may be a rectangular wave, a triangular wave or a sawtooth wave, or may be a sine wave.

The limiter 66b outputs a signal restricting the output range of a signal obtained by adding the signal that is output from the gain multiplication unit 63b and the signal that is output from the pulse generation unit 65b to the target value setting unit 32b as the variation signal Qin.

The islanding determination unit 67b determines whether the distributed power source Ab is in an islanding state. The islanding determination unit 67b determines that the distributed power source Ab is in an islanding state if the amount of change if that is input from the change amount detection unit 62b exceeds a predetermined value, and outputs a detection signal to the PWM signal generation unit 35b and the interconnection circuit breaker 7b.

In cases such as where an accident occurs in the electric power grid Bb, the distribution line breaker Cb is opened by a protective device provided on the electric power grid Bb side, and the power distribution grid is separated from the electric power grid Bb. The distributed power source Ab interconnected to the power distribution grid that has been separated from the electric power grid Bb thereby enters an islanding state.

In the case where the distributed Power source Ab is not in an islanding state, that is, in the case where the power distribution grid to which the distributed power source Ab is interconnected to the electric power grid Bb, the phase of the voltage at the interconnection point (the interconnection point at which the distributed power source Ab is interconnected to the power distribution grid) matches the phase of the grid voltage of the electric power grid Bb. Accordingly, even if the phase of the current that flows through the interconnection point varies due to variation in the target value Qref, the phase of the voltage at the interconnection point does not change, nor does the frequency f. On the other hand, in the case where the distributed power source Ab is in an islanding state, that is, in the case where the power distribution grid to which the distributed power source Ab is interconnected is not interconnected to the electric power grid Bb, the phase of the voltage at the interconnection point changes independently of the phase of the grid voltage of the electric power grid Bb. Accordingly, when the phase of the current that flows through the interconnection point varies due to variation in the target value Qref, the phase of the voltage at the interconnection point also varies, as does the frequency f. In other words, whether the distributed power source Ab is in an islanding state can be determined by whether the frequency f varies. Because the amount of change Δf in the frequency f also varies when the frequency f varies, and a value obtained by multiplying the amount of change Δf by the positive feedback gain K is further added, the target value Qref varies greatly. It is thereby determined that the distributed power source Ab is in an islanding state, due to the amount of change Δf also varying greatly and exceeding a predetermined value.

The islanding determination unit 67b outputs a low-level signal if it is not determined that the distributed power source Ab is in an islanding state (if it is determined that the distributed power source Ab is in an interconnected state), and outputs a high-level signal serving as the detection signal if it is determined that the distributed power source Ab is in an islanding state. Note that the detection signal is not limited thereto. The PWM signal generation unit 35b, having received input of the detection signal, stops generation of the PWM signal. The power conversion operation by the inverter circuit 2b thereby stops. Also, the interconnection circuit breaker 7b, having received input of the detection signal, breaks the interconnection between the distributed power source Ab and the power distribution grid. The islanding state of the distributed power source Ab is thereby avoided. Note that because an islanding state is avoided if the interconnection circuit breaker 7b breaks the interconnection, stopping the power conversion operation of the inverter circuit 2b is not necessarily required. For example, the power conversion operation by the inverter circuit 2b may be continued, in order to supply power to a load connected upstream from the interconnection circuit breaker 7b.

The communication unit 68b communicates with other distributed power sources Ab. The communication unit 68b receives input of the timing phase $\theta_i$ generated by the timing phase generation unit 64b, and transmits to the communication unit 68b of another distributed power source Ab. Also, the communication unit 68b outputs a timing phase $\theta_j$ received from the communication unit 68b of another distributed power source Ab to the timing phase generation unit 64b. Note that the communication method is not limited, and may be wired communication or may be wireless communication.

As shown in FIG. 15, the distributed power source Ab is connected in parallel with other distributed power sources Ab in the electric power system. In FIG. 15, a state in which five distributed power sources Ab (Ab1 to Ab5) and four loads Lb are connected is shown. Note that more distributed power sources Ab and loads Lb are connected in an actual electric power system.

The arrows shown in FIG. 15 indicate communication. The islanding detection circuit 6b of the distributed power source Ab1 communicates with only the islanding detection circuit 6b of the distributed power source Ab2, and the islanding detection circuit 6b of the distributed power source Ab2 communicates with only the islanding detection circuit 6b of the distributed power source Ab1 and the islanding detection circuit 6b of the distributed power source Ab3. Also, the islanding detection circuit 6b of the distributed power source Ab3 communicates with only the islanding detection circuit 6b of the distributed power source Ab2 and the islanding detection circuit 6b of the distributed power source Ab4, the islanding detection circuit 6b of the distributed power source Ab4 communicates with only the islanding detection circuit 6b of the distributed power source Ab3 and the islanding detection circuit 6b of the distributed power source Ab5, and the islanding detection circuit 6b of the distributed power source Ab5 communicates with only the islanding detection circuit 6b of the distributed power source Ab4. Thus, the islanding detection circuit 6b of a distributed power source Ab need only communicate with the islanding detection circuit 6b of at least one distributed power source Ab among the distributed power sources Ab connected to the electric power system, and be in a state where a communication path exists between the islanding detection circuits 6b of two arbitrary distributed power sources Ab connected to the electric power system ("interlinked state"), and does not need to communicate with the islanding detection circuits 6b of all the distributed power sources Ab connected to the electric power system.

For example, in the case of the distributed power source Ab2, the communication unit 68b of the islanding detection circuit 6b transmits a timing phase $\theta_2$ generated by the timing phase generation unit 64b to the communication unit 68b of the islanding detection circuits 6b of the distributed power sources Ab1 and Ab3, receives a timing phase $\theta_1$ from the communication unit 68b of the islanding detection circuit 6b of the distributed power source Ab1, and receives a timing phase $\theta_3$ from the communication unit 68b of the islanding detection circuit 6b of the distributed power source Ab3.

Next, the timing phase generation unit 64b of each distributed electrode Ab will be described in detail.

The timing phase generation unit 64b generates the timing phase $\theta_i$, using a generated timing phase $\theta_i$ and a timing phase $\theta_j$ of the islanding detection circuit 6b of another distributed power source Ab that is input from the communication unit 68b. Even if the timing phase $\theta_i$ differs from the timing phase $\theta_j$, the timing phase $\theta_i$ and the timing phase $\theta_j$ converge to a common timing phase as a result of the operational processing by the timing phase generation unit 64b being repeated. The equations used at the time of this processing are the same as equations (1) to (11) used in the first aspect, as will be understood from the following description.

As shown in FIG. 14, the timing phase generation unit 64b is provided with an operation unit 641b, a multiplier 642b, an adder 643b, and an integrator 644b.

The operation unit 641b performs an operation based on the following equation (1). That is, the operation unit 641b subtracts the timing phase $\theta_i$ generated by the timing phase generation unit 64b from each timing phase $\theta_j$ that is input from the communication unit 68b, and outputs an operation result $u_i$ obtained by adding together all the subtraction results to the multiplier 642b.

$$u_i = \sum_j (\theta_j - \theta_i) \qquad (1)$$

For example, in the case of the distributed power source Ab2 (see FIG. 15), the operation unit 641b performs the operation of the following equation (2), and outputs an operation result $u_2$.

$$\begin{aligned} u_2 &= \sum_{j=1,3} (\theta_j - \theta_2) \\ &= (\theta_1 - \theta_2) + (\theta_3 - \theta_2) \\ &= \theta_1 + \theta_3 - 2\theta_2 \end{aligned} \qquad (2)$$

The multiplier 642b multiplies the operation result $u_i$ that is input from the operation unit 641b by a predetermined coefficient $\varepsilon$, and outputs the multiplication result to the adder 643b. The coefficient E is a value that satisfies $0<\varepsilon<1/d_{max}$, and is set in advance. When the number of other islanding detection circuits 6b that the communication unit 68b communicates with is given as $d_i$, $d_{max}$ is the maximum number of $d_i$ among the islanding detection circuits 6b of all the distributed power sources Ab connected to the electric power system. In other words, $d_{max}$ is the number of timing phases $\theta_j$ that are input to the communication unit 68b of the islanding detection circuit 6b that communicates with the largest number of other islanding detection circuits 6b, among the islanding detection circuits 6b of the distributed power sources Ab connected to the electric power system. Note that the operation result $u_i$ is multiplied by the coefficient $\varepsilon$ in order to prevent too large a variation in the timing phase $\theta_i$ due to the corrected angular frequency $\omega_i$ becoming too large (or too small). Accordingly, in the case where processing by the timing phase generation unit 64b is continuous time processing, the multiplier 642b need not be provided.

The adder 643b adds the input from the multiplier 642b to a predetermined angular frequency $\omega_0$, and outputs the addition result to the integrator 644b as the corrected angular frequency $\omega_i$. The integrator 644b generates the timing phase $\theta_i$ by integrating the corrected angular frequency $\omega_i$ that is input from the adder 643b, and outputs the generated timing phase $\theta_i$. The integrator 644b generates the timing phase $\theta_i$ by adding the corrected angular frequency $\omega_i$ to the timing phase $\theta_i$ generated last time. Also, the integrator 644b outputs the timing phase $\theta_i$ as a value in the range $(-\pi<\theta_i\leq\pi)$. Note that the setting of the range of the timing phase $\theta_i$ is not limited thereto, and the range may be set as $(0\leq\theta_i<2\pi)$, for example. The timing phase $\theta_i$ is output to the pulse generation unit 65b, the communication unit 68b, and the operation unit 641b.

In the present embodiment, the islanding detection circuit 6b was described as being realized as a digital circuit, but may be realized as an analog circuit. Also, the processing that is performed by each unit may be designed by a program, and a computer may be operated as the islanding detection circuit 6b by causing the computer to execute the program. Also, the program may be recorded on a recording medium, and the computer may be operated to read the program.

In the present embodiment, the timing phase generation unit 64b generates the timing phase $\theta_i$, using a generated timing phase $\theta_i$ and a timing phase $\theta_j$ of another islanding detection circuit 6b that is input from the communication unit 68b. In the case where the timing phase $\theta_i$ is larger than the arithmetic mean value of the timing phases $\theta_j$, the operation result $u_i$ that is output by the operation unit 641b will be a negative value. This results in the corrected angular frequency $\omega_i$ being smaller than the predetermined angular frequency $\omega_0$, and the amount of change in the timing phase $\theta_i$ decreasing. On the other hand, in the case where the timing phase $\theta_i$ is smaller than the arithmetic mean value of the timing phases $\theta_j$, the operation result $u_i$ that is output by the operation unit 641b will be a positive value. This results in the corrected angular frequency $\omega_i$ being larger than the predetermined angular frequency $\omega_0$, and the amount of change in the timing phase increasing. In other words, the timing phase $\theta_i$ approaches the arithmetic mean value of the timing phases $\theta_j$. As a result of this processing being performed by each of the islanding detection circuits 6b, the timing phase $\theta_i$ of each islanding detection circuit 6b converges to the same value. The timing phase $\theta$, changes over time, and can be thought of as combining of a component that changes according to the angular frequency $\omega_0$ and a component that changes so as to compensate for shift in the initial phase. As a result of the latter component converging to the same value $\theta\alpha$, the timing phase $\theta_i$ of each islanding detection circuit 6b also converges to the same value (see Documents 2 and 3). It has also been demonstrated that the convergence value $\theta\alpha$ is the arithmetic mean value of the initial values of the timing phases $\theta_i$ of the islanding detection circuits 6b, as shown in the following equation (3), where n is the number of distributed power sources Ab Connected to the electric power system (i.e., the number of islanding detection circuits 6b), and the following equation (3) shows the arithmetic mean value being calculated by adding together all the initial values of the timing phases $\theta_1$ to $\theta_n$ of the islanding detection circuits 6b of the distributed power sources Ab1 to Abn and dividing the result by n.

$$\theta_\alpha = \frac{1}{n}\sum_{i=1}^{n}\theta_i(0) \tag{3}$$

The convergence of the timing phase $\theta_i$ in the electric power system shown in FIG. 15 can be shown by simulation, similarly to the case of the sampling phase previously described with reference to FIGS. 4A and 4B. Note that because the timing phases $\theta_1$ to $\theta_5$ need only be respectively read for the sampling phases $\theta_1$ to $\theta_5$, a detailed description relating to the simulation will be omitted.

According to the present embodiment, the timing phases $\theta_i$ of all the islanding detection circuits 6b converge to the same value, as a result of the islanding detection circuit 6b of each of the distributed power sources Ab connected to the electric power system performing mutual communication with the islanding detection circuit 6b of at least one distributed power source Ab (located nearby, for example), and the electric power system being in the interlinked state. In other words, it is not necessary for one of the islanding detection circuits 6b or a monitoring device to communicate with all the other islanding detection circuits 6b. Accordingly, the system does not become large-scale. Also, even in the case where there is a fault with one of the distributed power sources Ab or where one of the distributed power sources Ab is removed, the timing phase $\theta_i$ can be synchronized if the islanding detection circuits 6b of all the other distributed power sources Ab can communicate with the islanding detection circuit 6b of any of the distributed power sources Ab, and the electric power system is in the interlinked state. Also, in the case where a distributed power source Ab is added, the islanding detection circuit 6b of that distributed power source Ab need only be able to communicate with the islanding detection circuit 6b of at least one distributed power source Ab. Accordingly, it is possible to respond flexibly to an increase or decrease in distributed power sources Ab.

Note that although the case where a component that changes so as to compensate for shift in the initial phase of the timing phase $\theta_i$ of the islanding detection circuit 6b is converged to the arithmetic mean value of the initial values of the timing phases $\theta_i$ of the islanding detection circuits 6b was described in the first embodiment, the present invention is not limited thereto. The convergence value $\theta\alpha$ can take other values, depending on the operational equation that is set in the operation unit 641b.

For example, in the case where the operational equation that is set in the operation unit 641b is the following equation (4), the convergence value $\theta\alpha$ will be a value such as shown in the following equation (5), where $d_i$ is the number of other islanding detection circuits 6b with which the communication unit 68b communicates, that is, the number of timing phases $\theta_j$ that are input to the communication unit 68b. In other words, the convergence value $\theta\alpha$ is the weighted mean value of the initial values of the timing phases $\theta_i$ of the islanding detection circuits 6b, which are weighted according to the number of communication partners.

$$u_i = \frac{1}{d_i}\sum_j(\theta_j - \theta_i) \tag{4}$$

$$\theta_\alpha = \frac{\sum_{i=1}^{n}d_i\theta_i(0)}{\sum_{i=1}^{n}d_i}. \tag{5}$$

Also, in the case where the operational equation that is set in the operation unit 641b is the following equation (6), the convergence value $\theta\alpha$ will be the geometric mean value of the initial values of the timing phases $\theta_i$ of the islanding detection circuits 6b, as shown in the following equation (7).

$$\mu_i = \theta_i\sum_j(\theta_j - \theta_i) \tag{6}$$

$$\theta_\alpha = \sqrt[n]{\prod_{i=1}^{n}\theta_i(0)} \tag{7}$$

Also, in the case where the operational equation that is set in the operation unit 641b is the following equation (8), the convergence value $\theta\alpha$ will be the harmonic mean value of the initial values of the timing phases $\theta_i$ of the islanding detection circuits 6b, as shown in the following equation (9).

$$u_i = \theta_i^2\sum_j(\theta_i - \theta_j) \tag{8}$$

$$\theta_\alpha = \frac{n}{\sum_{i=1}^{n}\frac{1}{\theta_i(0)}} \tag{9}$$

Also, in the case where the operational equation that is set in the operation unit 641b is the following equation (10), the convergence value $\theta\alpha$ will be the mean value of order P of the initial values of the timing phases $\theta_i$ of the islanding detection circuits 6b, as shown in the following equation (11).

$$u_i = \frac{1}{P\theta_i^{P-1}}\sum_j(\theta_j - \theta_i) \tag{10}$$

$$\theta_\alpha = \sqrt[P]{\sum_{i=1}^{n}\frac{1}{n}\theta_i(0)^P} \tag{11}$$

Figure 17:
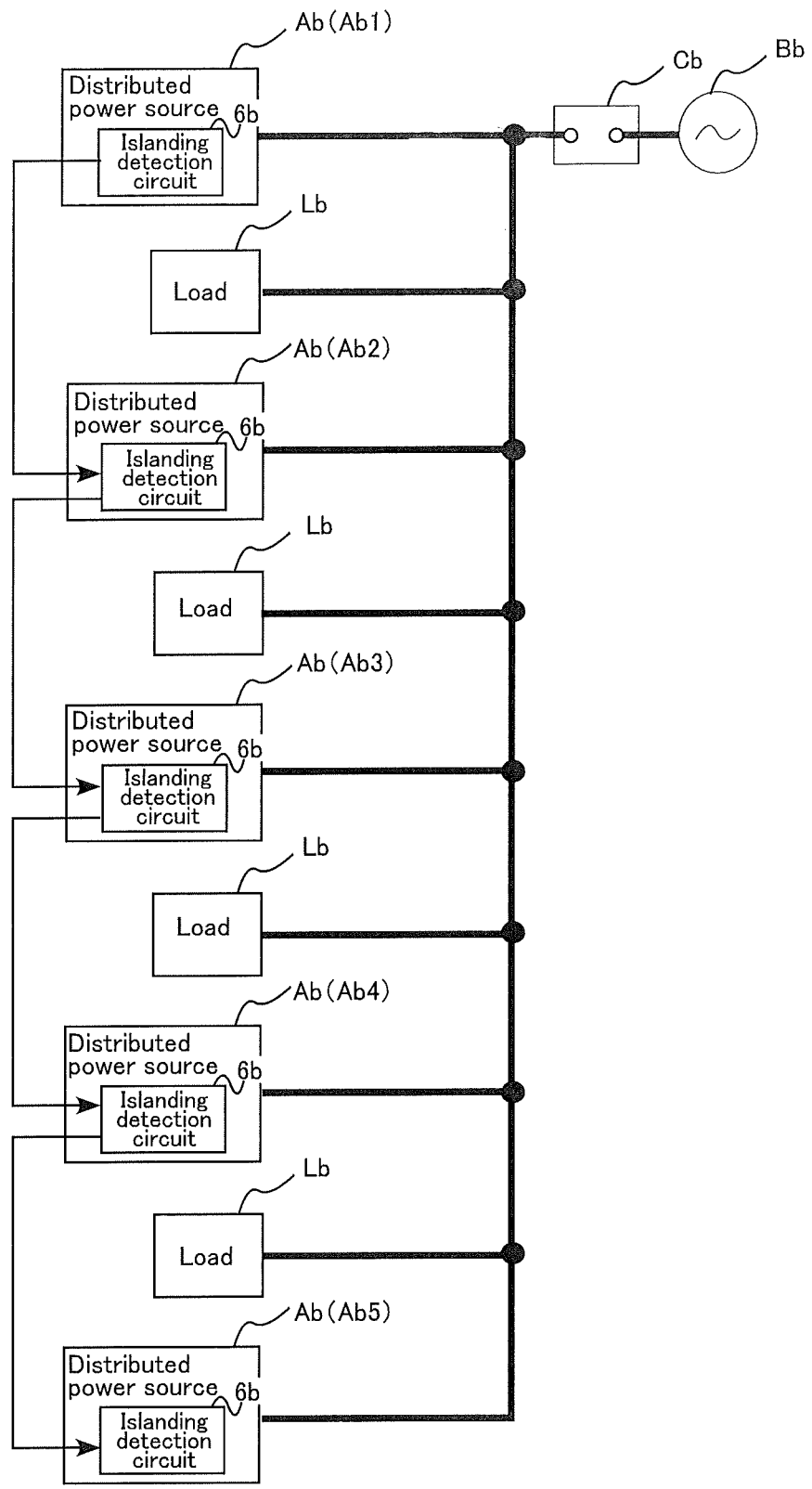
FIG. 17 is a diagram illustrating another communication state of the islanding detection circuits of distributed power sources connected in parallel in an electric power system.

Note that although the case where each islanding detection circuit 6b performs mutual communication was described in the first embodiment, the present invention is not limited thereto, and one-way communication may be performed. For example, as shown in FIG. 17, the islanding detection circuit 6b of the distributed power source Ab1 only transmits to the islanding detection circuit 6b of the distributed power source Ab2. The islanding detection circuit 6b of the distributed power source Ab2 only receives from the islanding detection circuit 6b of the distributed power source Ab1, and only transmits to the islanding detection circuit 6b of the distributed power source Ab3. The islanding detection circuit 6b of the distributed power source Ab3 only receives from the islanding detection circuit 6b of the distributed power source Ab2, and only transmits to the islanding detection circuit 6b of the distributed power source Ab4. The islanding detection circuit 6b of the distributed power source Ab4 only receives from the islanding detection circuit 6b of the distributed power source Ab3, and only transmits to the islanding detection circuit 6b of the distributed power source Ab5. The islanding detection circuit 6b of the distributed power source Ab5 only receives from the islanding detection circuit 6b of the distributed power source Ab4. Even in such a case, the timing phase $\theta_i$ can be synchronized. More generally, a condition for being able to synchronize the timing phase $\theta_i$ is a state in which the islanding detection circuit 6b of an arbitrary distributed power source Ab connected to the electric power system can be reached by following the transmission destinations from the islanding detection circuit 6b of a certain distributed power source Ab connected to the electric power system (a state including the "spanning tree" in graph theory).

In the first embodiment, the case was described where the amount of change in frequency is positively fed back, but the present invention is not limited thereto. A signal restricting the output range of the signal that is output from the pulse generation unit 65b may be output to the target value setting unit 32b as the variation signal Qin, without adding the signal that is output from the gain multiplication unit 63b. Also, voltage, active power, frequency or the like may be varied instead of varying reactive power, and islanding may be determined by the frequency change rate, the change in output voltage, the change in reactive power or the like, instead of determining islanding by the amount of change in frequency. The present invention can be applied to all islanding detection circuits that generate a variation signal for causing a periodic variation.

In the first embodiment, the case was described where the islanding detection circuit 6b is used in a distributed power source Ab provided with an inverter circuit 2b, but the present invention is not limited thereto. The islanding detection circuit 6b according to the present invention can also be used in a distributed power source Ab' by an AC generator that is not provided with an inverter circuit 2b. Hereinafter, the case where the islanding detection circuit 6b according to the present invention is used in the distributed power source Ab' that is realized by an AC generator will be described.

Figure 18:
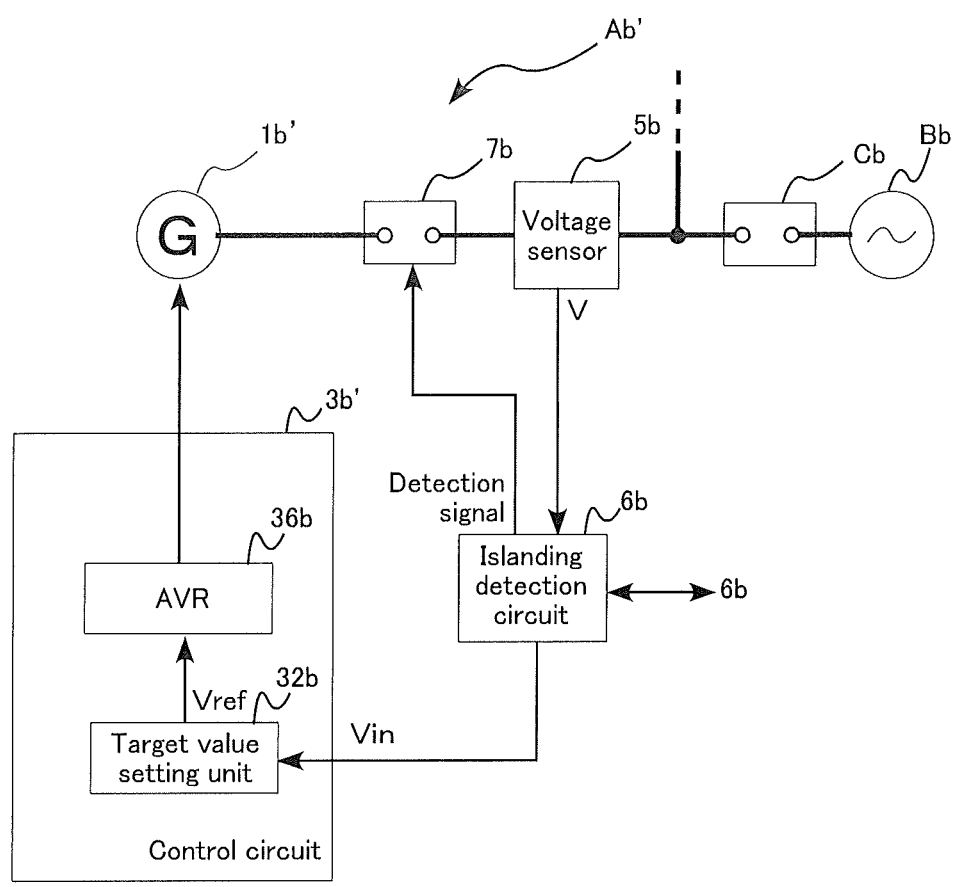
FIG. 18 is a diagram illustrating a distributed power source of an AC generator according to a second embodiment of the third aspect.

FIG. 18 is a diagram illustrating the distributed power source Ab' that is realized by an AC generator according to a second embodiment of the third aspect of the present invention. In the diagram, the same reference signs are given to constituent elements that are the same as or similar to the distributed power source Ab (see FIG. 13) according to the first embodiment of the third aspect.

The distributed power source Ab' shown in FIG. 18 differs from the distributed power source Ab according to the first embodiment in being provided with an AC generator 1b' instead of the DC power source 1b and the inverter circuit 2b, and being provided with a control circuit 3b' instead of the control circuit 3b.

The AC generator 1b' outputs AC power, and is provided with a diesel engine, for example. Note that AC generator 1b' is not limited to a diesel engine generator, and may be a micro gas turbine generator, a wind turbine generator, or the like.

The islanding detection circuit 6b outputs a variation signal Vin for varying the target voltage of the distributed power source Ab' to the target value setting unit 32b, instead of the variation signal Qin. The target value setting unit 32b sets a target value Vref by adding the variation signal Vin to a basic target value $V_0$ (=$V_0$+Vin), and outputs the addition result to an AVR 36b. The AVR 36b is an automatic voltage regulation circuit, and regulates the output voltage of the AC generator 1b' according to the target value Vref.

The timing phase $\theta_i$ can also be synchronized in the second embodiment, if the islanding detection circuit 6b performs mutual communication with at least one other islanding detection circuit 6b, and the electric power system is in the interlinked state.

In the above first and second embodiments, the case was described where a plurality of distributed power sources Ab (Ab') are interconnected to an electric power grid Bb, but the present invention is not limited thereto. The present invention can also be applied in the case of a power plant (e.g., mega solar power plant) or the like that has a large number of inverter devices connected in parallel and generates solar power, for example.

According to the third aspect of the present invention, a timing phase generator generates a timing phase, using an operation result that is based on a generated timing phase and a timing phase of another islanding detection circuit received by a communication unit. As a result of the timing phase generator of each islanding detection circuit performing this processing, the timing phases of all the islanding detection circuits converge to the same value. Each of the islanding detection circuits need only perform mutual communication with at least one islanding detection circuit (located nearby, for example), and it is not necessary for one of the islanding detection circuits or a monitoring device to communicate with all the other islanding detection circuits. Accordingly, the system does not become large-scale. Even in the case where there is a fault with one of the islanding detection circuits, the timing phase can be synchronized if all the other islanding detection circuits can communicate with any of the islanding detection circuits. Also, it is possible to respond flexibly to an increase or decrease in distributed power sources.

<Fourth Aspect>

Conventionally, an inverter device that converts DC power that is generated by a solar cell or the like into AC power and supplies the AC power to an electric power grid has been developed. The inverter device includes an inverter circuit and a control circuit. In solar power plants such as mega solar power plants, large amounts of power are supplied to the electric power grid by connecting a large number of inverter devices in parallel (see Document 7).

AC power obtained through conversion by the inverter circuit includes high frequency noise caused by the switching of switching elements. In order to prevent high frequency noise from being emitted directly to the electric power grid, a noise suppression component such as a noise filter for removing high frequency noise is normally provided on the output side of the inverter circuit.

In contrast, according to the fourth aspect of the present invention, an inverter device that can reduce high frequency noise, without needing a noise suppression component, is provided.

Figure 19:
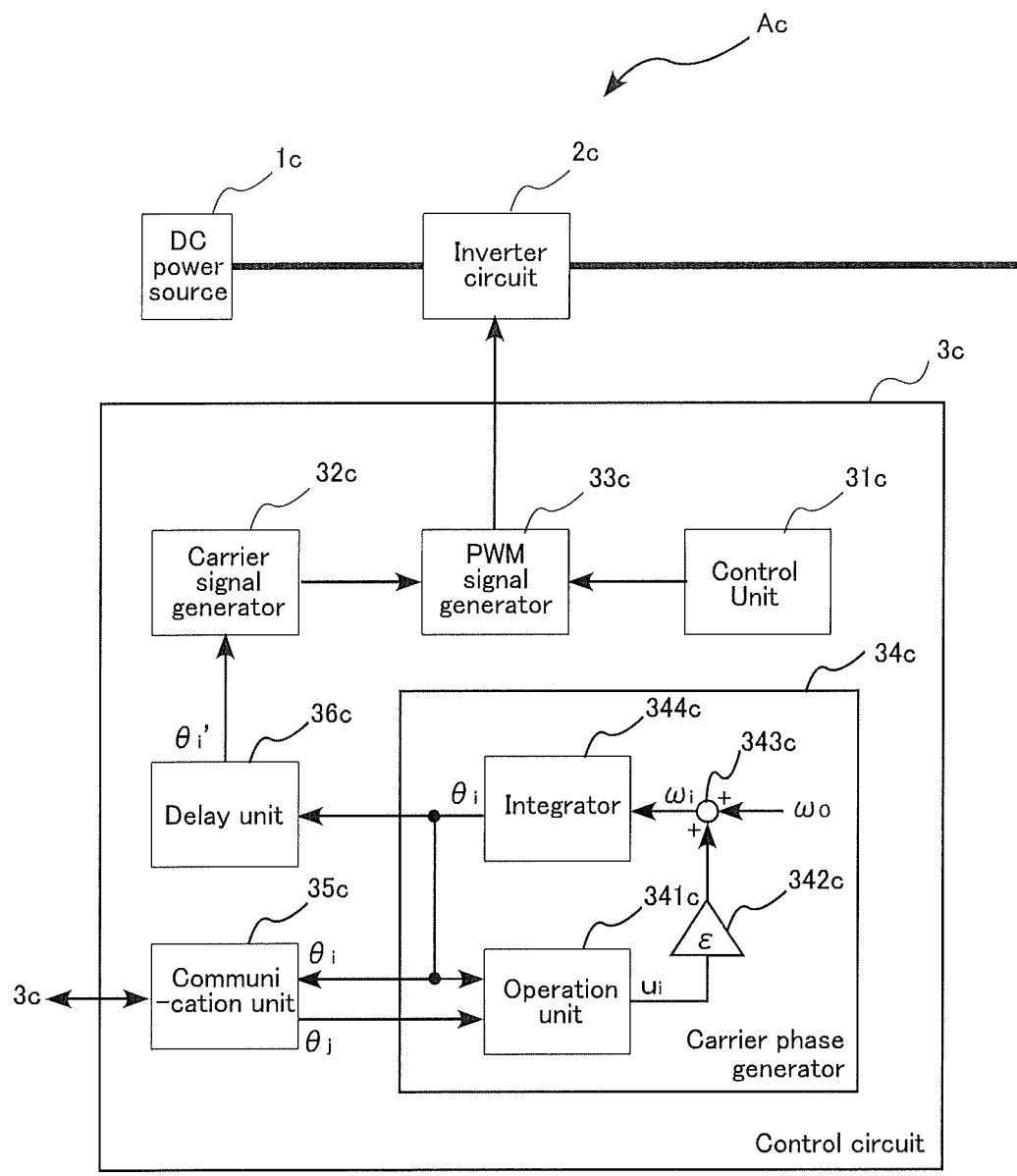
FIG. 19 is a diagram illustrating an inverter device according to a first embodiment in a fourth aspect.
Figure 20:
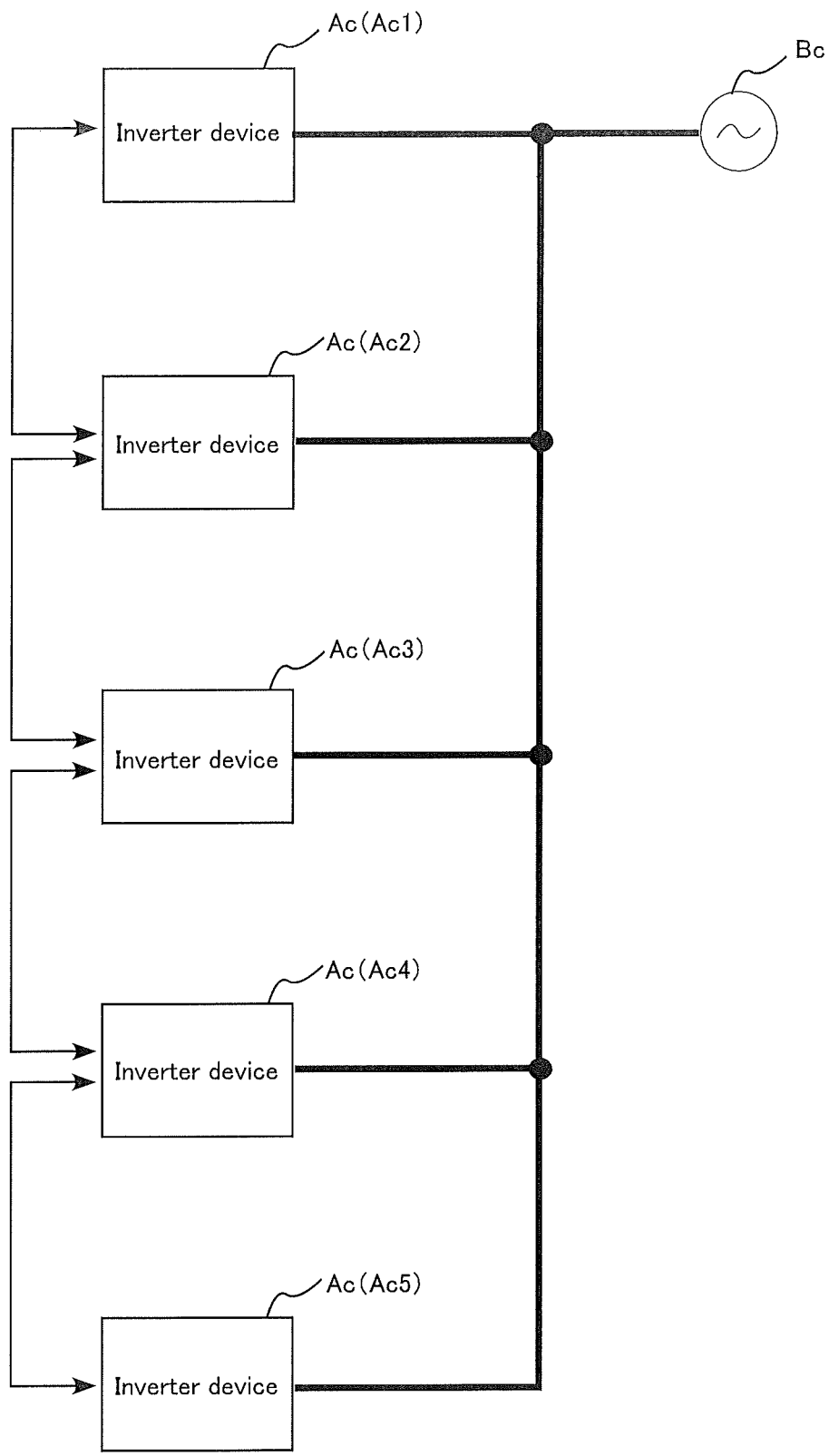
FIG. 20 shows an electric power system in which a plurality of inverter devices are connected in parallel according to the first embodiment in the fourth aspect.

FIG. 19 is a diagram illustrating an inverter device according to a first embodiment in the fourth aspect of the present invention. FIG. 20 shows a solar power plant in which a plurality of inverter devices are connected in parallel according to the first embodiment.

An inverter device Ac is provided with an inverter circuit 2c and a control circuit 3c, as shown in FIG. 19. In the inverter device Ac, DC power that is output by a DC power source 1c is converted into AC power and output by the inverter circuit 2c. Note that, although not shown, a transformer is provided on the output side of the inverter circuit 2c.

The DC power source 1c outputs DC power, and is provided with a solar cell, for example. The DC power source 1c outputs the generated DC power to the inverter circuit 2c. Note that the DC power source 1c may be a fuel cell, a storage battery, an electric double-layer capacitor or a lithium ion battery, instead of a solar cell. Also, the DC power source 1c may include an AC generator (diesel engine generator, micro gas turbine generator, wind turbine generator, etc.). In this case, AC power generated by the AC generator is output after being converted into DC power.

The inverter circuit 2c converts the DC power that is input from the DC power source 1c into AC power and outputs the AC power. The inverter circuit 2c is provided with a PWM control inverter and a filter that are not shown. The PWM control inverter is a three-phase inverter provided with three pairs of six switching elements in total that are not shown, and converts DC power into AC power by switching each switching element ON and OFF based on a PWM signal that is input from the control circuit 3c. The filter removes the high frequency component caused by the switching. Note that the inverter circuit 2c is not limited thereto. For example, the PWM control inverter may be a single-phase inverter or may be a multilevel inverter.

The control circuit 3c controls the inverter circuit 2c, and is realized by a microcomputer and the like, for example. The control circuit 3c generates the PWM signal based on the input voltage, output voltage, output current and the like of the inverter circuit 2c that are detected by various sensors provided in the inverter device Ac, and outputs the generated PWM signal to the inverter circuit 2c. The control circuit 3c is provided with a control unit 31c, a carrier signal generation unit 32c, a PWM signal generation unit 33c, a carrier phase generation unit 34c, a communication unit 35c, and a delay unit 36c.

The control unit 31c is for performing output current control. The control unit 31c generates a compensation value for adjusting the output current of the inverter circuit 2c detected by a sensor to the target value, generates a command signal based on the generated compensation value, and outputs the generated command signal to the PWM signal generation unit 33c. Note that the control unit 31c may also control the input voltage or the output reactive power of the inverter circuit 2c.

The carrier signal generation unit 32c generates a carrier signal. In the present embodiment, a triangular wave signal of a predetermined frequency is used as the carrier signal. The carrier signal generation unit 32c generates the carrier signal according to a carrier phase $\theta_i'$ that is input from the delay unit 36c. Note that the carrier signal is not limited to a triangular wave signal, and may be a sawtooth wave signal or the like, for example.

The PWM signal generation unit 33c generates a PWM signal. The PWM signal generation unit 33c generates the PWM signal using the triangular wave comparison method, based on the command signal that is input from the control unit 31c and the carrier signal that is input from the carrier signal generation unit 32c. For example, a pulse signal that is high if the command signal is greater than the carrier signal and low if the command signal is less than or equal to the carrier signal is generated as the PWM signal. The generated PWM signal is output to the inverter circuit 2c.

Figure 21:
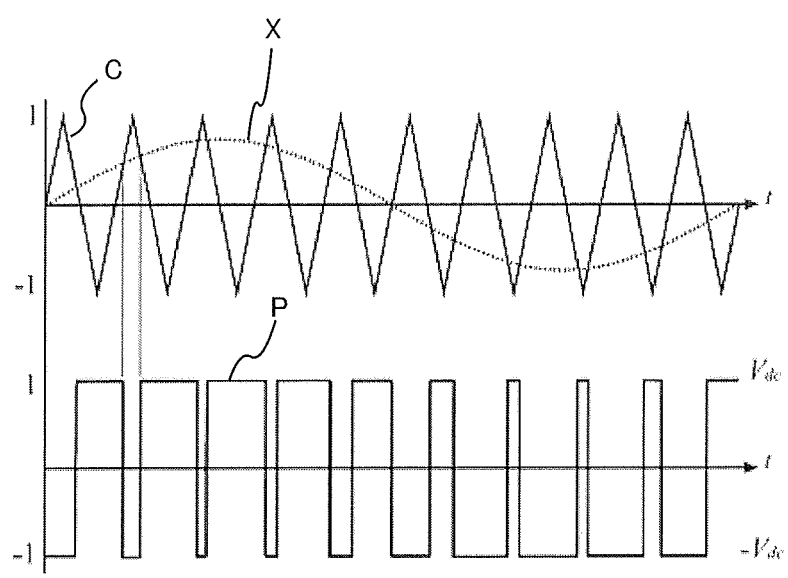
FIG. 21 is a diagram illustrating a method for generating a PWM signal from a command signal and a carrier signal.

FIG. 21 is a diagram illustrating a method for generating a PWM signal from a command signal and a carrier signal. In the diagram, a command value signal is shown with a waveform X, a carrier signal is shown with a waveform C, and a PWM signal is shown with a waveform P. In the diagram, the waveform P is high during periods in which the waveform X is greater than or equal to the waveform C, and the waveform P is low during periods in which the waveform X is less than the waveform C.

The carrier phase generation unit 34c generates a carrier phase $\theta_i$, which is the phase of the carrier signal generated by the carrier signal generation unit 32c. The carrier phase generation unit 34c outputs the generated carrier phase $\theta_i$ to the communication unit 35c and the delay unit 36c. The carrier phase generation unit 34c will be discussed in detail later.

The communication unit 35c communicates with the control circuit 3c of other inverter devices Ac. The communication unit 35c receives input of the carrier phase $\theta_i$ generated by the carrier phase generation unit 34c, and transmits the input carrier phase $\theta_i$ to the communication unit 35c of another inverter device Ac. Also, the communication unit 35c outputs a carrier phase $\theta_j$ received from the communication unit 35c of another inverter device Ac to the carrier phase generation unit 34c. Note that the communication method is not limited, and may be wired communication or may be wireless communication.

As shown in FIG. 20, the inverter device Ac is connected in parallel with other inverter devices Ac in the electric power system. In FIG. 20, a state in which five inverter devices Ac (Ac1 to Ac5) are connected is shown. Note that more inverter devices Ac are connected in an actual electric power system.

The arrows shown in FIG. 20 indicate communication. The inverter device Ac1 communicates with only the inverter device Ac2, and the inverter device Ac2 communicates with only the inverter device Ac1 and the inverter device Ac3. Also, the inverter device Ac3 communicates with only the inverter device Ac2 and the inverter device Ac4, the inverter device Ac4 communicates with only the inverter device Ac3 and the inverter device Ac5, and the inverter device Ac5 communicates with only the inverter device Ac4. Thus, the communication unit 35c of an inverter device Ac need only communicate with the communication unit 35c of at least one inverter device Ac among the inverter devices Ac connected to the electric power system, and be in a state where a communication path exists between two arbitrary inverter devices Ac connected to the electric power system ("interlinked state"), and does not need to communicate with the communication units 35c of all the inverter devices Ac connected to the electric power system.

For example, in the case of the inverter device Ac2, the communication unit 35c transmits a carrier phase $\theta_2$ generated by the carrier phase generation unit 34c to the communication units 35c of the inverter devices Ac1 and Ac3, receives a carrier phase $\theta_1$ from the communication unit 35c of the inverter device Ac1, and receives a carrier phase $\theta_3$ from the communication unit 35c of the inverter device Ac3.

The delay unit 36c delays the carrier phase $\theta_i$ that is input from the carrier phase generation unit 34c by a predetermined value, and outputs the delayed carrier phase $\theta_i$ to the carrier signal generation unit 32c as the carrier phase $\theta_i'$. In the present embodiment, the carrier phase $\theta_i$ synchronized with the other inverter devices Ac is used after being shifted slightly for each inverter device Ac, in order to prevent the carrier phase from overlapping with the other inverter devices Ac. As will be discussed later, the carrier phase $\theta_i$ that is generated by the carrier phase generation unit 34c is synchronized with the carrier phases $\theta_j$ of other inverter devices Ac and converges to the same phase. The carrier signal generation unit 32c uses the carrier phase $\theta_i'$ obtained by the delay unit 36c delaying the carrier phase $\theta_i$. The amount by which the phase is delayed is differentiated for each inverter device Ac and set in advance. For example, in order to distribute the phases uniformly in the case where five inverter devices Ac are connected in parallel, as shown in FIG. 20, the phase is delayed so as to shift $(2/5)\pi$ for each inverter device Ac. For example, in the case where the angular frequency of the carrier phase $\theta_i$ is $2000\pi$ rad/s (frequency=1 kHz, cycle=1 ms), and the carrier phase $\theta_1$ of the inverter device Ac1 is used as a basis, the carrier phase $\theta_1$ of the inverter device Ac1 is not delayed, the carrier phase $\theta_2$ of the inverter device Act is delayed 0.2 ms, the carrier phase $\theta_3$ of the inverter device Ac3 is delayed 0.4 ms, the carrier phase $\theta_4$ of the inverter device Ac4 is delayed 0.6 ms, and the carrier phase $\theta_5$ of the inverter device Ac5 is delayed 0.8 ms. Note that the amount by which the phase is delayed need not differ for all the inverter devices Ac. For example, in the case where 100 inverter devices Ac are connected in parallel, the amount of delay for each plurality of inverter devices Ac may be changed, such that the carrier phases of the 1-10th inverter devices Ac are not delayed, the carrier phases of the 11-20th inverter devices Ac are delayed $(1/5)\pi$, and the carrier phase of the 21-30th inverter devices Ac are delayed $(2/5)\pi$.

Next, the carrier phase generation unit 34c of each inverter device Ac will be described in detail.

The carrier phase generation unit 34c generates the carrier phase $\theta_i$, using a generated carrier phase $\theta_i$ and a carrier phase $\theta_j$ of another inverter device Ac that is input from the communication unit 35c. Even if the carrier phase $\theta_i$ differs from the carrier phase $\theta_j$, the carrier phase $\theta_i$ and the carrier phase $\theta_j$ converge to a common carrier phase as a result of the operational processing by the carrier phase generation unit 34c being repeated. The equations used at the time of this processing are the same as equations (1) to (11) used in the first aspect, as will be understood from the following description.

As shown in FIG. 19, the carrier phase generation unit 34c is provided with an operation unit 341c, a multiplier 342c, an adder 343c, and an integrator 344c.

The operation unit 341c performs an operation based on the following equation (1). That is, the operation unit 341c subtracts the carrier phase $\theta_i$ generated by the carrier phase generation unit 34c from each carrier phase $\theta_j$ that is input from the communication unit 35c, and outputs an operation result $u_i$ obtained by adding together all the subtraction results to the multiplier 342c.

$$u_i = \sum_j (\theta_j - \theta_i) \quad (1)$$

For example, in the case of the inverter device Ac2 (see FIG. 20), the operation unit 341c performs the operation of the following equation (2), and outputs an operation result $u_2$.

$$u_2 = \sum_{j=1,3} (\theta_j - \theta_2) \quad (2)$$
$$= (\theta_1 - \theta_2) + (\theta_3 - \theta_2)$$
$$= \theta_1 + \theta_3 - 2\theta_2$$

The multiplier 342c multiplies the operation result $u_i$ that is input from the operation unit 341c by a predetermined coefficient $\varepsilon$, and outputs the multiplication result to the adder 343c. The coefficient $\varepsilon$ is a value that satisfies $0<\varepsilon<1/d_{max}$, and is set in advance. When the number of other inverter devices Ac that the communication unit 35c communicates with is given as $d_i$, $d_{max}$ is the maximum number of $d_i$ among all the inverter devices Ac connected to the electric power system. In other words, $d_{max}$ is the number of carrier phases $\theta_j$ that are input to the communication unit 35c of the inverter device Ac that communicates with the largest number of other inverter devices Ac, among the inverter devices Ac connected to the electric power system. Note that the operation result $u_i$ is multiplied by the coefficient $\varepsilon$ in order to prevent too large a variation in the carrier phase $\theta_i$ due to the corrected angular frequency $\omega_i$ becoming too large (or too small). Accordingly, in the case where processing by the carrier phase generation unit 34c is continuous time processing, the multiplier 342c need not be provided.

The adder 343c adds the input from the multiplier 342c to a predetermined angular frequency $\omega_0$, and outputs the addition result to the integrator 344c as the corrected angular frequency $\omega_i$. The angular frequency $\omega_0$ corresponds to the frequency of the carrier signal. The integrator 344c generates the carrier phase $\theta_i$ by integrating the corrected angular frequency co, that is input from the adder 343c, and outputs the generated carrier phase $\theta_i$. The integrator 344c generates the carrier phase $\theta_i$ by adding the corrected angular frequency $\omega_i$ to the carrier phase $\theta_i$ generated last time. Also, the integrator 344c outputs the carrier phase $\theta_i$ as a value in the range $(-\pi<\theta_i\leq\pi)$. Note that the setting of the range of the carrier phase $\theta_i$ is not limited thereto, and the range may be set as $(0\leq\theta_i<2\pi)$, for example. The carrier phase $\theta_i$ is output to the delay unit 36c, the communication unit 35c, and the operation unit 341c.

In the present embodiment, the control circuit 3c was described as being realized as a digital circuit, but may be realized as an analog circuit. Also, the processing that is performed by each unit may be designed by a program, and a computer may be operated as the control circuit 3c by causing the computer to execute the program. Also, the program may be recorded on a recording medium, and the computer may be operated to read the program.

In the present embodiment, the carrier phase generation unit 34c generates the carrier phase $\theta_i$, using a generated carrier phase $\theta_i$ and a carrier phase $\theta_j$ of another inverter device Ac that is input from the communication unit 35c. In the case where the carrier phase $\theta$, is larger than the arithmetic mean value of the carrier phases $\theta_j$, the operation result $u_i$ that is output by the operation unit 341c will be a negative value. This results in the corrected angular frequency $\omega_i$ being smaller than the predetermined angular frequency $\omega_0$, and the amount of change in the carrier phase $\theta_i$ decreasing. On the other hand, in the case where the carrier phase $\theta_i$ is smaller than the arithmetic mean value of the carrier phases $\theta_j$, the operation result $u_i$ that is output by the operation unit 341c will be a positive value. This results in the corrected angular frequency $\omega_i$ being larger than the predetermined angular frequency $\omega_0$, and the amount of change in the carrier phase $\theta_i$ increasing. In other words, the carrier phase $\theta_i$ approaches the arithmetic mean value of the carrier phases $\theta_j$. As a result of this processing being performed by each of the inverter devices Ac, the carrier phase $\theta_i$ of each inverter device Ac converges to the same value. The carrier phase $\theta_i$ changes over time, and can be thought of as combining a component that changes according to the angular frequency $\omega_0$ and a component that changes so as to compensate for shift in the initial phase. As a result of the latter component converging to the same value $\theta\alpha$, the carrier phase $\theta_i$ of each inverter device Ac also converges to the same value (see Documents 2 and 3). It has also been demonstrated that the convergence value θα is the arithmetic mean value of the initial values of carrier phases $\theta_i$ of the inverter devices Ac, as shown in the following equation (3), where n is the number of inverter devices Ac connected to the electric power system, and the following equation (3) shows the arithmetic mean value being calculated by adding together all the initial values of the carrier phases $\theta_1$ to $\theta_n$ of the inverter devices Ac1 to An and dividing the result by n.

$$\theta_\alpha = \frac{1}{n}\sum_{i=1}^{n}\theta_i(0) \tag{3}$$

The convergence of the carrier phase $\theta_i$ in the electric power system shown in FIG. 20 can be shown by simulation, similarly to the case of the sampling phase previously described with reference to FIGS. 4A and 4B. Note that because the carrier phases $\theta_1$ to $\theta_5$ need only be respectively read for the sampling phases $\theta_1$ to $\theta_5$, a detailed description relating to the simulation will be omitted.

According to the present embodiment, the carrier phase $\theta_i$ that is generated by the carrier phase generation unit 34c is synchronized with the carrier phases $\theta_j$ of other inverter devices Ac, and the delay unit 36c outputs the carrier phase $\theta_i'$ obtained by delaying the carrier phase $\theta_i$ by a predetermined value. The carrier signal generation unit 32c generates a carrier signal according to the carrier phase $\theta_i'$. The PWM signal generation unit 33c generates the PWM signal based on the carrier signal generated by the carrier signal generation unit 32c. Because the inverter circuit 2c performs switching based on the PWM signal, the phase of the high frequency noise that is included in the output of the inverter circuit 2c matches the carrier phase. Because the carrier signal is based on the carrier phase $\theta_i'$, the phase of the high frequency noise will be shifted from the phase of the high frequency noise that is included in the output of other inverter circuits 2c. Accordingly, the high frequency noise is reduced by cancelling each other out. Also, because the amounts of delay of the carrier phase $\theta_i$ are slightly differentiated for each of the inverter devices Ac that are connected in parallel, the phases of the high frequency noise that is included in the output of the inverter circuits 2c differ slightly, and are uniformly distributed. The high frequency noise is thereby reduced by cancelling each other out.

Also, according to the present embodiment, the carrier phases $\theta_i$ of all the inverter devices Ac converge to the same value, as a result of each of the inverter devices Ac that are connected in parallel performing mutual communication with at least one inverter device Ac (located nearby, for example), and the electric power system being in the interlinked state. Accordingly, it is not necessary to adopt a configuration in which one of the inverter devices Ac or a monitoring device communicates with all the other inverter devices Ac, and the system does not become large-scale. Also, even in the case where there is a fault with one of the inverter devices Ac or where one of the inverter devices Ac is removed, the carrier phase $\theta_i$ can be synchronized if all the other inverter devices Ac can communicate with any of the inverter devices Ac, and the electric power system is in the interlinked state. Also, in the case where an inverter device Ac is added, that inverter device Ac need only be able to communicate with at least one inverter device Ac. Accordingly, it is possible to respond flexibly to an increase or decrease in inverter devices Ac.

Note that although the case where a component that changes so as to compensate for shift in the initial phase of the carrier phase $\theta_i$ of the inverter device Ac is converged to the arithmetic mean value of the initial values of the carrier phases $\theta_i$ of the inverter devices Ac was described in the present embodiment, the present invention is not limited thereto. The convergence value θα can take other values, depending on the operational equation that is set in the operation unit 341c.

For example, in the case where the operational equation that is set in the operation unit 341c is the following equation (4), the convergence value θα will be a value such as shown in the following equation (5), where $d_i$ is the number of other inverter devices Ac with which the communication unit 35c communicates, that is, the number of carrier phases $\theta_j$ that are input to the communication unit 35c. In other words, the convergence value θα is the weighted mean value of the initial values of the carrier phases $\theta_i$ of the inverter devices Ac, which are weighted according to the number of communication partners.

$$u_i = \frac{1}{d_i}\sum_{j}(\theta_j - \theta_i) \tag{4}$$

$$\theta_\alpha = \frac{\sum_{i=1}^{n}d_i\theta_i(0)}{\sum_{i=1}^{n}d_i} \tag{5}$$

Also, in the case where the operational equation that is set in the operation unit 341c is the following equation (6), the convergence value θα will be the geometric mean value of the initial values of the carrier phases $\theta_i$ of the inverter devices Ac, as shown in the following equation (7).

$$u_i = \theta_i\sum_{j}(\theta_j - \theta_i) \tag{6}$$

$$\theta_\alpha = \sqrt[n]{\prod_{i=1}^{n}\theta_i(0)} \tag{7}$$

Also, in the case where the operational equation that is set in the operation unit 341c is the following equation (8), the convergence value θα will be the harmonic mean value of the initial values of the carrier phases $\theta_i$ of the inverter devices Ac, as shown in the following equation (9).

$$u_i = \theta_i^2\sum_{j}(\theta_i - \theta_j) \tag{8}$$

$$\theta_\alpha = \frac{n}{\sum_{i=1}^{n}\frac{1}{\theta_i(0)}} \tag{9}$$

Also, in the case where the operational equation that is set in the operation unit 341c is the following equation (10), the convergence value θα will be the mean value of order P of the initial values of the carrier phases $\theta_i$ of the inverter devices Ac, as shown in the following equation 11)

$$u_i = \frac{1}{P\theta_i^{P-1}} \sum_j (\theta_j - \theta_i) \qquad (10)$$

$$\theta_\alpha = \sqrt[P]{\sum_{i=1}^n \frac{1}{n} \theta_i(0)^P} \qquad (11)$$

Figure 22:
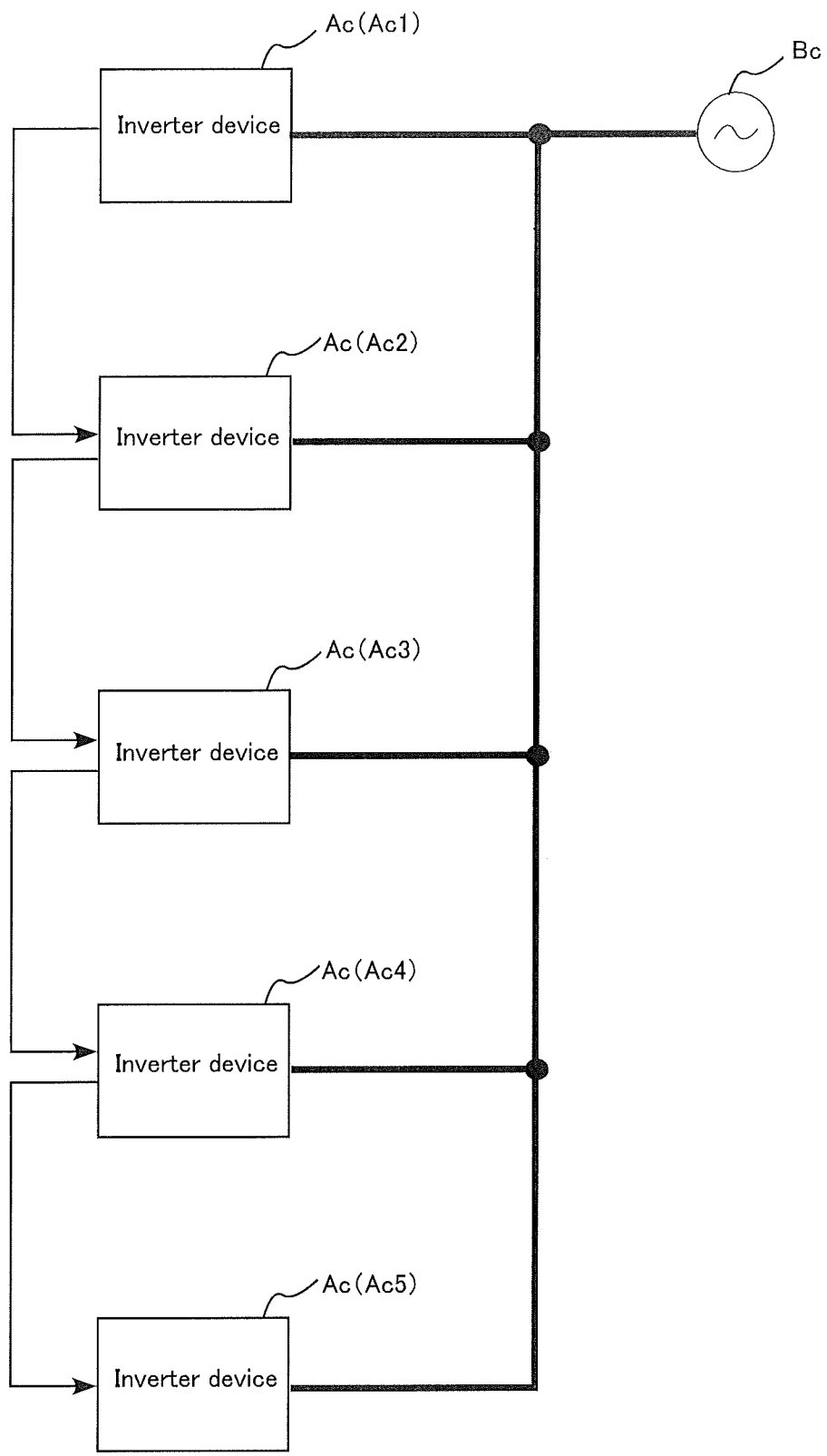
FIG. 22 is a diagram illustrating another communication state of inverter devices connected in parallel.

Note that although the case where each inverter device Ac performs mutual communication was described in the first embodiment, the present invention is not limited thereto, and one-way communication may be performed. For example, as shown in FIG. 22, the inverter device Ac1 only transmits to the inverter device Ac2. The inverter device Ac2 only receives from the inverter device Ac1, and only transmits to the inverter device Ac3. The inverter device Ac3 only receives from the inverter device Ac2, and only transmits to the inverter device Ac4. The inverter device Ac4 only receives from the inverter device Ac3, and only transmits to the inverter device Ac5. The inverter device Ac5 only receives from the inverter device Ac4. Even in such a case, the carrier phase $\theta_i$ can be synchronized. More generally, a condition for being able to synchronize the carrier phase $\theta_i$ is a state in which an arbitrary inverter device Ac connected to the electric power system can be reached by following the transmission destinations from a certain inverter device Ac connected to the electric power system (a state including the "spanning tree" in graph theory).

Although the case where the carrier phase $\theta_i$ is synchronized as a result of the inverter device Ac communicating with only another nearby inverter device Ac was described in the first embodiment, the method for synchronizing the carrier phase $\theta_i$ is not limited thereto, and the carrier phase $\theta_i$ may be synchronized with other methods. The case where a monitoring device for centralized monitoring of each inverter device has a function of synchronizing the carrier phase $\theta_i$ will be described below.

Figure 23:
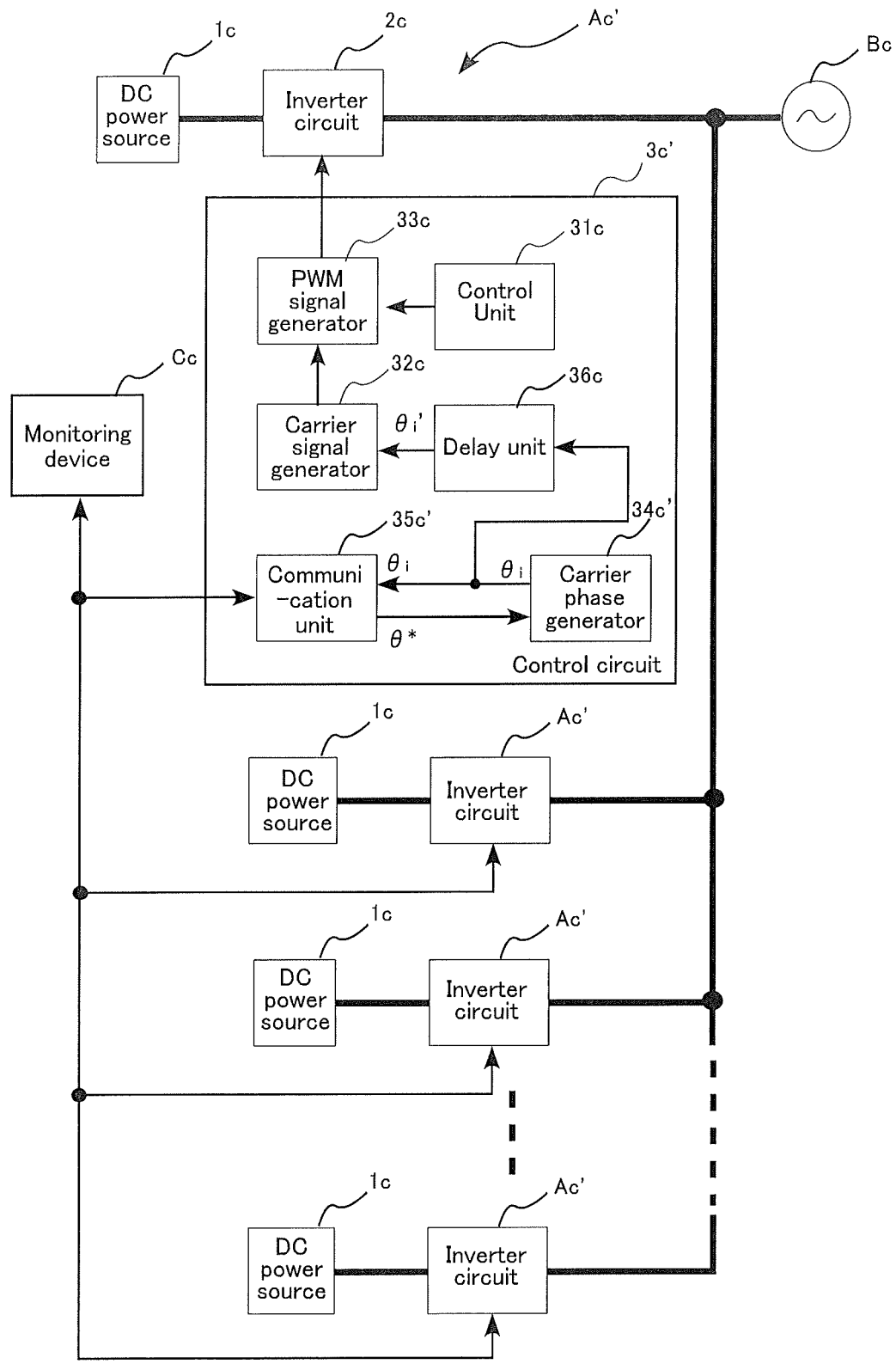
FIG. 23 is a diagram illustrating inverter devices according to a second embodiment in the fourth aspect.

FIG. 23 is a diagram illustrating an inverter device according to a second embodiment in the fourth aspect of the present invention. In the diagram, the same reference signs are given to constituent elements that are the same as or similar to the inverter device Ac (see FIG. 19) according to the first embodiment.

An inverter device Ac' shown in FIG. 23 differs from the inverter device Ac according to the first embodiment in that a monitoring device Cc synchronizes the carrier phase $\theta_i$.

A communication unit 35c' transmits the carrier phase $\theta_i$ generated by a carrier phase generation unit 34c' to the monitoring device Cc. The monitoring device Cc calculates the arithmetic mean value, for example, of the received carrier phases $\theta_i$ of the inverter devices Ac', and transmits the calculated arithmetic mean value to each inverter device Ac' as a target carrier phase $\theta^*$. The communication unit 35c' outputs the target carrier phase $\theta^*$ received from the monitoring device Cc to the carrier phase generation unit 34c'. The carrier phase generation unit 34c' performs control such that the carrier phase $\theta_i$ is adjusted to the target carrier phase $\theta^*$.

Note that a configuration may be adopted in which one of the inverter devices Ac' serves as the master instead of the monitoring device Cc, and outputs the target carrier phase $\theta^*$ to the other inverter devices Ac' (slaves).

The carrier phase $\theta_i$ can also be synchronized in the second embodiment. Accordingly, in the second embodiment, similarly to the first embodiment, high frequency noise is canceled out and the effect of reducing high frequency noise can be achieved.

In the above first and second embodiments, the case was described where the present invention is applied to inverter devices Ac (Ac') that are connected in parallel in a solar power plant, but the present invention is not limited thereto. For example, the present invention can also be applied to inverter devices Ac (Ac') that are interconnected to an electric power grid B.

According to the fourth aspect of the present invention, the carrier phase synchronized with the other inverter devices is delayed by a predetermined value, and the PWM signal is generated based on a carrier signal that depends on the delayed carrier phase. Because the inverter circuit performs switching based on the PWM signal, the phase of the high frequency noise that is included in the output of the inverter circuit matches the carrier phase. Because the carrier phase is delayed after being synchronized, the phase of the high frequency noise will be shifted from the phase of the high frequency noise that is included in the output of the other inverter circuits. Accordingly, the high frequency noise is reduced by cancelling each other out.

<Fifth Aspect>

Figure 30:
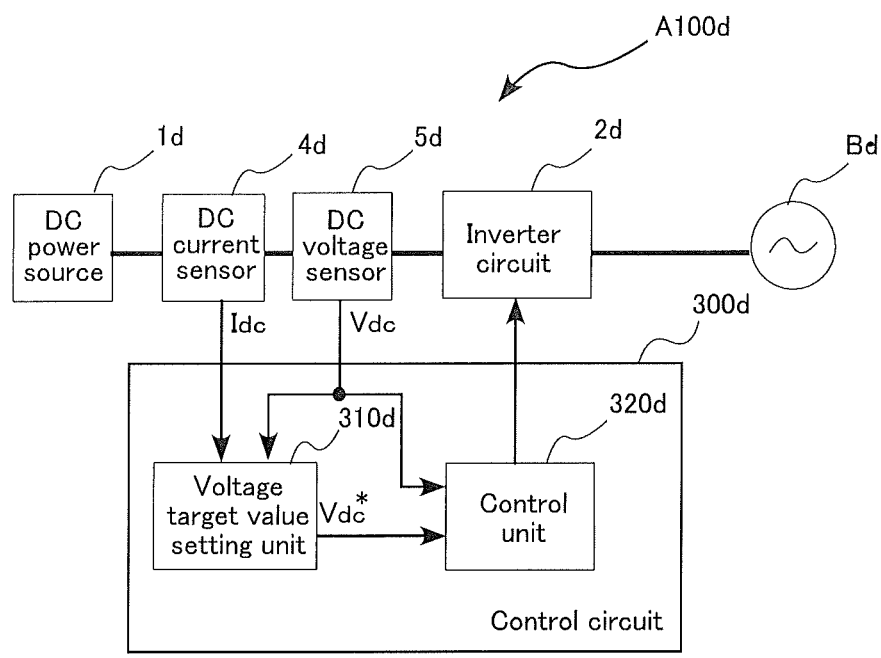
FIG. 30 is a diagram illustrating a conventional distributed power source.

Conventionally, distributed power sources that convert DC power generated by a solar cell or the like into AC power and supply the AC power to an electric power grid have been developed. FIG. 30 is a block diagram for illustrating a typical conventional distributed power source. A distributed power source Ad100d converts DC power generated by a DC power source 1d provided with a solar cell into AC power, and supplies the AC power to an electric power grid Bd. An inverter circuit 2d converts the DC voltage that is input from the DC power source 1d to AC voltage, by switching a switching element based on a PWM signal that is input from a control circuit 300d. The control circuit 300d generates and outputs a PWM signal for controlling the inverter circuit 2d. The control circuit 300d performs control such that the DC voltage that is input from the DC power source 1d to the inverter circuit 2d is adjusted to a predetermined voltage. That is, a control unit 320d performs feedback control, such that a DC voltage Vdc detected by a DC voltage sensor 5d matches a voltage target value Vdc*.

Figure 31A:
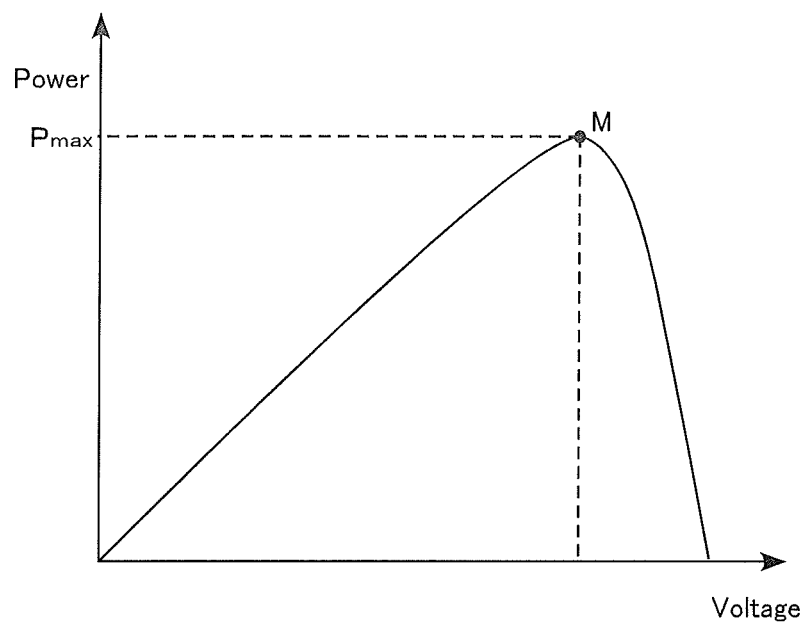
FIGS. 31A and 31B show the voltage-power characteristics of a solar cell.

A voltage target value setting unit 310d sets the voltage target value Vdc*. Generally, maximum power point tracking (MPPT) control is performed, in order to increase the output power of the solar cell as much as possible. Maximum power point tracking control detects the output power of a solar cell by changing the output voltage, for example, of the solar cell, and searches for a maximum power point where the output power is maximized. The voltage-power characteristics of a solar cell will be like the curve shown in FIG. 31A. That is, the voltage-power relationship is characterized in that power is at a maximum power Pmax when at a predetermined voltage, and decreases when moving away from the voltage at this time. A so-called hill climbing method that utilizes this characteristic is used in maximum power point tracking control. That is, if output power increases when the output voltage is increased, the output voltage continues to be increased, and if output power decreases when the output voltage is increased, the output voltage is reduced, having exceeded a maximum power point M. If output power increases when the output voltage is reduced, the output voltage continues to be reduced, and if output power decreases when the output voltage is reduced, the output voltage is increased, having exceeded the maximum power point M. Through repeating this processing, the operating point is positioned near the maximum power point M, and output power is maintained at the maximum state as much as possible. A voltage target value setting unit 310d changes the voltage target value Vdc*, and calculates the output power of the DC power source 1d from a direct current Idc detected by the DC current sensor 4d and the DC voltage Vdc detected by the DC voltage sensor 5d. The voltage target value Vdc* is then adjusted using the hill climbing method, such that the output power is maintained at the maximum state as much as possible.

Also, countermeasure methods to the problem (so-called "two hill problem") that occurs in the case where shadows move across the solar cell when applying the hill climbing method and the like have also been developed (see Document 8).

The output power of the DC power source 1d changes as a result of the voltage target value setting unit 310d changing the voltage target value Vdc*, and the output power of the distributed power source Ad100d also changes. Although this change in output power is slight, the electric power grid Bd may be affected in the case where a large number of distributed power sources Ad that are interconnected to the electric power grid Bd change output power at the same time. For example, in the case where 100 distributed power sources Ad increase output power by 10 kW each at the same time, power instantly increases by 1 MW across the entire electric power grid Bd. The rapid change in supplied power causes problems such as flicker and power swings.

Figure 31B:
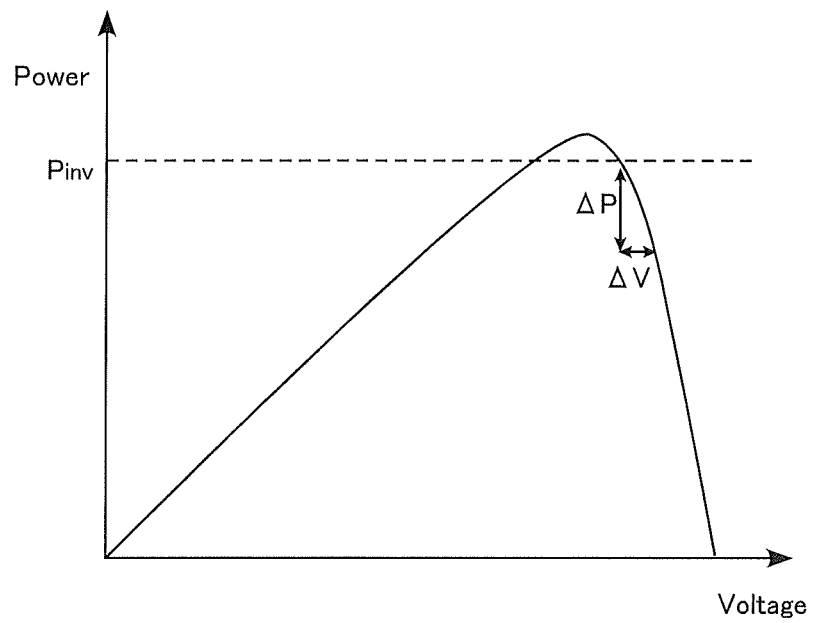

Also, recently, system configurations that increase the capacity of the DC power source 1d (solar cell panel) above the capacity of the inverter circuit 2d have sometimes been employed. In this case, because the power that exceeds the capacity of the inverter circuit 2d cannot be output, output suppressed operation needs to be performed in maximum power point tracking control. FIG. 31B is a diagram for illustrating output suppressed operation, with the curve showing the voltage-power characteristics of the DC power source 1d, and the dashed line showing a capacity Pinv of the inverter circuit 2d. In FIG. 31B, the curve showing the voltage-power characteristics overlaps with the dashed line showing the capacity Pinv of the inverter circuit 2d. In this case, output suppressed operation in which the operating point varies in the area below the dashed line but is unable to move into the area above the dashed line is performed. In the area below the dashed line, the change in power ΔP relative to the change in voltage ΔV increases. Accordingly, the change in the output power of the distributed power source Ad100d relative to the change in the voltage target value Vdc* also increases, and the above problem becomes marked.

In contrast, according to the fifth aspect of the present invention, in an electric power system in which a plurality of inverter device are connected in parallel, inverter devices that are able to reduce the influence exerted on the electric power system by the change in the output power of each inverter device due to maximum power point tracking control are provided.

Figure 24:
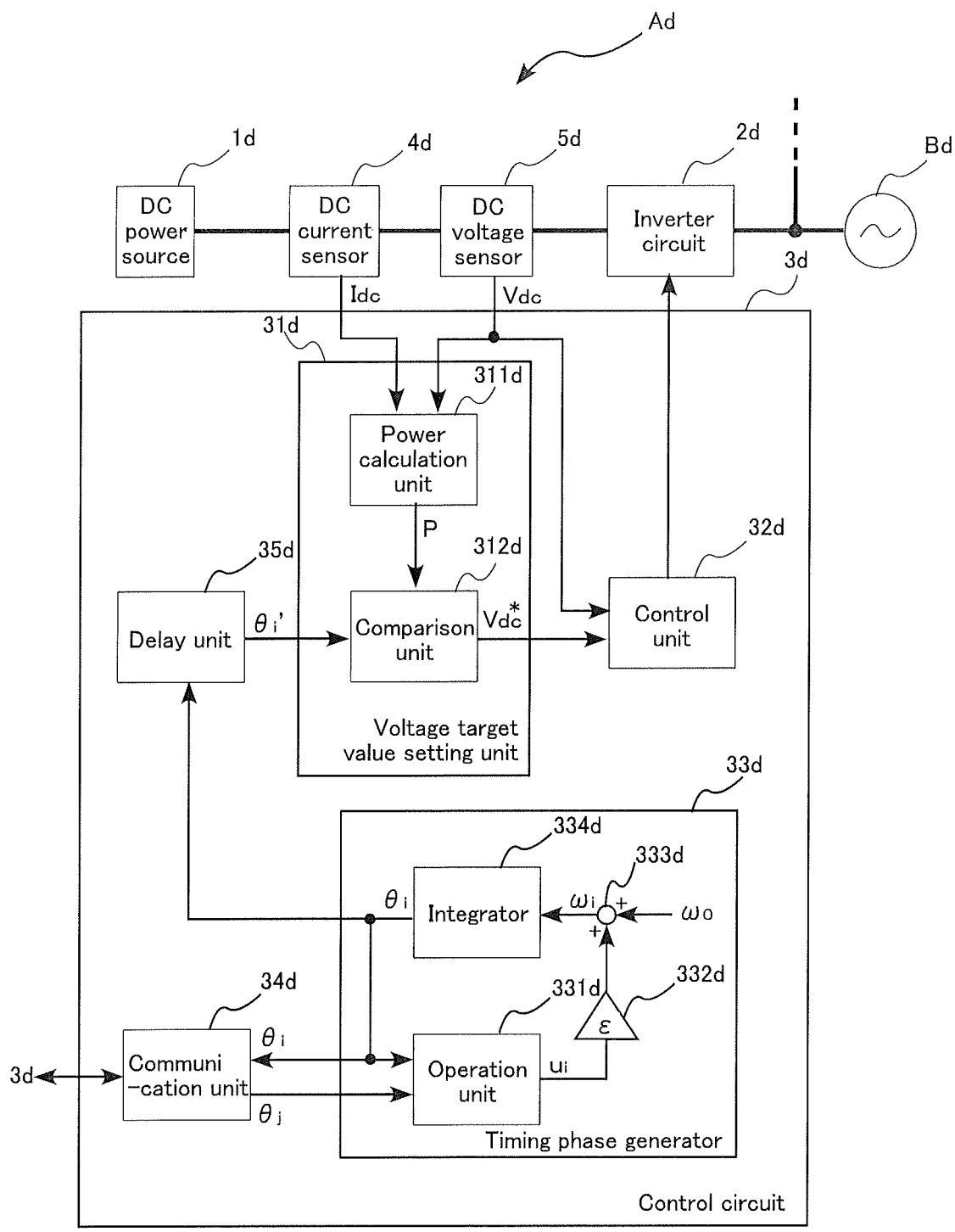
FIG. 24 is a diagram illustrating a distributed power source according to a first embodiment of a fifth aspect.
Figure 25:
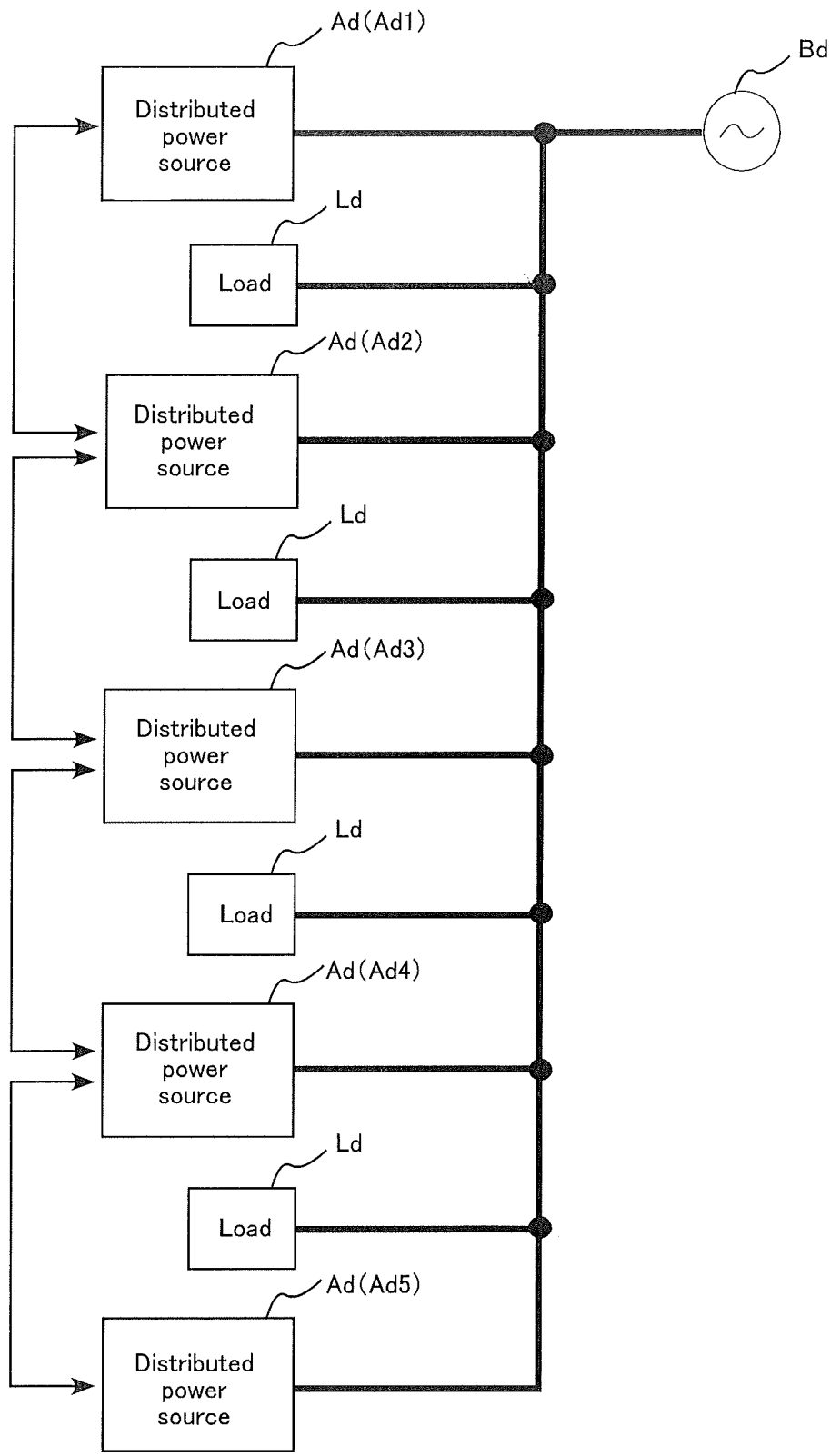
FIG. 25 shows an electric power system in which a plurality of distributed power sources are connected in parallel according to the first embodiment of the fifth aspect.

FIG. 24 is a diagram illustrating a distributed power source according to a first embodiment of the fifth aspect of the present invention. FIG. 25 shows an electric power system in which a plurality of distributed power sources are connected in parallel according to the first embodiment of the fifth aspect.

As shown in FIG. 24, a distributed power source Ad is provided with a DC power source 1d, an inverter circuit 2d, a control circuit 3d, a DC current sensor 4d, and a DC voltage sensor 5d. In the distributed power source Ad, DC power that is output by the DC power source 1d is converted into AC power by the inverter circuit 2d, and the AC power is output to a load or the electric power grid Bd. Note that, although not shown, a transformer is provided on the output side of the inverter circuit 2d. In the present embodiment, the inverter circuit 2d, the control circuit 3d, the DC current sensor 4d and the DC voltage sensor 5d are packaged as an inverter device (so-called power conditioner).

The DC power source 1d outputs DC power, and is provided with a solar cell. The solar cell generates DC power by converting solar energy into electrical energy. The DC power source 1d outputs the generated DC power to the inverter circuit 2d.

The inverter circuit 2d converts the DC power that is input from the DC power source 1d into AC power, and outputs the AC power. The inverter circuit 2d is provided with a PWM control inverter and a filter that are not shown. The PWM control inverter is a three-phase inverter provided with three pairs of six switching elements in total that are not shown, and converts DC power into AC power by switching each switching element ON and OFF based on the PWM signal that is input from the control circuit 3d. The filter removes the high frequency component caused by the switching. Note that the inverter circuit 2d is not limited thereto. For example, the PWM control inverter may be a single-phase inverter or may be a multilevel inverter. Also, instead of PWM control, another method may be used such as phase shift control.

The DC current sensor 4d detects the instantaneous value of the input current of the inverter circuit 2d (i.e., output current of the DC Power source 1d). The DC current sensor 4d digitally converts the detected instantaneous value, and outputs the digital conversion result to the control circuit 3d as the DC current signal Idc. The DC voltage sensor 5d detects the instantaneous value of the input voltage of the inverter circuit 2d (i.e., the output voltage of the DC power source 1d). The DC voltage sensor 5d digitally converts the detected instantaneous value, and outputs the digital conversion result to the control circuit 3d as the DC voltage signal Vdc.

The control circuit 3d controls the inverter circuit 2d, and is realized by a microcomputer and the like, for example. The control circuit 3d generates the PWM signal based on the DC current signal Idc that is input from the DC current sensor 4d, the DC voltage signal Vdc that is input from the DC voltage sensor 5d, and a signal obtained by detecting the output voltage, output current or the like of the inverter circuit 2d, and outputs the generated PWM signal to the inverter circuit 2d. The control circuit 3d is provided with a voltage target value setting unit 31d, a control unit 32d, a timing phase generation unit 33d, a communication unit 34d, and a delay unit 35d.

The voltage target value setting unit 31d sets the voltage target value Vdc*, which is the target value of the DC voltage signal Vdc. The voltage target value setting unit 31d is for performing maximum power point tracking control, and adjusts the voltage target value Vdc* by changing the voltage target value Vdc*, such that the output power of the DC power source 1d will be maximized. The voltage target value setting unit 31d is provided with a power calculation unit 311d and a comparison unit 312d.

The power calculation unit 311d calculates an output power P of the DC power source 1d. The power calculation unit 311d calculates the output power P, based on the DC current signal Idc that is input from the DC current sensor 4d and the DC voltage signal Vdc that is input from the DC voltage sensor 5d, and outputs the output power P to the comparison unit 312d.

The comparison unit 312d sets the voltage target value Vdc* for each predetermined timing. The comparison unit 312d compares the output power P that is input from the power calculation unit 311d with the last output power P, and sets the next voltage target value Vdc* such that the output power P increases. The characteristic curve of the output power P relative to the output voltage of the DC power source 1d will be like the curve shown in FIG. 31A. That is, the voltage-power relationship is characterized in that power is maximized when at a predetermined voltage, and decreases when moving away from the voltage at this time. The hill climbing method which utilizes this characteristic is used.

The comparison unit 312d changes the voltage target value Vdc*, and acquires the output power P calculated by the power calculation unit 311d. If the acquired output power P is larger than the value acquired last time, the voltage target value Vdc* is changed in the same direction, and if the acquired output power P is smaller than the value acquired last time, the voltage target value Vdc* is changed in the opposite direction, having exceeded the maximum power point (see point M in FIG. 31A). By repeating this processing, the operating point is positioned near the maximum power point, and the output power P is maintained at the maximum state as much as possible. Also, the comparison unit 312d performs processing based on a timing phase $\theta_i'$ that is input from the delay unit 35d, at the timing at which the timing phase $\theta_i'$ is zero, for example.

Figure 26:
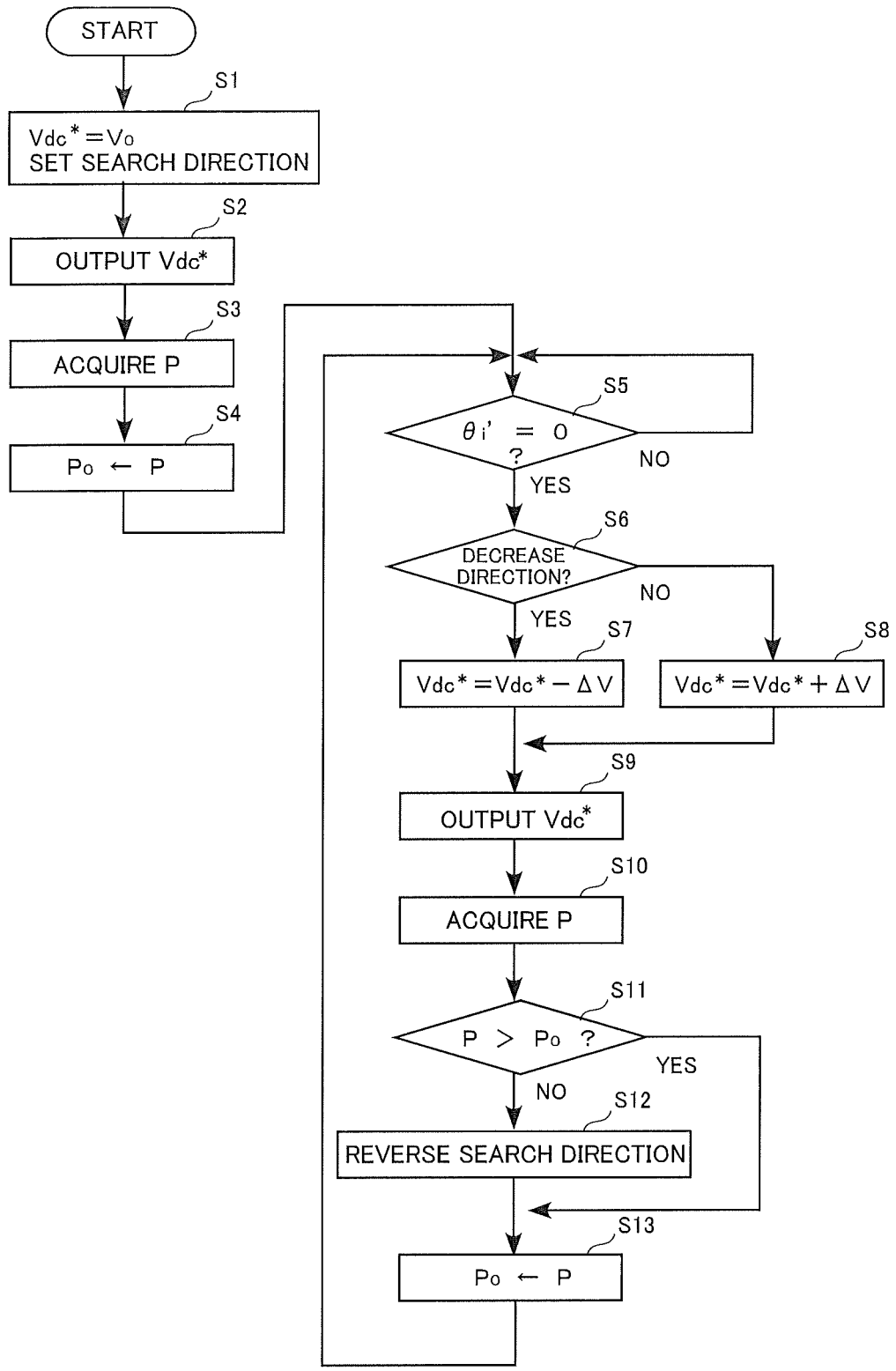
FIG. 26 is a flowchart for illustrating processing for searching for a maximum power point that is performed by a comparison unit.

FIG. 26 is a flowchart for illustrating processing for searching for the maximum power point that is performed by the comparison unit 312d. Execution of this search processing is started when the inverter circuit 2d starts the power conversion operation.

First, an initial value $V_0$ is set as the voltage target value Vdc*, and the search direction is set (S1). In the present embodiment, an open voltage is set as the initial value $V_0$. Also, the decrease direction for reducing the voltage target value Vdc* is set as the search direction. Note that each setting is not limited thereto. Next, the voltage target value Vdc* is output (S2), and the output voltage of the DC power source 1d is regulated to the voltage target value Vdc* by DC voltage control. The output power P calculated by the power calculation unit 311d is then acquired (S3), and is set as the last output power $P_0$ (S4).

Next, the comparison unit 312d waits until the timing phase $\theta_i'$ that is input from the delay unit 35d is "0" (S5). When the timing phase $\theta_i'$ is "0" (S5: YES), it is discriminated whether the search direction that is currently set is the decrease direction (S6). If the search direction is the decrease direction (S6: YES), the voltage target value Vdc* is decreased by $\Delta V$ (S7), and if the search direction is not the decrease direction (i.e., if the search direction is the increase direction) (S6: NO), the voltage target value Vdc* is increased by $\Delta V$ (S8). The voltage target value Vdc* is then output (S9), and the output power P is acquired (S10). Note that because the search for the maximum power point takes too long when the increase/decrease range $\Delta V$ is too small, and accuracy and stability deteriorate when the increase/decrease range $\Delta V$ is too large, the increase/decrease range $\Delta V$ needs to be appropriately set to a suitable value.

Next, it is discriminated whether the output power P is greater than the last output power $P_0$ (S11). If the output power P is greater than the last output power $P_0$ (S11: YES), the output power P is set as the last output power $P_0$ without changing the search direction (S13), and the processing returns to step S5. On the other hand, if the output power P is less than or equal to the last output power $P_0$ (S11: NO), the search direction is reversed, having exceeded the maximum power point (S12), that is, the increase direction is set in the case where the search direction was the decrease direction, and the decrease direction is set in the case where the search direction was the increase direction, the output power P is set as the last output power $P_0$ (S13), and the processing returns to step S5. Thereafter, steps S5 to S13 are repeated.

Note that processing for searching for the maximum power point that is performed by the comparison unit 312d is not limited to the abovementioned processing. For example, the output power P may be respectively acquired when the voltage target value Vdc* is decreased by $\Delta V$ and when the voltage target value Vdc* is increased by $\Delta V$, and the voltage target value Vdc* may be changed in the direction that results in a greater increase. Also, the so-called "two hill problem" may be resolved by changing the increase/decrease range $\Delta V$, or using genetic algorithm processing. Also, the present invention is not limited to the hill climbing method, and all algorithms that are used in maximum power point tracking control can be used.

The control unit 32d is for, controlling the output voltage of the DC power source 1d. The control unit 32d calculates a deviation $\Delta Vdc$ (=Vdc*−Vdc) from the DC voltage signal Vdc that is input from the DC voltage sensor 5d and the voltage target value Vdc* that is input from the voltage target value setting unit 31d, and generates a compensation value for adjusting the deviation to zero. A command signal is then generated based on the generated compensation value, and a PWM signal is generated by the triangular wave comparison method, for example, based on the command signal and the carrier signal. The generated PWM signal is output to the inverter circuit 2d. The output voltage of the DC power source 1d is regulated to the voltage target value Vdc* by this feedback control. Note that the control unit 32d may also perform control of the output current or output reactive power of the inverter circuit 2d.

The timing phase generation unit 33d generates a timing phase $\theta$, for determining the timing of voltage target value setting. The timing phase generation unit 33d outputs the generated timing phase $\theta$, to the communication unit 34d and the delay unit 35d. The timing phase generation unit 33d will be discussed in detail later.

The communication unit 34d communicates with the control circuit 3d of other distributed power sources Ad. The communication unit 34d receives input of the timing phase $\theta_i$ generated by the timing phase generation unit 33d, and transmits the input timing phase $\theta_i$ to the communication unit 34d of another distributed power source Ad. Also, the communication unit 34d outputs a timing phase $\theta_j$ received from the communication unit 34d of another distributed power source Ad to the timing phase generation unit 33d. Note that the communication method may be wired communication or may be wireless communication.

As shown in FIG. 25, the distributed power source Ad is connected in parallel with other distributed power sources Ad in the electric power system. In FIG. 25, a state in which five distributed power sources Ad (Ad1 to Ad5) and four loads Ld are connected is shown. Note that more distributed power sources Ad and loads Ld are connected in an actual electric power system.

The arrows shown in FIG. 25 indicate communication. The distributed power source Ad1 performs communication with only the distributed power source Ad2, and distributed power source Ad2 performs communication with only the distributed power source Ad1 and the distributed power source Ad3. Also, the distributed power source Ad3 performs communication with only the distributed power source Ad2 and the distributed power source Ad4, the distributed power source Ad4 performs communication with only the distributed power source Ad3 and the distributed power source Ad5, and the distributed power source Ad5 performs communication with only the distributed power source Ad4. Thus, the communication unit 34d of a distributed power source Ad need only communicate with the communication unit 34d of at least one distributed power source Ad among the distributed power sources Ad connected to the electric power system, and be in a state where a communication path exists between two arbitrary distributed power sources Ad connected to the electric power system ("interlinked state"), and does not need to communicate with the communication units 34d of all the distributed power sources Ad connected to the electric power system.

For example, in the case of the distributed power source Ad2, the communication unit 34d transmits a timing phase $\theta_2$ generated by the timing phase generation unit 33d to the communication units 34d of the distributed power sources Ad1 and Ad3, receives a timing phase $\theta_1$ from the communication unit 34d of the distributed power source Ad1, and receives a timing phase $\theta_3$ from the communication unit 34d of the distributed power source Ad3.

The delay unit 35d delays the timing phase $\theta_i$ that is input from the timing phase generation unit 33d by a predetermined value, and outputs the delayed timing phase $\theta_i$ to the voltage target value setting unit 31d as the timing phase $\theta_i'$. In the present embodiment, the timing phase $\theta_i$ synchronized with the other distributed power sources Ad is used after being shifted slightly for each distributed power source Ad, in order to prevent the timing of voltage target value setting from overlapping with the other distributed power sources Ad. The timing phase $\theta_i$ that is generated by the timing phase generation unit 33d is synchronized with the timing phases $\theta_j$ of other distributed power sources Ad and converges to the same phase, as will be discussed later. The voltage target value setting unit 31d uses the timing phase $\theta_i'$ obtained by the delay unit 35d delaying the timing phase $\theta_i$. The amount by which the phase is delayed is differentiated for each distributed power source Ad and set in advance. For example, in order to distribute the phases uniformly in the case where five distributed power sources Ad are interconnected to the same electric power grid Bd, as shown in FIG. 25, the phase is delayed so as to shift $(\frac{2}{5})\pi$ for each distributed power source Ad. For example, in the case where the frequency of the timing phase $\theta_i$ is 2.5 Hz (cycle=0.4 s), and the timing phase $\theta_1$ of the distributed power source Ad1 is used as a basis, the timing phase $\theta_1$ of the distributed power source Ad1 is not delayed, the timing phase $\theta_2$ of the distributed power source Ad2 is delayed 0.08 s, the timing phase $\theta_3$ of the distributed power source Ad3 is delayed 0.16 s, the timing phase $\theta_4$ of the distributed power source Ad4 is delayed 0.24 s, and the timing phase $\theta_5$ of the distributed power source Ad5 is delayed 0.32 s. Note that the amount by which the phase is delayed need not differ for all distributed power sources Ad. For example, in the case where 100 distributed power sources Ad are interconnected to the same electric power grid Bd, the amount of delay for each plurality of distributed power sources Ad may be changed, such that the timing phases of the 1-10th distributed power sources Ad are not delayed, the timing phases of the 11-20th distributed power sources Ad are delayed $(\frac{1}{3})\pi$, and the timing phase of the 21-30th distributed power sources Ad are delayed $(\frac{2}{3})\pi$.

Next, the timing phase generation unit 33d in each distributed power source Ad will be described.

The timing phase generation unit 33d of the present embodiment is substantially the same as the timing phase generation unit 64b in the third aspect of the present invention. That is, the timing phase generation unit 33d of the present embodiment is provided with an operation unit 331d, a multiplier 332d, an adder 333d, and an integrator 334d, as shown in FIG. 24. In such a configuration, the timing phase generation unit 33d generates the timing phase $\theta_i$, using a generated timing phase $\theta_i$ and a timing phase $\theta_j$ of another distributed power source Ad that is input from the communication unit 34d. Even if the timing phase $\theta_i$ differs from the timing phase $\theta_j$, the timing phase $\theta_i$ and the timing phase $\theta_j$ converge to a common timing phase as a result of the operational processing by the timing phase generation unit 33d being repeated. The contents of the operation that is performed by each element (i.e., the operation unit 331d, the multiplier 332d, the adder 333d, and the integrator 334d) at this time is substantially the same as that described in the third aspect, and thus description thereof will be omitted.

According to the present embodiment, the timing phase $\theta_i$ that is generated by the timing phase generation unit 33d is synchronized with the timing phases $\theta_j$ of other distributed power sources Ad, and the delay unit 35d outputs a timing phase $\theta_i'$ obtained by delaying the timing phase $\theta_i$ by a predetermined value. The voltage target value setting unit 31d sets the voltage target value Vdc* at a timing that depends on the timing phase $\theta_i'$. Although there is a change in the output power of the distributed power source Ad when the voltage target value Vdc* changes, the timing of this change differs from the change in the output power of the other distributed power sources Ad, thus enabling the influence on the electric power grid Bd to be reduced. Because the delay amount of the timing phase $\theta_i$ is differentiated slightly for each of the distributed power sources Ad that are interconnected to the electric power grid Bd, the timing of the change in power that is output by the distributed power sources Ad to the electric power grid Bd is spread out. This enables the occurrence of a simultaneous change in the output power of the distributed power sources Ad that are interconnected to the electric power grid Bd to be suppressed, and the influence on the electric power grid to be reduced.

Also, according to the present embodiment, the timing phases $\theta_i$ of all the distributed power sources Ad converge to the same value, as a result of each of the distributed power sources Ad that is interconnected to the electric power grid Bd performing mutual communication with at least one distributed power source Ad (located nearby, for example), and the electric power system being in the interlinked state. Accordingly, it is not necessary to adopt a configuration in which one of the distributed power sources Ad or a monitoring device communicates with all the other distributed power sources Ad, and the system does not become large-scale. Also, even in the case where there is a fault with one of the distributed power sources Ad or one of the distributed power sources Ad is removed, the timing phase $\theta_i$ can be synchronized if all of the other distributed power sources Ad can communicate with any of the distributed power sources Ad, and the electric power system is in the interlinked state. Also, in the case where a distributed power source Ad is added, that distributed power source Ad need only be able to communicate with at least one distributed power source Ad. Accordingly, it is possible to respond flexibly to an increase or decrease in distributed power sources Ad.

Note that although the case where the output voltage of the DC power source 1d is controlled was described in the present embodiment, the present invention is not limited thereto. The output current of the DC power source 1d may be controlled. That is, the DC current sensor 4d may be configured to detect the output current of the DC power source 1d and perform direct current control, or to search for the maximum power point by changing the current target value.

Figure 27:
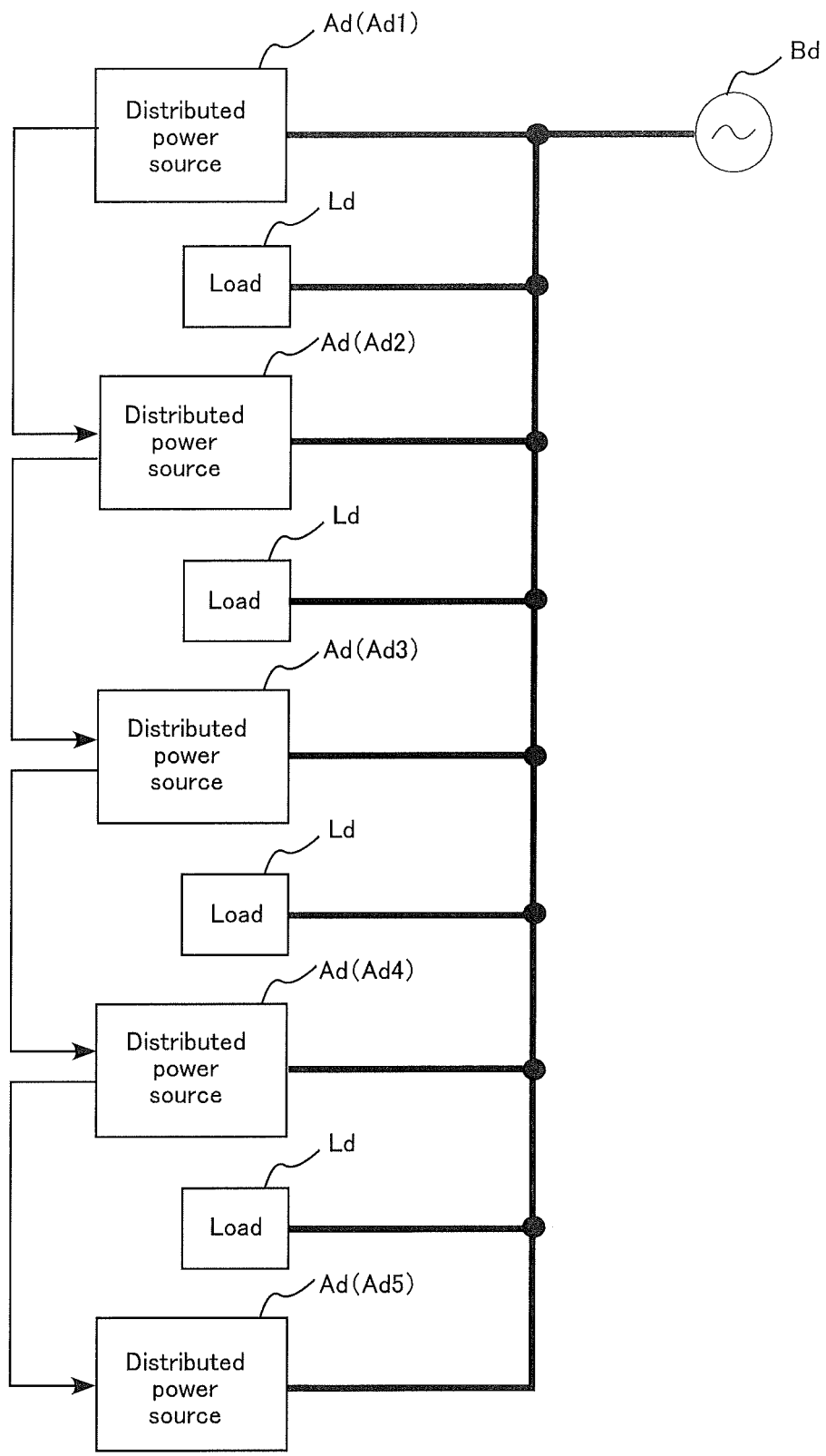
FIG. 27 is a diagram illustrating another communication state of distributed power sources connected in parallel in an electric power system.

Note that although the case where each distributed power source Ad performs mutual communication was described in the first embodiment, the present invention is not limited thereto, and one-way communication may be performed. For example, as shown in FIG. 27, the distributed power source Ad1 only transmits to the distributed power source Ad2. The distributed power source Ad2 only receives from the distributed power source Ad1, and only transmits to the distributed power source Ad3. The distributed power source Ad3 only receives from the distributed power source Ad2, and only transmits to the distributed power source Ad4. The distributed power source Ad4 only receives from the distributed power source Ad3, and only transmits to the distributed power source Ad5. The distributed power source Ad5 only receives from the distributed power source Ad4. Even in such a case, the timing phase $\theta_i$ can be synchronized. More generally, a condition for being able to synchronize the timing phase $\theta_i$ is a state in which an arbitrary distributed power source Ad connected to the electric power system can be reached by following the transmission destinations from a certain distributed power source Ad connected to the electric power system (a state including the "spanning tree" in graph theory).

In the first embodiment, the case was described where the inverter circuit 2d performs the maximum power point tracking control, but the present invention is not limited thereto. A configuration may be adopted in which a DC/DC converter circuit provided upstream of the inverter circuit 2d performs the maximum power point tracking control. The case where a DC/DC converter circuit performs the maximum power point tracking control will be described below.

Figure 28:
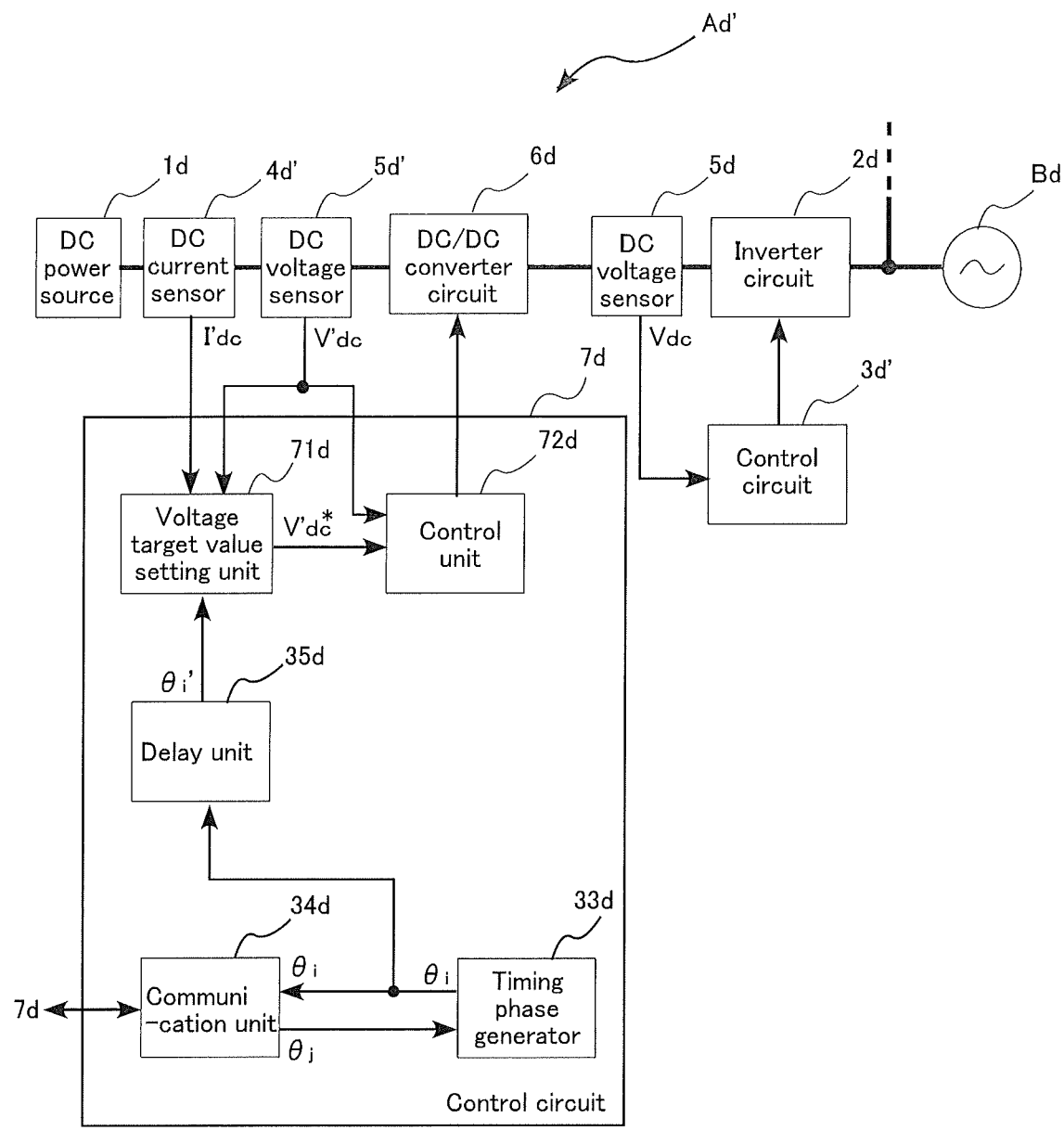
FIG. 28 is a diagram illustrating a distributed power source according to a second embodiment of the fifth aspect.

FIG. 28 is a diagram illustrating a distributed power source according to a second embodiment of the fifth aspect of the present invention. In the diagram, the same reference signs are given to constituent elements that are the same as or similar to the distributed power source Ad (see FIG. 24) according to the first embodiment.

A distributed power source Ad' shown in FIG. 28 differs from the distributed power source Ad according to the first embodiment in that a DC/DC converter circuit 6d, a DC current sensor 4d' and a DC voltage sensor 5d' are provided upstream of the DC voltage sensor 5d, and in that a control circuit 7d for controlling the DC/DC converter circuit 6d is provided.

The DC/DC converter circuit 6d increases or decreases the output voltage of the DC power source 1d, and outputs the resultant voltage to the inverter circuit 2d. The DC/DC converter circuit 6d increases or decreases the input voltage, by switching a switching element that is not shown ON and OFF, based on a PWM signal that is input from the control circuit 7d, and outputs the resultant voltage.

The DC current sensor 4d' detects the instantaneous value of the input current of the DC/DC converter circuit 6d (i.e., the output current of the DC power source 1d). The DC current sensor 4d' digitally converts the detected instantaneous value, and outputs the digital conversion result to the control circuit 7d as a DC current signal I'dc. The DC voltage sensor 5d' detects the instantaneous value of the input voltage of the DC/DC converter circuit 6d (i.e., the output voltage of the DC power source 1d). The DC voltage sensor 5d' digitally converts the detected instantaneous value, and outputs the digital conversion result to the control circuit 7d as a DC voltage signal V'dc.

The control circuit 7d controls the DC/DC converter circuit 6d, and is realized by a microcomputer and the like, for example. The control circuit 7d generates the PWM signal based on the DC current signal I'dc that is input from the DC current sensor 4d' and the DC voltage signal V'dc that is input from the DC voltage sensor 5d', and outputs the generated PWM signal to the DC/DC converter circuit 6d.

A voltage target value setting unit 71d is similar to the voltage target value setting unit 31d according to the first embodiment, and sets a voltage target value V'dc* serving as a target value of the DC voltage signal V'dc. The voltage target value setting unit 71d adjusts the voltage target value V'dc* by changing the voltage target value V'dc*, such that the output power of the DC power source 1d will be maximized. A control unit 72d is similar to the control unit 32d according to the first embodiment, and is for controlling the output voltage of the DC power source 1d. The control unit 72d calculates a deviation $\Delta$V'dc (=V'dc*−V'dc) from the DC voltage signal V'dc that is input from the DC voltage sensor 5d' and the voltage target value V'dc* that is input from the voltage target value setting unit 71d, and generates a compensation value for adjusting the deviation to zero. A command signal is then generated based on the generated compensation value, and a PWM signal is generated based on the command signal and the carrier signal.

The inverter circuit 2d converts the DC power that is input from the DC/DC converter circuit 6d into AC power. The control circuit 3d' is not provided with the voltage target value setting unit 31d, the timing phase generation unit 33d, the communication unit 34d, or the delay unit 35d (see FIG. 24), and sets the DC voltage target value Vdc* as a fixed value. The output voltage of the DC/DC converter circuit 6d is thereby fixed to the DC voltage target value Vdc*.

According to the second embodiment of the fifth aspect, the output voltage of the DC power source 1d is regulated to the DC voltage target value V'dc* that is set by the voltage target value setting unit 71d. The voltage target value setting unit 71d sets the voltage target value V'dc* at a timing that depends on the timing phase $\theta_i$'. Accordingly, similar effects to the first embodiment can also be achieved in the second embodiment.

Although the case where the timing phase $\theta_i$ is synchronized as a result of the distributed power source Ad (Ad') communicating with only other nearby distributed power sources Ad (Ad') was described in the above first and second embodiments, the method for synchronizing the timing phase $\theta_i$ is not limited thereto, and the timing phase $\theta_i$ may be synchronized with other methods. The case where a monitoring device for performing centralized monitoring of each distributed power source has a function of synchronizing the timing phase $\theta_i$ will be described below.

Figure 29:
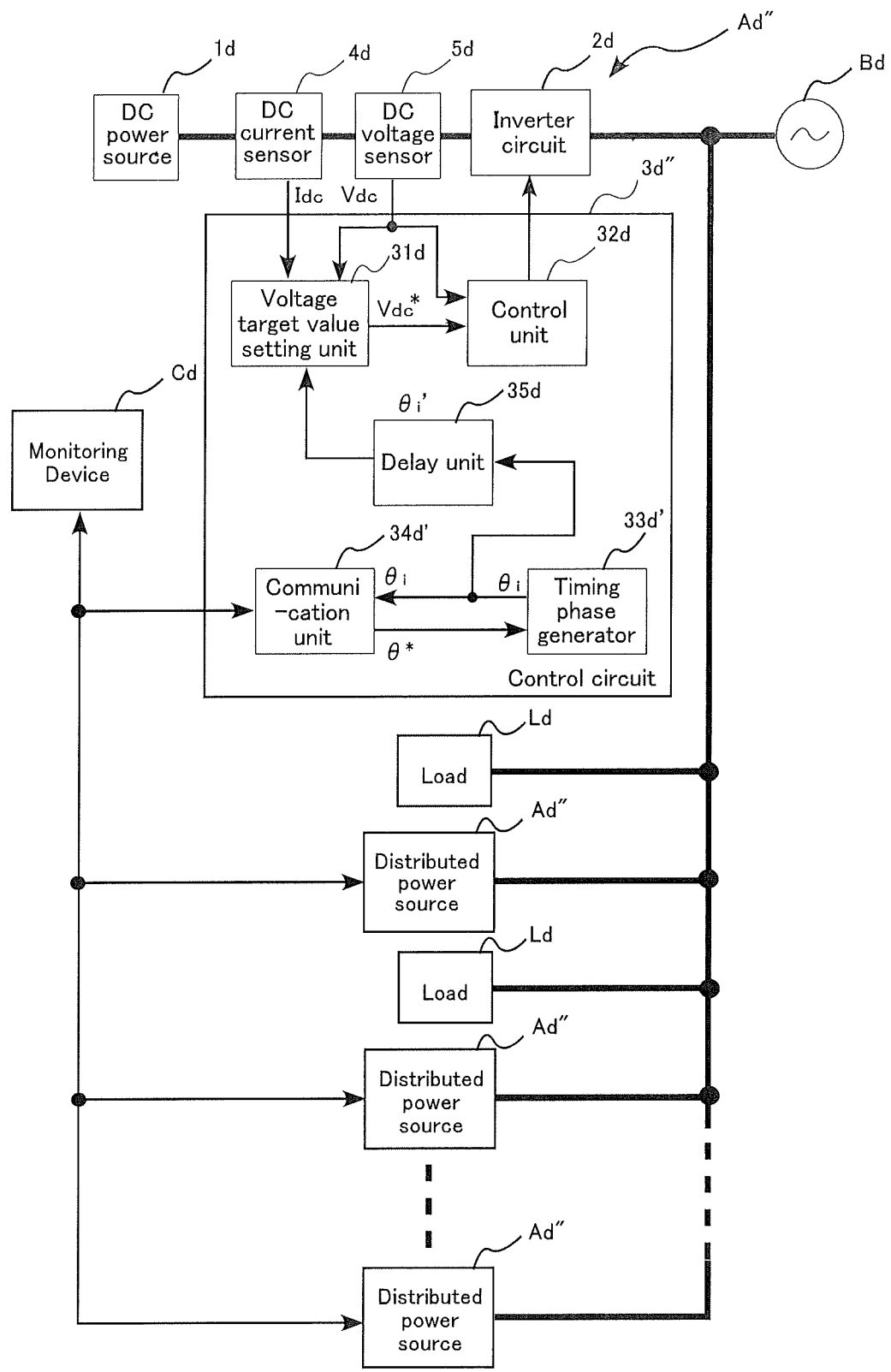
FIG. 29 is a diagram illustrating a distributed power source according to a third embodiment of the fifth aspect.

FIG. 29 is a diagram illustrating a distributed power source according to a third embodiment of the fifth aspect of the present invention. In the diagram, the same reference signs are given to constituent elements that are the same as or similar to the distributed power source Ad (see FIG. 24) according to the first embodiment.

A distributed power source Ad" shown in FIG. 29 differs from the distributed power source Ad according to the first embodiment in that a monitoring device Cd synchronizes the timing phase $\theta_i$.

A communication unit 34d' transmits the timing phase $\theta_i$ generated by a timing phase generation unit 33d' to the monitoring device Cd. The monitoring device Cd calculates the arithmetic mean value, for example, of the received timing phases θ$_i$ of the distributed power sources Ad", and transmits the calculated arithmetic mean value to each distributed power source Ad" as a target timing phase θ*. The communication unit 34d' outputs the target timing phase θ* received from the monitoring device Cd to the timing phase generation unit 33d'. The timing phase generation unit 33d' performs control such that the timing phase θ$_i$ is adjusted to the target timing phase θ*.

Note that a configuration may be adopted in which a specific one of the distributed power sources Ad" acts as the master instead of the monitoring device Cd, and outputs the target timing phase θ* to the other distributed power sources Ad" (slaves).

The timing phase θ$_i$ can also be synchronized in the third embodiment of the fifth aspect. Accordingly, the effect of reducing the influence on the electric power grid Bd can also be achieved in the third embodiment, similarly to the first embodiment.

In the first to third embodiments of the fifth aspect, the case was described where a plurality of distributed power sources Ad (Ad', Ad") are interconnected to the electric power grid Bd, but the present invention is not limited thereto. The present invention can also be applied in the case of a power plant (e.g., mega solar power plant) or the like that has a large number of inverter devices connected in parallel and generates solar power, for example.

According to the fifth aspect of the present invention, the timing phase synchronized with the other inverter devices is delayed by a predetermined value, and a target value of the DC voltage is set at a timing that depends on the delayed timing phase. Although there is a change in the output power of the inverter device when the target value changes, the timing of this change differs from the change in the output power of the other inverter devices, thus enabling the influence on the electric power system to be reduced.

<Sixth Aspect>

Figure 36:
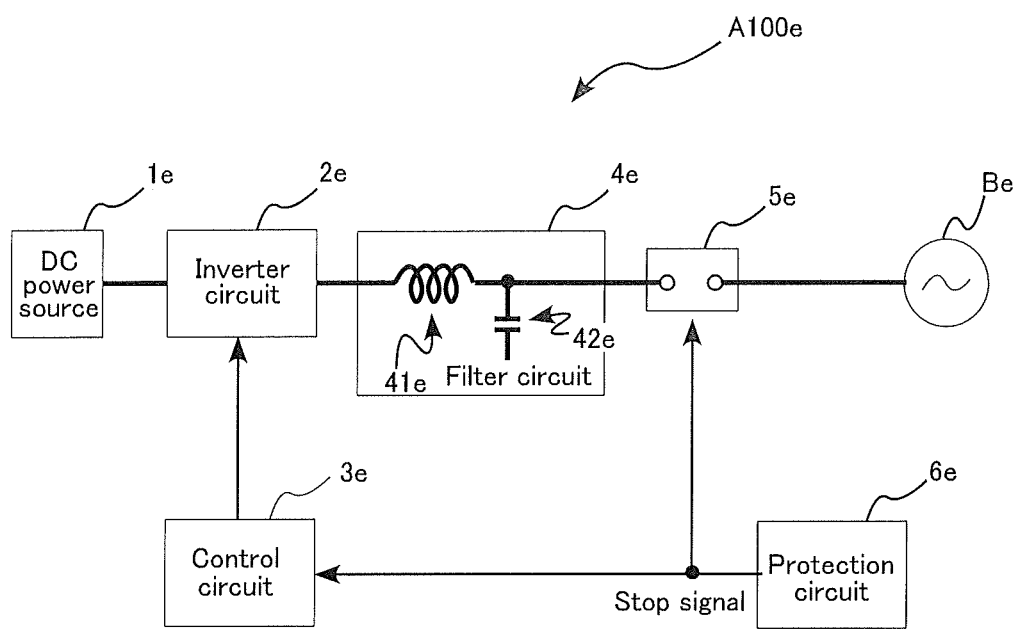
FIG. 36 is a diagram illustrating a typical conventional distributed power source.

FIG. 36 is a diagram illustrating a typical conventional distributed power source. A distributed power source A100e shown in the diagram converts DC power that is generated by a DC power source 1e that is provided with a solar cell into AC power, and supplies the AC power to an electric power grid Be. An inverter circuit 2e converts a DC voltage that is input from the DC power source 1e into an AC voltage, by switching a switching element based on a PWM signal that is input from a control circuit 3e. The control circuit 3e generates and outputs a PWM signal for controlling the inverter circuit 2e. A filter circuit 4e' removes the high frequency component caused by the switching, and is provided with a low pass filter that consists of a reactor 41e and a capacitor 42e.

Also, the distributed power source A100e is provided with a protection circuit 6e for stopping operation of the inverter circuit 2e in the case where overvoltage, overfrequency or the like is detected. The protection circuit 6e detects overvoltage, overfrequency, or the like, and outputs a stop signal to the control circuit 3e and an interconnection circuit breaker 5e in the case where overvoltage, overfrequency, or the like is detected. The control circuit 3e stops generation of the PWM signal in the case where a stop signal is input. The power conversion operation by the inverter circuit 2e is thereby stopped. Also, the interconnection circuit breaker 5e is opened after the power conversion operation by the inverter circuit 2e has stopped in the case where a stop signal is input, and the interconnection between the distributed power source A100e and the electric power grid Be is broken (e.g., see Document 9).

Figure 37A:
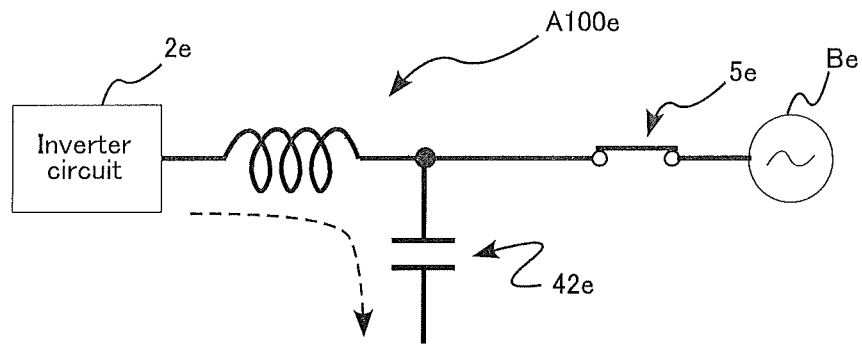
FIGS. 37A to 37C are diagrams illustrating the change in the state of a distributed power source when the inverter circuit stops operating.
Figure 37B:
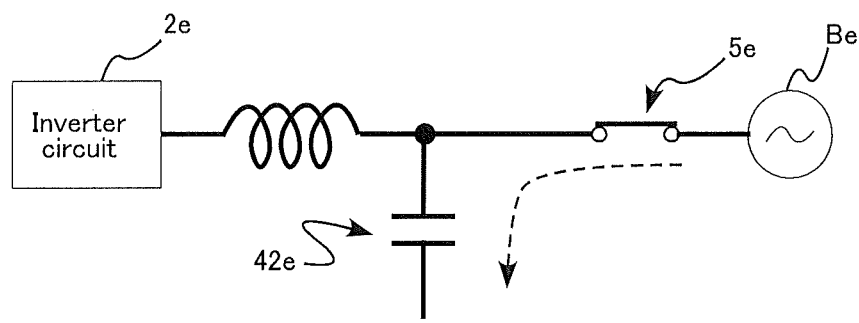
Figure 37C:
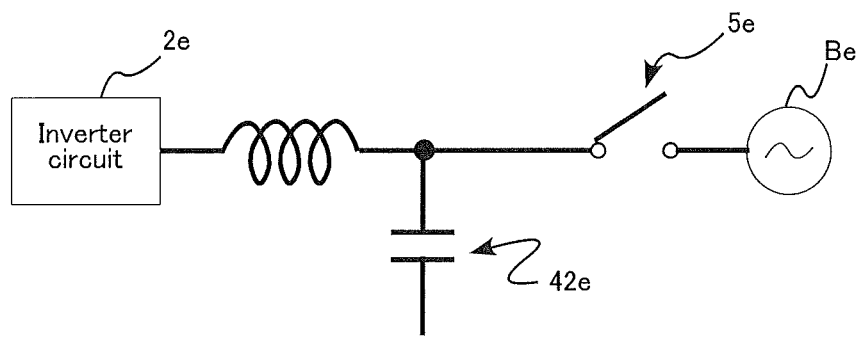

FIGS. 37A to 37C are diagrams illustrating the change in the state of the distributed power source A100e in the case where the inverter circuit 2e stops operating. FIG. 37A shows a state in which the inverter circuit 2e performs a power conversion operation and supplies AC power to the electric power grid Be. In this case, the power that is output by the inverter circuit 2e is supplied to the capacitor 42e of the filter circuit 4e. FIG. 37B shows a state in which the inverter circuit 2e, having received input of a stop signal, stops the power conversion operation. Because the inverter circuit 2e does not output power in this case, power is supplied to the capacitor 42e from the electric power grid Be. FIG. 37C shows a state where the interconnection circuit breaker 5e, having received input of the stop signal, has been opened, and the distributed power source A100e has been separated from the electric power grid Be.

The state shown in FIG. 37B always occurs in the case where the distributed power source A100e stops operating. Although only slightly, the electric power grid Be is affected when the distributed power source A100e stops operating, because power is supplied from the electric power grid Be at this time. Although the influence that one distributed power source A100e exerts on the electric power grid Be is slight, the electric power grid Be may be greatly affected in the case where a large number of distributed power sources A100e that are interconnected to the electric power grid Be stop operating simultaneously.

In contrast, according to the sixth aspect of the present invention, a stop circuit of an inverter circuit that is able to reduce the influence that stopping the inverter circuit exerts on the electric power grid is provided, in an electric power system in which a plurality of inverter devices are connected in parallel.

Figure 32:
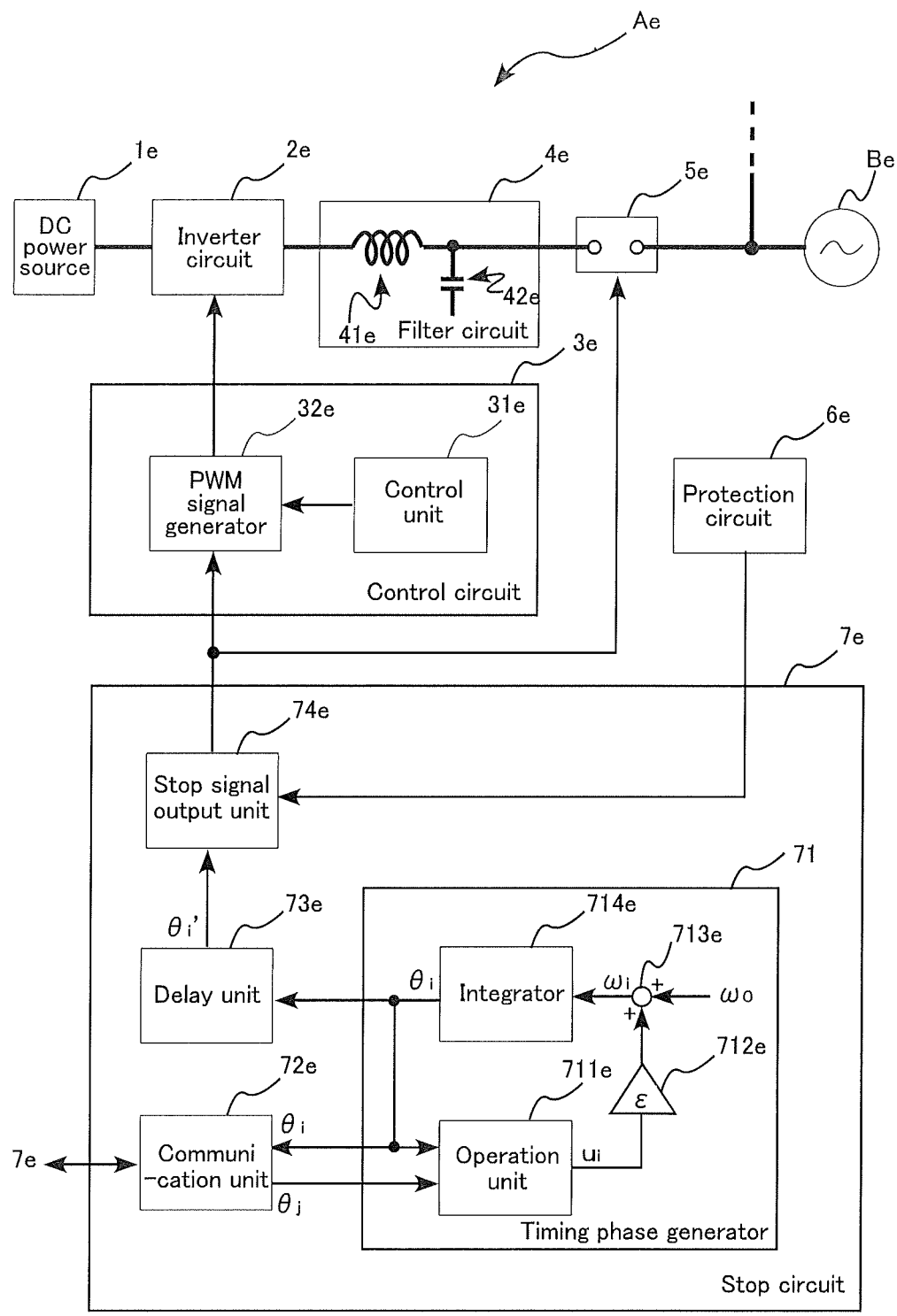
FIG. 32 is a diagram illustrating a distributed power source according to a first embodiment of a sixth aspect.
Figure 33:
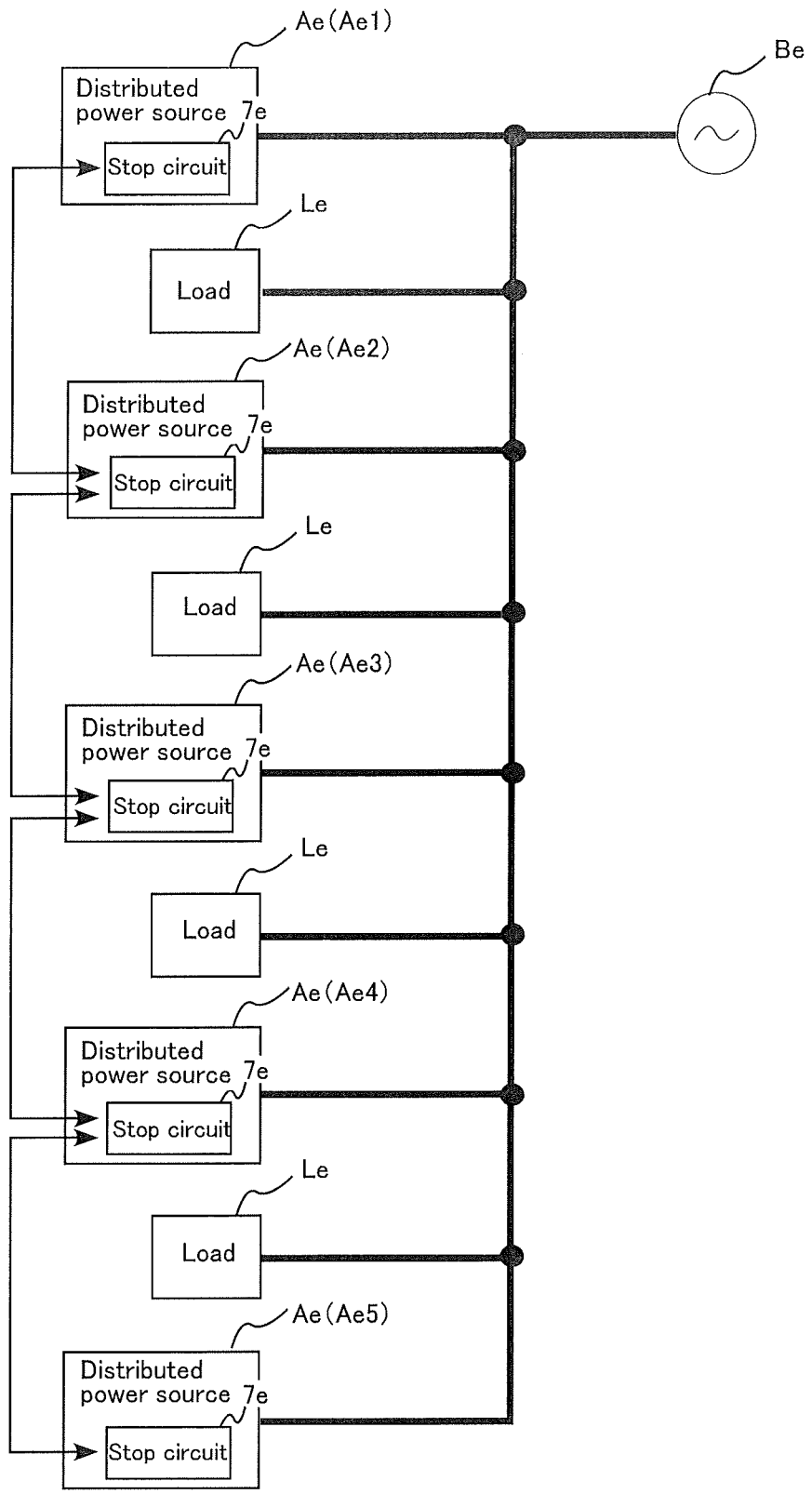
FIG. 33 shows an electric power system in which a plurality of distributed power sources are connected in parallel according to the first embodiment of the sixth aspect.

FIG. 32 is a diagram illustrating a distributed power source according to a first embodiment of the sixth aspect of the present invention. FIG. 33 shows an electric power system in which a plurality of distributed power sources are connected in parallel according to the first embodiment of the sixth aspect.

As shown in FIG. 32, a distributed power source Ae is provided with a DC power source 1e, an inverter circuit 2e, a control circuit 3e, a filter circuit 4e, an interconnection circuit breaker 5e, a protection circuit 6e, and a stop circuit 7e. In the distributed power source Ae, DC power that is output by the DC power source 1e is converted into AC power and output by the inverter circuit 2e to a load or the electric power grid Be. Note that, although not shown, a transformer is provided on the output side of the filter circuit 4e. In the present embodiment, the inverter circuit 2e, the control circuit 3e, the filter circuit 4e, the interconnection circuit breaker 5e, the protection circuit 6e and the stop circuit 7e are packaged as an inverter device (so-called power conditioner).

The DC power source 1e outputs DC power, and is provided with a solar cell, for example. The DC power source 1e outputs the generated DC power to the inverter circuit 2e. Note that the DC power source 1e may be a fuel cell, a storage battery, an electric double-layer capacitor or a lithium ion battery, instead of a solar cell. Also, the DC power source 1e may include an AC generator (diesel engine generator, micro gas turbine generator, wind turbine generator, etc.). In this case, AC power generated by the AC generator is output after being converted into DC power.

The inverter circuit 2e converts the DC power that is input from the DC power source 1e into AC power and outputs the AC power. The inverter circuit 2e is provided with a PWM control inverter that is not shown. The PWM control inverter is a three-phase inverter provided with three pairs of six switching elements in total that are not shown, and converts DC power into AC power by switching each switching element ON and OFF based on a PWM signal that is input from the control circuit 3e. Note that the inverter circuit 2e is not limited thereto. For example, the PWM control inverter may be a single-phase inverter or may be a multi-level inverter. Also, instead of PWM control, another method may be used such as phase shift control.

The control circuit 3e controls the inverter circuit 2e, and is realized by a microcomputer and the like, for example. The control circuit 3e generates the PWM signal based on the input voltage, output voltage, output current and the like of the inverter circuit 2e that are detected by various sensors provided in the distributed power source Ae, and outputs the generated PWM signal to the inverter circuit 2e. The control circuit 3e is provided with a control unit 31e and a PWM signal generation unit 32e.

The control unit 31e is for performing output current control. The control unit 31e generates a compensation value for adjusting the output current of the inverter circuit 2e detected by a sensor to the target value, generates a command signal based on the generated compensation value, and outputs the generated command signal to the PWM signal generation unit 32e. Note that the control unit 31e may perform control of the input voltage or the output reactive power of the inverter circuit 2e.

The PWM signal generation unit 32e generates a PWM signal. The PWM signal generation unit 32e generates the PWM signal using the triangular wave comparison method, based on a carrier signal and the command signal that is input from the control unit 31e. For example, a pulse signal that is high if the command signal is greater than the carrier signal and low if the command signal is less than or equal to the carrier signal is generated as the PWM signal. The generated PWM signal is output to the inverter circuit 2e. Note that the PWM signal generation unit 32e is not limited to the case where the PWM signal is generated using the triangular wave comparison method, and may generate the PWM signal with a hysteresis method, for example. Also, the PWM signal generation unit 32e stops generation of the PWM signal, in the case where a stop signal is input from the stop circuit 7e. The power conversion operation of the inverter circuit 2e stops as a result of input of the PWM signal from the PWM signal generation unit 32e stopping.

In the present embodiment, the control circuit 3e was described as being realized as a digital circuit, but may be realized as an analog circuit. Also, the processing that is performed by each unit may be designed by a program, and a computer may be operated as the control circuit 3e by causing the computer to execute the program. Also, the program may be recorded on a recording medium, and the computer may be operated to read the program.

The filter circuit 4e removes the high frequency component caused by switching from the AC voltage that is input from the inverter circuit 2e. The filter circuit 4e is provided with a low pass filter that consists of a reactor 41e and a capacitor 42e. Note that the filter circuit 4e is not limited to this configuration, and need only be a known filter circuit for removing the high frequency component.

The interconnection circuit breaker 5e breaks the interconnection between the distributed power source Ae and the electric power grid Be. The interconnection circuit breaker 5e is normally closed, and the distributed power source Ae is interconnected to the electric power grid Be. However, in the case where an anomaly is detected by the protection circuit 6e and the stop signal is input from the stop circuit 7e, the interconnection circuit breaker 5e is opened and breaks the interconnection between the distributed power source Ae and the electric power grid Be. It is thereby possible to prevent anomalies of the distributed power source Ae affecting the electric power grid Be and, conversely, anomalies of the electric power grid Be affecting the distributed power source Ae.

The protection circuit 6e detects anomalies and outputs a detection signal to the stop circuit 7e. The protection circuit 6e detects anomalous states such as overvoltage (OVR) and undervoltage (UVR), overfrequency (OFR) and underfrequency (UFR), underpower, and temperature anomalies, for example. Note that the anomalous states that are detected are not limited thereto. Also, the protection circuit 6e outputs the detection signal in the case where there is a stop instruction from a centralized monitoring device. Note that another protection circuit that is not shown detects those anomalies that require the inverter circuit 2e to be stopped instantly. This protection circuit directly outputs the detection signal as a stop signal to the PWM signal generation unit 32e and the interconnection circuit breaker 5e, instead of outputting the detection signal to the stop circuit 7e.

The stop circuit 7e is for stopping the inverter circuit 2e, and is realized by a microcomputer and the like, for example. The stop circuit 7e outputs a stop signal in the case where the detection signal is input from the protection circuit 6e. The stop circuit 7e is provided with a timing phase generation unit 71e, a communication unit 72e, a delay unit 73e, and a stop signal output unit 74e.

The timing phase generation unit 71e generates a timing phase $\theta_i$ for determining the timing of the stop signal output. The timing phase generation unit 71e outputs the generated timing phase $\theta_i$ to the communication unit 72e and the delay unit 73e. The timing phase generation unit 71e will be discussed in detail later.

The communication unit 72e communicates with the stop circuit 7e of other distributed power sources Ae. The communication unit 72e receives input of the timing phase $\theta_i$ generated by the timing phase generation unit 71e, and transmits the input timing phase $\theta_i$ to the communication unit 72e of mother distributed power source Ae. Also, the communication unit 72e outputs a timing phase $\theta_j$ received from the communication unit 72e of another distributed power source Ae to the timing phase generation unit 71e. Note that the communication method may be wired communication or may be wireless communication.

As shown in FIG. 33, the distributed power source Ae is connected in parallel with other distributed power sources Ae in the electric power system. In FIG. 33, a state in which five distributed power sources Ae (Ae1 to Ae5) and four loads Le are connected is shown. Note that more distributed power sources Ae and loads Le are connected in an actual electric power system.

The arrows shown in FIG. 33 indicate communication. The stop circuit 7e of the distributed power source Ae1 communicates with only the stop circuit 7e of the distributed power source Ae2, and the stop circuit 7e of the distributed power source Ae2 communicates with only the stop circuit 7e of the distributed power source Ae1 and the stop circuit 7e of the distributed power source Ae3. Also, the stop circuit 7e of the distributed power source Ae3 communicates with only the stop circuit 7e of the distributed power source Ae2 and the stop circuit 7e of the distributed power source Ae4, the stop circuit 7e of the distributed power source Ae4 communicates with only the stop circuit 7e of the distributed power source Ae3 and the stop circuit 7e of the distributed power source Ae5, and the stop circuit 7e of the distributed power source Ae5 communicates with only the stop circuit 7e of the distributed power source Ae4. Thus, the stop circuit 7e of a distributed power source Ae need only communicate with the stop circuit 7e of at least one distributed power source Ae among the distributed power sources Ae connected to the electric power system, and be in a state where a communication path exists between the stop circuits 7e of two arbitrary distributed power sources Ae connected to the electric power system ("interlinked state"), and does not need to communicate with the stop circuits 7e of all the distributed power sources Ae connected to the electric power system.

For example, in the case of the distributed power source Ae2, the communication unit 72e of the stop circuit 7e transmits a timing phase $\theta_2$ generated by the timing phase generation unit 71e to the communication unit 72e of the stop circuits 7e of the distributed power source Ae1 and A3, receives a timing phase $\theta_1$ from the communication unit 72e of the stop circuit 7e of the distributed power source Ae1, and receives a timing phase $\theta_3$ from the communication unit 72e of the stop circuit 7e of the distributed power source Ae3.

The delay unit 73e delays the timing phase $\theta_i$ that is input from the timing phase generation unit 71e by a predetermined value, and outputs the delayed timing phase $\theta_i$ to the stop signal output unit 74e as a timing phase $\theta_i'$. In the present embodiment, the timing phase $\theta_i$ synchronized with the other distributed power sources Ae is used after being shifted slightly for each distributed power source Ae, in order to prevent the output timing of the stop signal from overlapping with the other distributed power sources Ae. The timing phase $\theta_i$ that is generated by the timing phase generation unit 71e is synchronized with timing phase $\theta_j$ of the other distributed power sources Ae and converges to the same phase, as will be discussed later. The stop signal output unit 74e uses the timing phase $\theta_i'$ obtained by the delay unit 73e delaying the timing phase $\theta_j$. The amount by which the phase is delayed is differentiated for each distributed power source Ae and set in advance. For example, in Order to distribute the phases uniformly in the case where five distributed power sources Ae are interconnected to the same electric power grid Be, as shown in FIG. 33, the phase is delayed so as to shift $(2/5)\pi$ for each distributed power source Ae. For example, in the case where the angular frequency of the timing phase $\theta_i$ is 2.5 Hz (cycle=0.4 s), and the timing phase $\theta_1$ of the distributed power source Ae1 is used as a basis, the timing phase $\theta_1$ of the distributed power source Ae1 is not delayed, the timing phase $\theta_2$ of the distributed power source Ae2 is delayed 0.08 s, the timing phase $\theta_3$ of the distributed power source Ae3 is delayed 0.16 s, the timing phase $\theta_4$ of the distributed power source Ae4 is delayed 0.24 s, and the timing phase $\theta_5$ of the distributed power source Ae5 is delayed 0.32 s. Note that the amount by which the phase is delayed need not differ for all distributed power sources Ae. For example, in the case where 100 distributed power sources Ae are interconnected to the same electric power grid Be, the amount of delay for each plurality of distributed power sources Ae may be changed, such that the timing phases of the 1-10th distributed power sources Ae are not delayed, the timing phases of the 11-20th distributed power sources Ae are delayed $(1/5)\pi$, and the timing phase of the 21-30th distributed power sources Ae are delayed $(2/5)\pi$.

The stop signal output unit 74e outputs a stop signal to the PWM signal generation unit 32e and the interconnection circuit breaker 5e at a predetermined timing, in the case where the detection signal is input from the protection circuit 6e. The PWM signal generation unit 32e, having received input of the stop signal, stops generation of the PWM signal. The power conversion operation of the inverter circuit 2e thereby stops. Also, the interconnection circuit breaker 5e, having received input of the stop signal, breaks the interconnection between the distributed power source Ae and the electric power grid Be. It is thereby possible to prevent anomalies of the distributed power source Ae or the electric power grid Be affecting one another. The stop signal output unit 74e outputs the stop signal, based on the timing phase $\theta_i'$ that is input from the delay unit 73e, at the timing at which the timing phase $\theta_i'$ is zero, for example.

Next, the timing phase generation unit 71e of each distributed power source Ae will be described.

The timing phase generation unit 71e of the present embodiment is substantially the same as the timing phase generation unit 64b in the third aspect of the present invention. That is, the timing phase generation unit 71e of the present embodiment is provided with an operation unit 711e, a multiplier 712e, an adder 713e, and an integrator 714e, as shown in FIG. 32. In such a configuration, the timing phase generation unit 71e generates the timing phase $\theta_i$, using a generated timing phase $\theta_i$ and a timing phase $\theta_j$ of another distributed power source Ae that is input from the communication unit 72e. Even if the timing phase $\theta_i$ differs from the timing phase $\theta_j$, the timing phase $\theta_i$ and the timing phase $\theta_j$ converge to a common timing phase as a result of the operational processing by the timing phase generation unit 71e being repeated. The contents of the operation that is performed by each element (i.e., the operation unit 711e, the multiplier 712e, the adder 713e, and the integrator 714e) at this time is substantially the same as that described in the third aspect, and thus description thereof will be omitted.

According to the present embodiment, the timing phase $\theta_j$ that is generated by the timing phase generation unit 71e is synchronized with the timing phases $\theta_j$ of other stop circuits 7e, and the delay unit 73e outputs a timing phase $\theta_i'$ obtained by delaying the timing phase $\theta_i$ by a predetermined value. The stop signal output unit 74e outputs a stop signal at a timing that depends on the timing phase $\theta_i'$. Even if the timing at which the detection signal is output from the protection circuit 6e is the same, the stop circuit 7e outputs the stop signal at a timing that differs from the other stop circuits 7e, and thus the stop timing of the inverter circuit 2e also differs from the other inverter circuits 2e. Accordingly, the influence that stopping of the inverter circuit 2e exerts on the electric power grid can be reduced. Because the delay amount of the timing phase $\theta_i$ is differentiated slightly for the stop circuit 7e of each distributed power source Ae that is interconnected to the electric power grid Be, the timing at which each inverter circuit 2e stops operating is spread out, even if the timing at which the protection circuit 6e detects anomalies is the same. The stopping of the inverter circuit 2e of each distributed power source Ae that is interconnected to the electric power grid Be at the same time can thereby be suppressed, and the influence on the electric power grid can be reduced.

Also, according to the present embodiment, the timing phases $\theta_i$ of all the stop circuits 7e converge to the same value, as a result of the stop circuit 7e of each of the distributed power sources Ae that are interconnected to the electric power grid Be performing mutual communication with the stop circuit 7e of at least one distributed power source Ae (located nearby, for example), and the electric power system being in the interlinked state. Accordingly, it is not necessary to adopt a configuration in which one of the stop circuits 7e or a monitoring device communicates with all the other stop circuits 7e, and the system does not become large-scale. Also, even in the case where there is a fault with one of the distributed power sources Ae or one of the distributed power sources Ae is removed, the timing phase $\theta_i$ can be synchronized if the stop circuits 7e of all the other distributed power sources Ae can communicate with the stop circuit 7e of any of the distributed power sources Ae, and the electric power system is in the interlinked state. Also, in the case where a distributed power source Ae is added, the stop circuit 7e of that distributed power source Ae need only be able to communicate with the stop circuit 7e of at least one distributed power source Ae. Accordingly, it is possible to respond flexibly to an increase or decrease in distributed power sources Ae.

Figure 34:
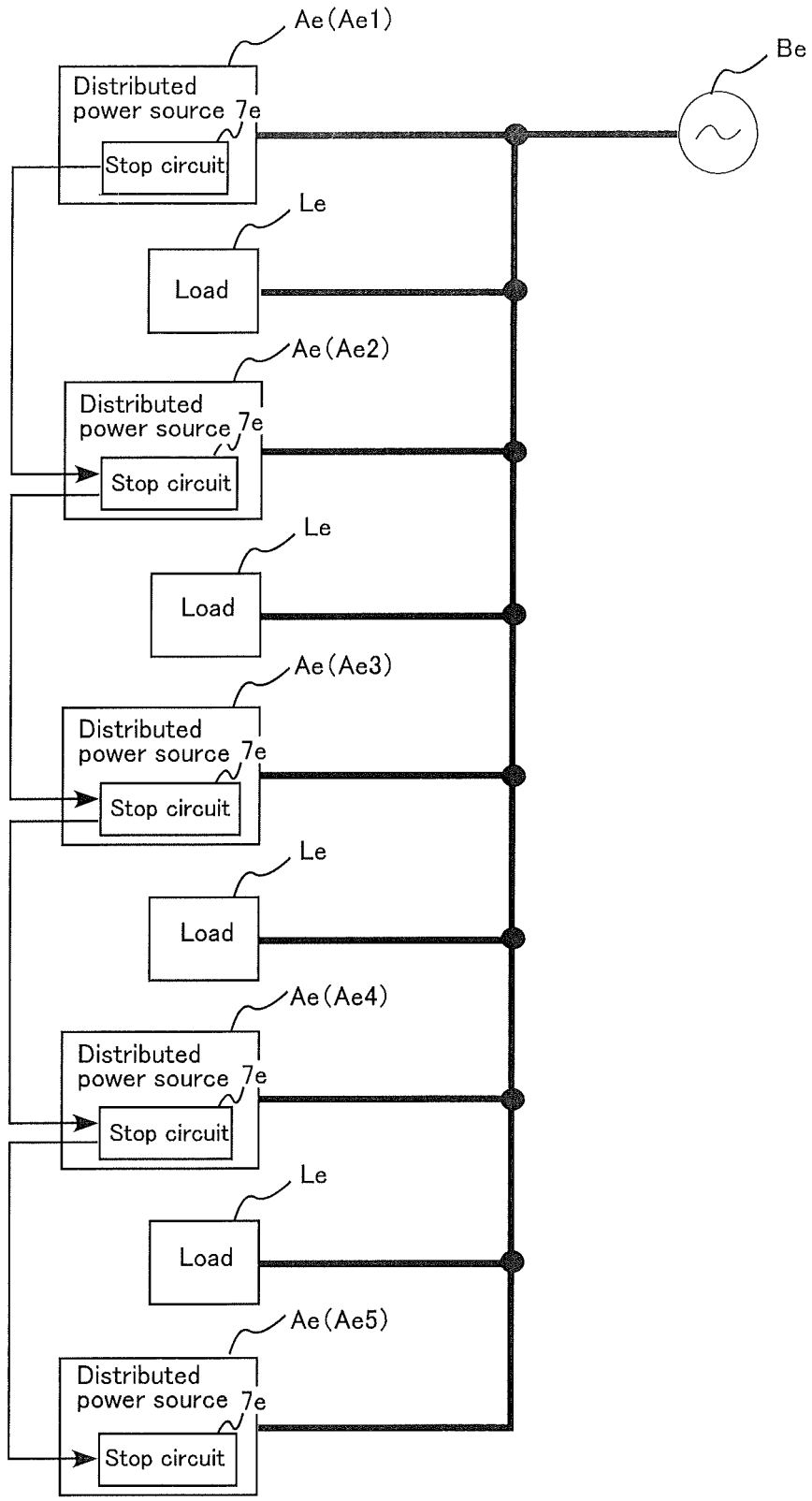
FIG. 34 is a diagram illustrating another communication state of stop circuits of distributed power sources connected in parallel in an electric power system.

Note that although the case where each stop circuit 7e performs mutual communication was described in the first embodiment, the present invention is not limited thereto, and one-way communication may be performed. For example, as shown in FIG. 34, the stop circuit 7e of the distributed power source Ae1 only transmits to the stop circuit 7e of the distributed power source Ae2. The stop circuit 7e of the distributed power source Ae2 only receives from the stop circuit 7e of the distributed power source Ae1, and only transmits to the stop circuit 7e of the distributed power source Ae3. The stop circuit 7e of the distributed power source Ae3 only receives from the stop circuit 7e of the distributed power source Ae2, and only transmits to the stop circuit 7e of the distributed power source Ae4. The stop circuit 7e of the distributed power source Ae4 only receives from the stop circuit 7e of the distributed power source Ae3, and only transmits to the stop circuit 7e of the distributed power source Ae5. The stop circuit 7e of the distributed power source Ae5 only receives from the stop circuit 7e of the distributed power source Ae4. Even in such a case, the timing phase $\theta_i$ can be synchronized. More generally, a condition for being able to synchronize the timing phase $\theta_i$ is a state in which the stop circuit 7e of an arbitrary distributed power source Ae connected to the electric power system can be reached by following the transmission destinations from the stop circuit 7e of a certain distributed power source Ae connected to the electric power system (a state including the "spanning tree" in graph theory).

Although the case where the timing phase $\theta_i$ is synchronized as a result of the stop circuit 7e of the distributed power source Ae communicating with only the stop circuit 7e of another nearby distributed power source Ae was described in the first embodiment, the method for synchronizing the timing phase $\theta_i$ is not limited thereto, and a configuration may be adopted in which the timing phase $\theta_i$ is synchronized by another method. The case where a monitoring device for performing centralized monitoring of each distributed power source has a function of synchronizing the timing phase $\theta_i$ will be described below.

Figure 35:
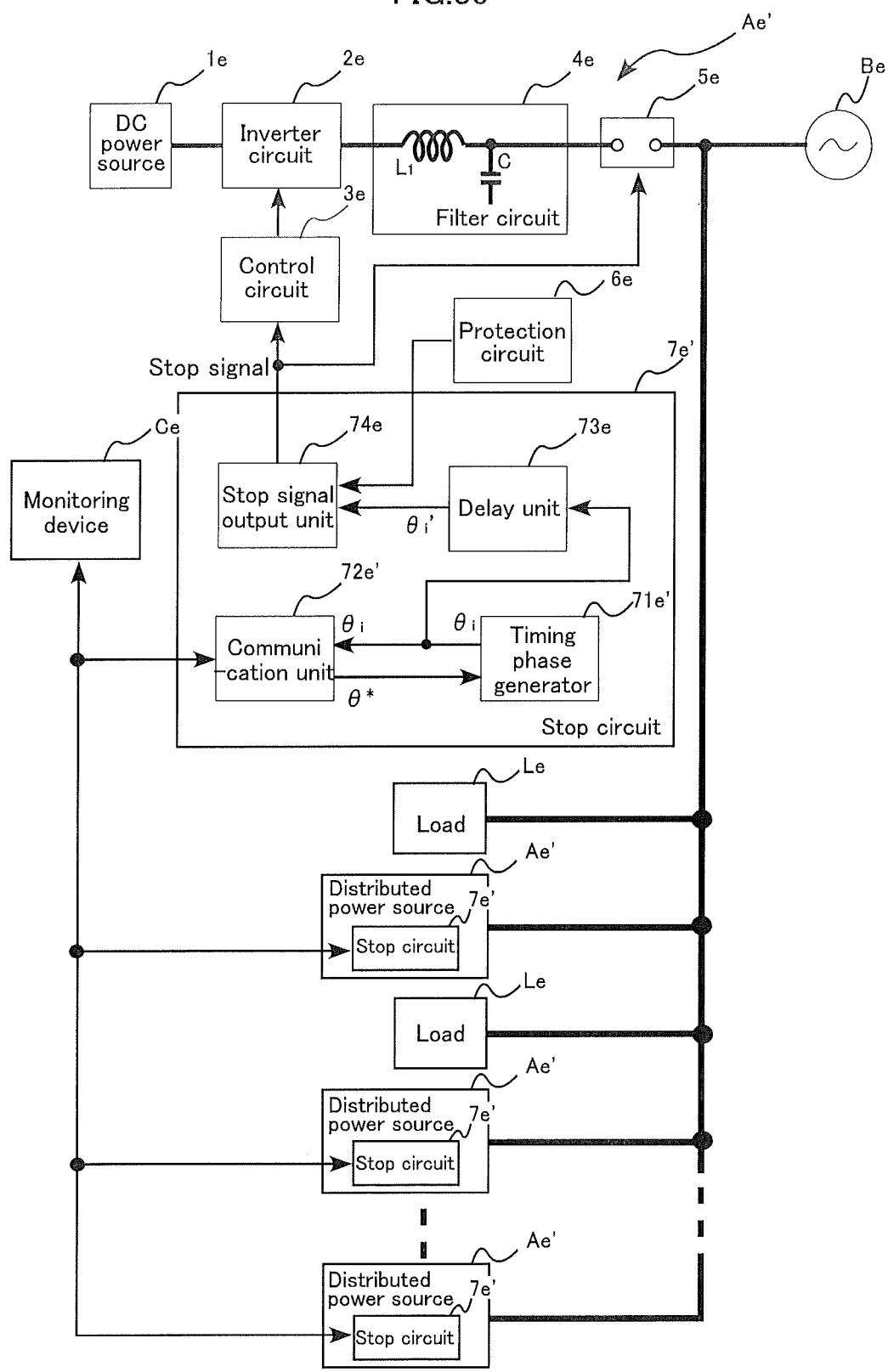
FIG. 35 is a diagram illustrating a distributed power source according to a second embodiment of the sixth aspect.

FIG. 35 is a diagram illustrating a distributed power source according to a second embodiment of the sixth aspect of the present invention. In the diagram, the same reference signs are given to constituent elements that are the same as or similar to the distributed power source Ae (see FIG. 32) according to the first embodiment.

A distributed power source Ae' shown in FIG. 35 differs from the distributed power source Ae according to the first embodiment in that a monitoring device Ce synchronizes the timing phase $\theta_i$.

A communication unit 72e' transmits the timing phase $\theta_i$ generated by a timing phase generation unit 71e' to the monitoring device Ce. The monitoring device Ce calculates the arithmetic mean value, for example, of the received timing phases $\theta_i$ of the distributed power sources Ae', and transmits the calculated arithmetic mean value to each distributed power source Ae' as the target timing phase $\theta^*$. The communication unit 72e' outputs the target timing phase $\theta^*$ received from the monitoring device Ce to the timing phase generation unit 71e'. The timing phase generation unit 71e' performs control such that the timing phase $\theta_i$ is adjusted to the target timing phase $\theta^*$.

Note that a configuration may be adopted in which a specific one of the distributed power sources Ae' acts as the master instead of the monitoring device Ce, and outputs the target timing phase $\theta^*$ to the other distributed power sources Ae' (slaves).

The timing phase $\theta_i$ can also be synchronized in the second embodiment. Accordingly, in the second embodiment, the effect of reducing the influence on the electric power grid Be can be achieved, similarly to the first embodiment.

In the above first and second embodiments, the case was described where a plurality of distributed power sources Ae (Ae') are interconnected to an electric power grid Be, but the present invention is not limited thereto. The present invention can be also applied in the case of a power plant (e.g., mega solar power plant) or the like that has a large number of inverter devices connected in parallel and generates solar power, for example.

According to the sixth aspect of the present invention, the timing phase synchronized with the other inverter devices is delayed by a predetermined value, and the inverter circuit stops operating at a timing that depends on the delayed timing phase. Although power is supplied from the electric power grid to the capacitor of the filter circuit due to the stopping of the inverter circuit, the inverter circuit stops operating at a different timing from the other inverter circuits, thus enabling the influence on the electric power grid to be reduced.

<Seventh Aspect>

Figure 43:
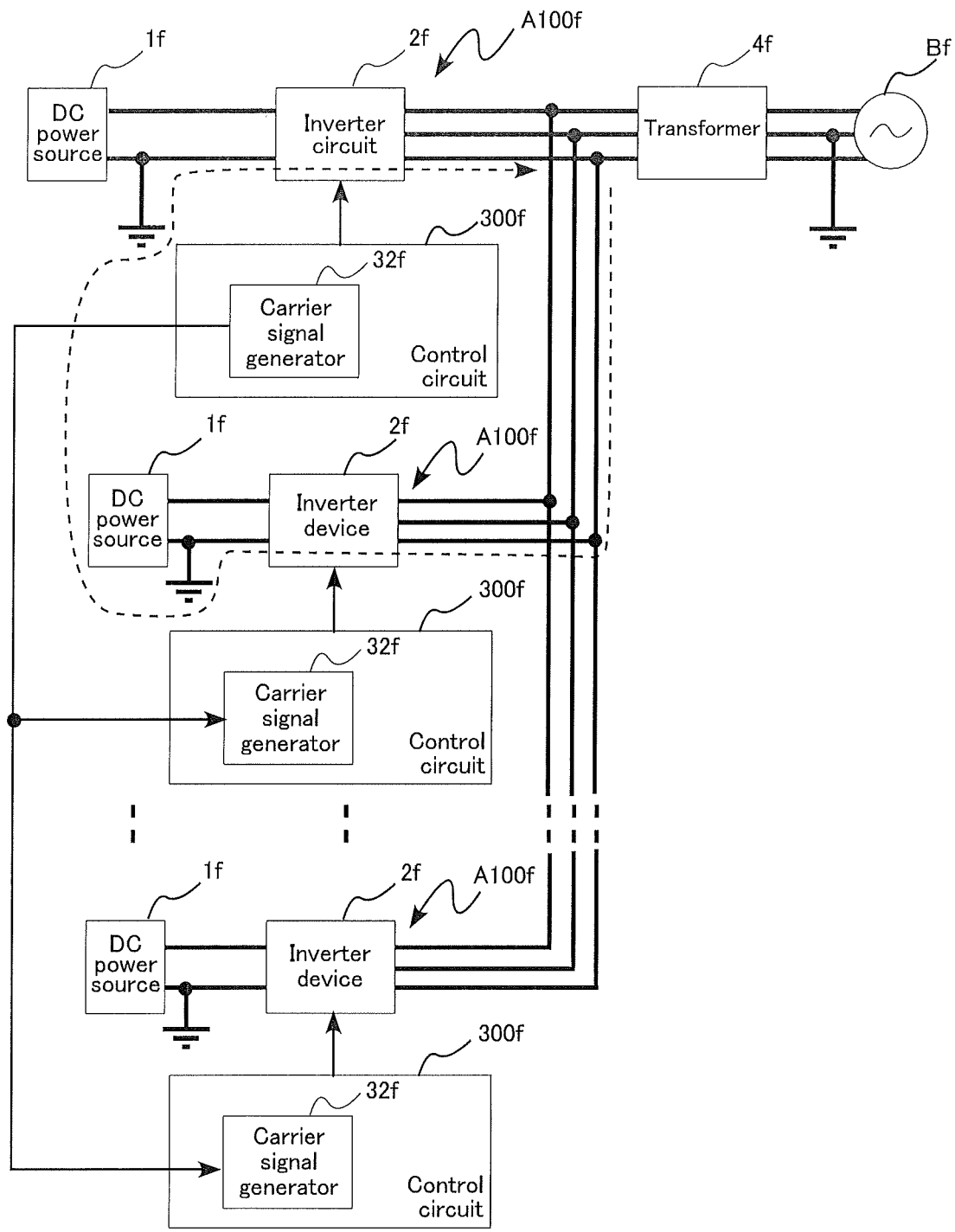
FIG. 43 is a diagram illustrating a conventional grid-connected inverter system.

FIG. 43 is a diagram illustrating a conventional grid-connected inverter system (see Document 10). As shown in the diagram, a plurality of inverter devices A100f provided with an inverter circuit 2f and a control circuit 300f are connected in parallel, and a transformer 4f is provided between connection points thereof and an electric power grid Bf. Because a DC power source 1f that outputs DC power to each inverter device Aloof is provided with a thin-film solar cell that deteriorates when the anode is not grounded, the anode of the output line is grounded.

In the above conventional grid-connected inverter system, output terminals of the inverter devices Aloof are connected to each other without a transformer being provided in each inverter device A100f, and the input terminals of the inverter devices A100f are connected to each other by the grounding of the anodes. Accordingly, a current path through which current circulates is formed between the inverter devices Aloof (see the dashed arrow shown in the diagram).

Also, the conventional grid-connected inverter system brings the carrier signals into phase, in order to suppress circulating current of the high frequency component of the carrier frequency that occurs due to the PWM signals being out of phase, out of the circulating current flowing through the current path. Specifically, one of the inverter devices Aloof (in FIG. 43, the uppermost inverter device A100f) serves as a "master inverter device", and this inverter device comprehensively controls the other inverter devices A100f ("slave inverter devices"). Specifically, a configuration is adopted in which a carrier signal whose phase is synchronized with a carrier signal that is generated by a carrier signal generation unit 32f of the master inverter device is generated by the carrier signal generation unit 32f of each slave inverter device. Because the phase of the PWM signal that is output from each control circuit 300f is thereby in phase, the circulating current of the high frequency component of the carrier frequency can be suppressed.

However, in the case of synchronizing the phase of the carrier signal ("carrier phase") with the abovementioned method, the system becomes large-scale, and becomes less able to respond flexibly to an increase or decrease in inverter devices A100f and more vulnerable to faults. That is, the master inverter device needs to communicate with each of the slave inverter devices. In the case of wired communication, it is necessary to respectively connect the master inverter device and slave inverter device with a communication line. In the case of wireless communication, it is necessary to ensure that the radio waves are not blocked by obstacles or the like.

In contrast, according to the seventh aspect of the present invention, a method for synchronizing carrier phases that can resolve the abovementioned problem is provided.

Figure 38:
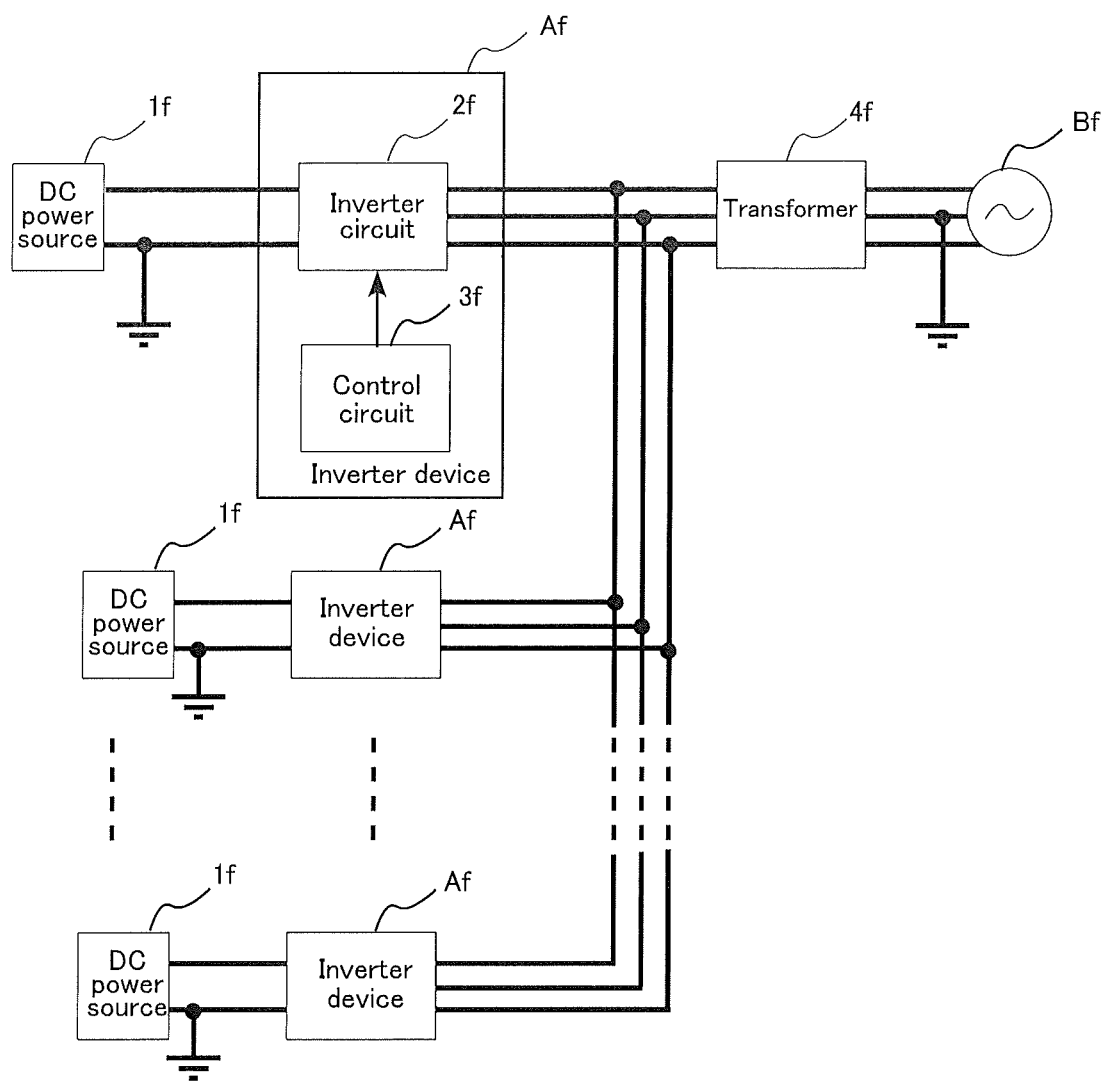
FIG. 38 is a diagram illustrating a grid-connected inverter system according to a first embodiment of a seventh aspect.
Figure 39:
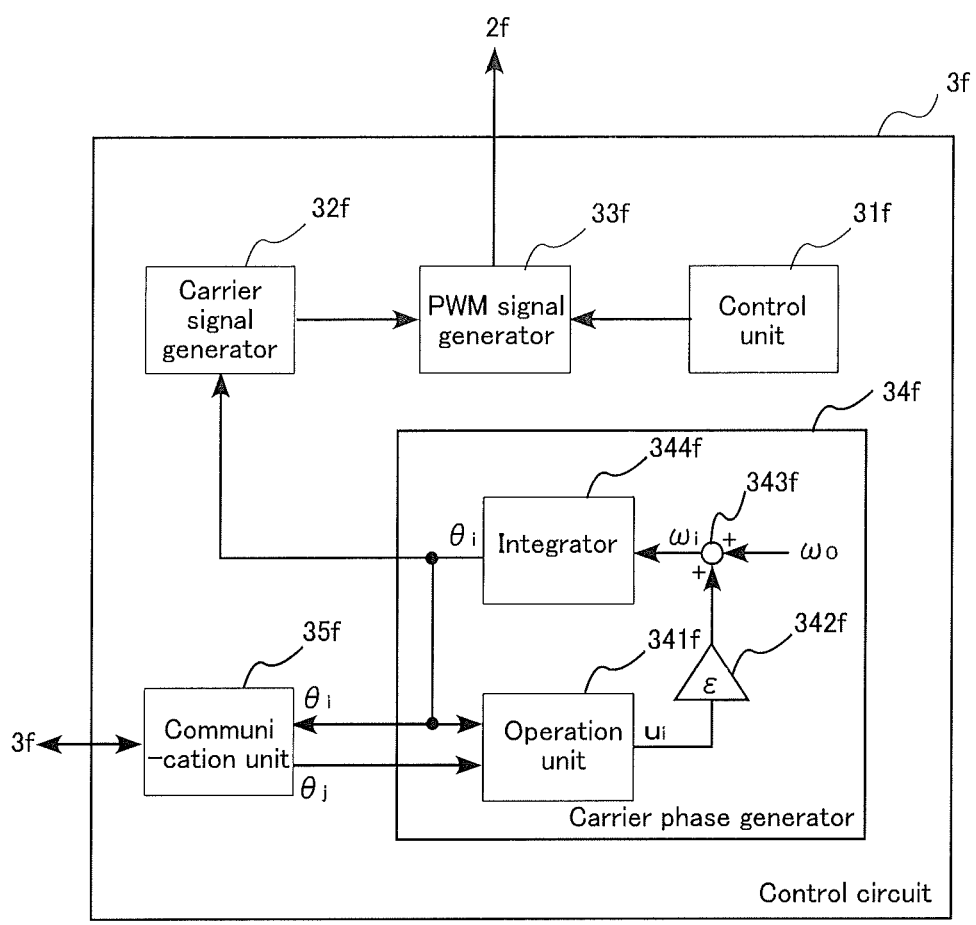
FIG. 39 is a diagram illustrating an internal configuration of a control circuit according to the first embodiment of the seventh aspect.
Figure 40:
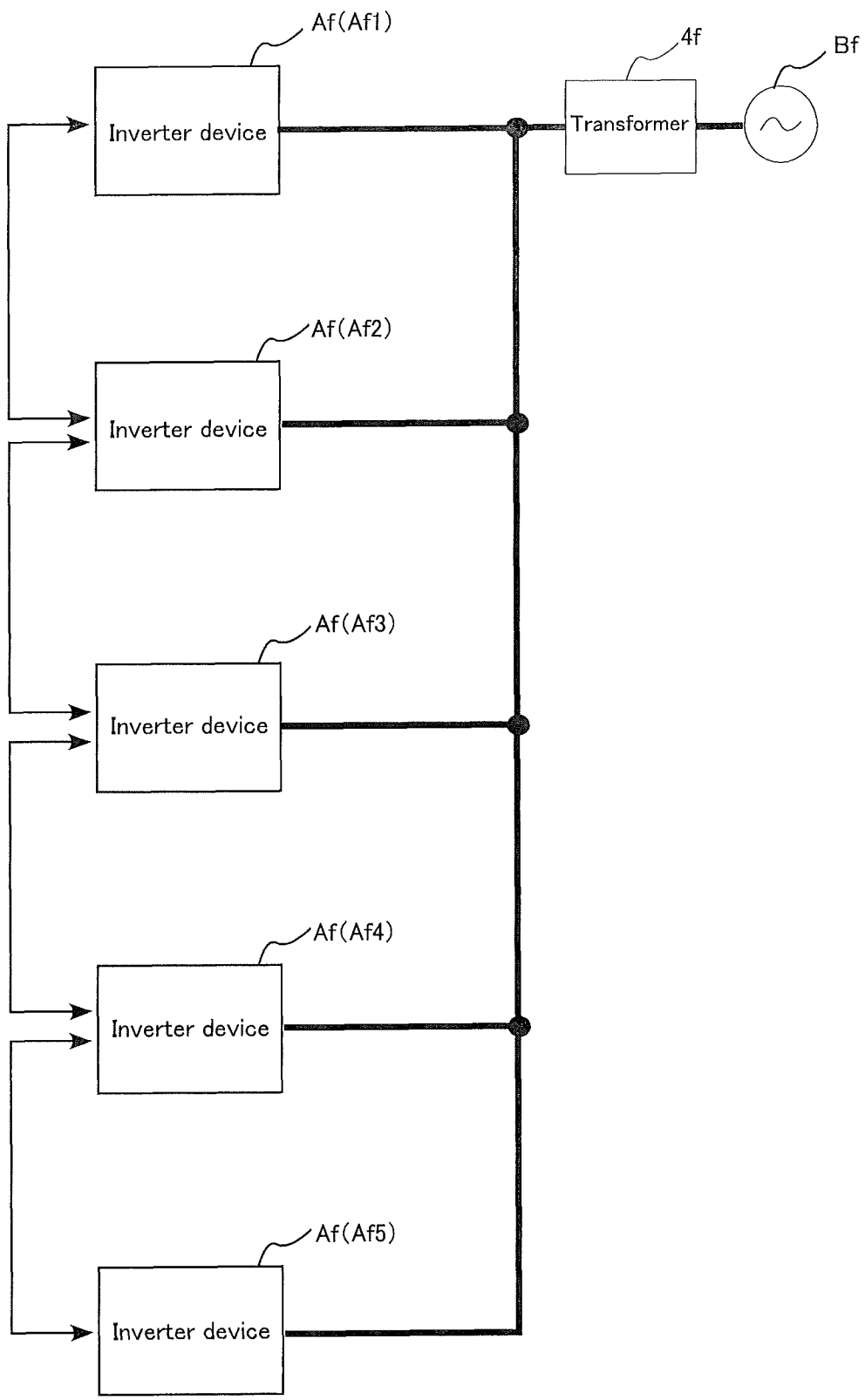
FIG. 40 shows a grid-connected inverter system according to the first embodiment of the seventh aspect.

FIG. 38 is a diagram illustrating a grid-connected inverter system according to a first embodiment of the seventh aspect of the present invention. FIG. 39 is a diagram illustrating an internal configuration of a control circuit 3f. FIG. 40 shows the grid-connected inverter system according to the first embodiment of the seventh aspect.

As shown in FIG. 38, in the grid-connected inverter system, a plurality of inverter devices Af are connected in parallel to each other, and the transformer 4f is provided between the connection points thereof and the electric power grid Bf. The DC power source if is connected to the input side of each of the inverter devices Af. Each inverter device Af converts DC power that is output by the DC power source if into AC power, and supplies the AC power to the electric power grid Bf via the transformer 4f. Note that the electric power grid Bf is an electric power grid employing a three-phase three-line system, with one of the phases (e.g., V phase) being grounded by a grounding conductor. The transformer 4f increases the AC voltage that is output from each inverter device Af to a voltage for supplying to the electric power grid Bf. Also, the transformer 4f electrically insulates each inverter device Af from the electric power grid Bf. Note that in the case where voltage increase and insulation are not necessity, the transformer 4f need not be provided. The inverter device Af is provided with the inverter circuit 2f and the control circuit 3f, as shown in FIG. 38.

The DC power source if outputs DC power, and is provided with a solar cell. In the present embodiment, the solar cell is a thin-film solar cell, and one of the output lines (in FIG. 38, output line of anode) is grounded by a grounding conductor. Note that the solar cell is not limited to a thin-film solar cell, and may be another type of solar cell. Also, the output terminal of the solar cell does not need to be grounded. The DC power source if outputs the generated DC power to the inverter circuit 2f. Note that the DC power source if is not limited to generating DC power with a solar cell. For example, the DC power source if may be a fuel cell, a storage battery, an electric double-layer capacitor or a lithium ion battery, or may be a device that converts AC power generated by a diesel engine generator, a micro gas turbine generator, a wind turbine generator or the like into DC power, and outputs the DC power.

The inverter circuit 2f converts the DC power that is input from the DC power source if into AC power, and outputs the AC power. The inverter circuit 2f is provided with a PWM control inverter and a filter that are not shown. The PWM control inverter is a three-phase inverter provided with three pairs of six switching elements in total that are not shown, and converts DC power into AC power by switching each switching element ON and OFF based on the PWM signal that is input from the control circuit 3f. The filter removes the high frequency component caused by the switching. Note that the inverter circuit 2f is not limited thereto. For example, the PWM control inverter may be a single-phase inverter or may be a multilevel inverter. Also, instead of PWM control, another method may be used such as phase shift control. Also, a configuration may be adopted in which a DC/DC converter circuit is provided on the input side of the inverter circuit 2f, and the DC voltage that is output from the DC power source if is increased or decreased.

The control circuit 3f controls the inverter circuit 2f, and is realized by a microcomputer and the like, for example. The control circuit 3f generates the PWM signal based on the input voltage, output voltage, output current or the like of the inverter circuit 2f that are detected by various sensors provided in the inverter device Af, and outputs the generated PWM signal to the inverter circuit 2f. As shown in FIG. 39, the control circuit 3f is provided with a control unit 31f, a carrier signal generation unit 32f, a PWM signal generation unit 33f, a carrier phase generation unit 34f, and a communication unit 35f.

The control unit 31f is for performing output current control. The control unit 31f generates a compensation value for adjusting the output current of the inverter circuit 2f detected by a sensor to the target value, generates a command signal based on the generated compensation value, and outputs the result to the PWM signal generation unit 33f. Note that the control unit 31f may perform control of the input voltage or the output reactive power of the inverter circuit 2f.

The carrier signal generation unit 32f generates a carrier signal. In the present embodiment, a triangular wave signal of a predetermined frequency is used as the carrier signal. The carrier signal generation unit 32f generates the carrier signal according to a carrier phase $\theta_i$ that is input from the carrier phase generation unit 34f. Note that the carrier signal is not limited to a triangular wave signal, and may be a sawtooth wave signal, for example.

The PWM signal generation unit 33f generates a PWM signal. The PWM signal generation unit 33f generates the PWM signal using the triangular wave comparison method, based on the command signal that is input from the control unit 31f and the carrier signal that is input from the carrier signal generation unit 32f. For example, a pulse signal that is high if the command signal is greater than the carrier signal and low if the command signal is less than or equal to the carrier signal is generated as the PWM signal. The generated PWM signal is output to the inverter circuit 2f. The method for generating the PWM signal from a command signal and a carrier signal is the same as the method described with reference to FIG. 21.

The carrier phase generation unit 34f generates a carrier phase $\theta_i$, which is the phase of the carrier signal generated by the carrier signal generation unit 32f. The carrier phase generation unit 34f outputs the generated carrier phase $\theta_i$ to the communication unit 35f and the carrier signal generation unit 32f. The carrier phase generation unit 34f will be discussed in detail later.

The communication unit 35f communicates with the control circuit 3f of other inverter devices Af. The communication unit 35f receives input of the carrier phase $\theta_i$ generated by the carrier phase generation unit 34f, and transmits the input carrier phase $\theta_i$ to the communication unit 35f of another inverter device Af. Also, the communication unit 35f outputs a carrier phase $\theta_j$ received from the communication unit 35f of another inverter device Af to the carrier phase generation unit 34f. Note that the communication method may be wired communication or may be wireless communication.

As shown in FIG. 40, the inverter device Af is connected in parallel with other inverter devices Af. In FIG. 40, a state in which five inverter devices Af (Af1 to Af5) are connected is shown. Note that more inverter devices Af are connected in an actual grid-connected inverter system.

The arrows shown in FIG. 40 indicate communication. The inverter device Af1 communicates with only the inverter device Af2, and the inverter device Af2 communicates with only the inverter device Af1 and the inverter device Af3. Also, the inverter device Af3 communicates with only the inverter device Af2 and inverter device Af4, the inverter device Af4 communicates with only the inverter device Af3 and the inverter device Af5, and the inverter device Af5 communicates with only the inverter device Af4. Thus, the communication unit 35f of an inverter device Af need only communicate with the communication unit 35f of at least one inverter device Af, among the inverter devices Af provided in the grid-connected inverter system, and be in a state where a communication path exists between two arbitrary inverter devices Af provided in the grid-connected inverter system ("interlinked state"), and does not need to communicate with the communication units 35f of all the inverter devices Af provided in the grid-connected inverter system.

For example, in the case of the inverter device Aft, the communication unit 35f transmits a carrier phase $\theta_2$ generated by the carrier phase generation unit 34f to the communication units 35f of the inverter devices Af1 and Af3, receives a carrier phase $\theta_1$ from the communication unit 35f of the inverter device Af1, and receives a carrier phase $\theta_3$ from the communication unit 35f of the inverter device Af3.

Next, the carrier phase generation unit 34f of each inverter device Af will be described.

The carrier phase generation unit 34f of the present embodiment is substantially the same as the carrier phase generation unit 34c in the fourth aspect of the present invention. That is, the carrier phase generation unit 34f of the present embodiment is provided with an operation unit 341f, a multiplier 342f, an adder 343f, and an integrator 344f, as shown in FIG. 39. In such a configuration, the carrier phase generation unit 34f generates the carrier phase $\theta_i$, using a generated carrier phase $\theta_i$ and a carrier phase $\theta_j$ of another inverter device Af that is input from the communication unit 35f. Even if the carrier phase $\theta_i$ differs from the carrier phase $\theta_j$, the carrier phase $\theta_i$ and the carrier phase $\theta_j$ converge to a common carrier phase as a result of the operational processing by the carrier phase generation unit 34f being repeated. The contents of the operational processing that is performed by each element (i.e., the operation unit 341f, the multiplier 342f, the adder 343f, and the integrator 344f) at this time is substantially the same as that described in the fourth aspect, and thus description thereof will be omitted.

According to the present embodiment, the carrier phases $\theta_i$ of all the inverter devices Af converge to the same value, as a result of each of the inverter devices Af provided in the grid-connected inverter system performing mutual communication with at least one inverter device Af (located nearby, for example), and the grid-connected inverter system being in the interlinked state. Accordingly, it is not necessary to adopt a configuration in which one of the inverter devices Af communicates with all of the other inverter devices Af, and the system does not become large-scale. Also, even in the case where there is a fault with one of the inverter devices Af or one of the inverter devices Af is removed, the carrier phase $\theta_i$ can be synchronized if all of the other inverter devices Af can communicate with any of the inverter devices Af, and the grid-connected inverter system is in the interlinked state. Also, in the case where an inverter device Af is added, that inverter device Af need only be able to communicate with at least one inverter device Af. Accordingly, it is possible to respond flexibly to an increase or decrease in inverter devices Af.

Also, in each inverter device Af, the carrier signal generation unit 32f generates the carrier signal according to the carrier phase $\theta_i$ that is output by the carrier phase generation unit 34f. The PWM signal generation unit 33f generates a PWM signal based on the carrier signal generated by the carrier signal generation unit 32f. In each inverter device Af provided in the grid-connected inverter system, the phase of the PWM signal that is output is also synchronized, because the carrier phase $\theta_i$ converges to the same value. Even if a current path through which current circulates between the inverter devices Af is formed, it is thereby possible to suppress the circulating current of the high frequency component of the carrier frequency.

Figure 41:
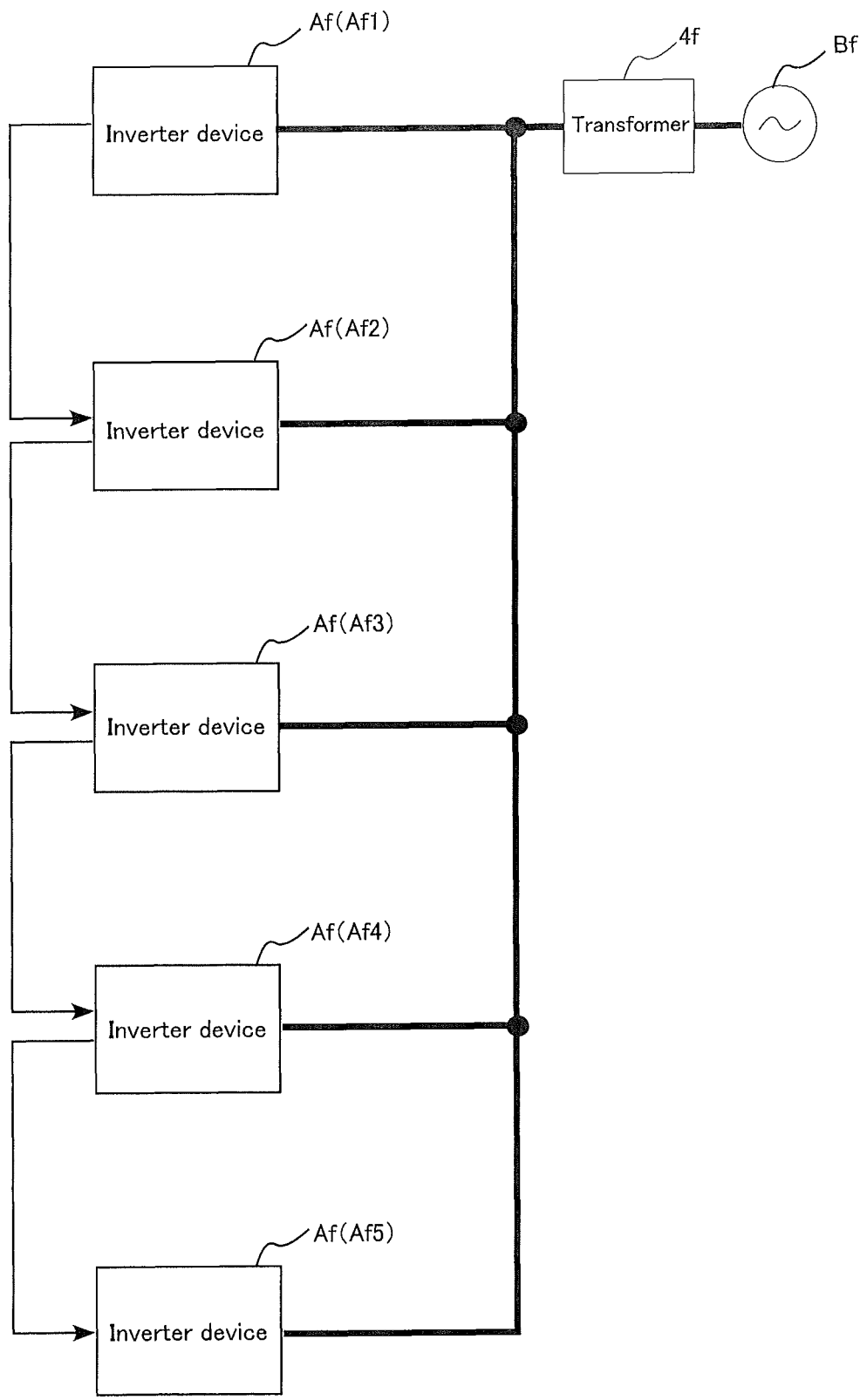
FIG. 41 is a diagram illustrating another communication state of inverter devices connected in parallel.

Note that although the case where each inverter device Af performs mutual communication was described in the first embodiment, the present invention is not limited thereto, and one-way communication may be performed. For example, as shown in FIG. 41, the inverter device Af1 only transmits to the inverter device Af2. The inverter device Af2 only receives from the inverter device Af1, and only transmits to the inverter device Af3. The inverter device Af3 only receives from the inverter device Af2, and only transmits to the inverter device Af4. The inverter device Af4 only receives from the inverter device Af3, and only transmits to the inverter device Af5. The inverter device Af5 only receives from the inverter device Af4. Even in such a case, the carrier phase $\theta_f$ can be synchronized. More generally, a condition for being able to synchronize the timing phase $\theta_i$ is a state in which an arbitrary inverter device Af provided in the grid-connected inverter system can be reached by following the transmission destinations from a certain inverter device Af provided in the grid-connected inverter system (a state including the "spanning tree" in graph theory).

In the first embodiment, the case was described where respectively different DC power sources 1f are connected to each inverter device Af, but the present invention is not limited thereto. For example, the output of one DC power source 1f may be distributed and input to each inverter device Af. Such a case will be described below.

Figure 42:
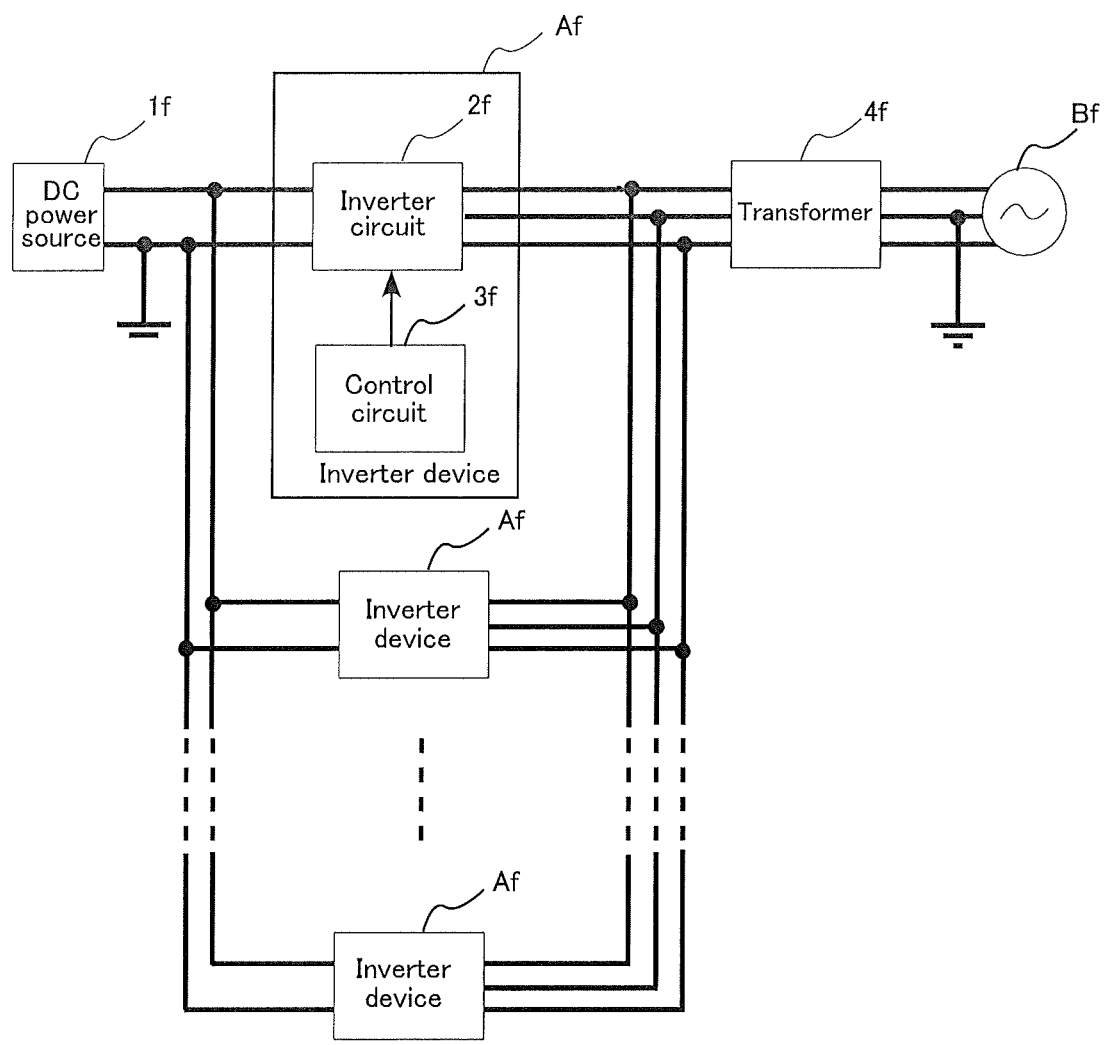
FIG. 42 is a diagram illustrating a grid-connected inverter system according to a second embodiment of the seventh aspect.

FIG. 42 is a diagram illustrating a grid-connected inverter system according to a second embodiment of the seventh aspect of the present invention. Note that, in the diagram, the same reference signs are given to constituent elements that are the same as or similar to the grid-connected inverter system shown in FIG. 38.

The grid-connected inverter system shown in FIG. 42 differs from the grid-connected inverter system (see FIG. 38) according to the first embodiment in that a plurality of inverter devices Af are connected in parallel to one DC power source 1f (anode is grounded by a grounding conductor).

Also, in the second embodiment, the carrier phases $\theta_i$ of all the inverter devices Af converge to the same value, thus enabling similar effects to the first embodiment to be achieved. Also, even if where there is a fault with one of the inverter devices Af, power conversion of the output power of the DC power source 1f can be shared among the other inverter devices Af. Also, the number of operating inverter devices Af can also be adjusted, according to the output power of the DC power source 1f. Furthermore, it is possible to reduce the number of wirings from the DC power source 1f to the inverter devices Af, compared with the case where a plurality of DC power sources 1f are connected to respectively different inverter devices Af. Accordingly, in the case where the DC power source 1f and the inverter devices Af are installed at separate locations, system installation man-hours, in particular, can be reduced.

In the above first and second embodiments, the case was described where inverter devices Af are interconnected to an electric power grid Bf, but the present invention is not limited thereto. For example, the present invention can be applied in the case where the output power of each inverter device Af is supplied to a predetermined load, rather than being supplied to the electric power grid Bf. Also, the present invention can be applied, even in the case of a power distribution grid in which a plurality of inverter devices Af are connected in parallel.

According to the seventh aspect of the present invention, a carrier phase generator generates a carrier phase, using an operation result that is based on a generated carrier phase and a carrier phase of another inverter device received by a communication unit. As a result of the carrier phase generator of each inverter device performing this processing, the carrier phases of all the inverter devices converge to the same value. Each of the inverter devices need only perform mutual communication with at least one inverter device (located nearby, for example), and it is not necessary for one of the inverter devices to communicate with all the other inverter devices. Accordingly, the system does not become large-scale. Even in the case where there is a fault with one of the inverter devices, the carrier phase can be synchronized if all of the other inverter devices can communicate with any of the inverter devices. Also, it is possible to respond flexibly to an increase or decrease in inverter devices.

<Eighth Aspect>

In an electric power system including a plurality of distributed power sources, the necessity arises to synchronize the internal phases of the respective distributed power sources. Various methods have been conventionally proposed as techniques for that purpose.

A new distributed power source may need to be added to an electric power system in which synchronization has been appropriately taken. However, with a conventional electric power system, the problem arises of the synchronization of the internal phases of the existing distributed power sources being disturbed due to the addition of the distributed power source. That is, the internal phase of the added distributed power source is not synchronized with the internal phases of the existing distributed power sources in the electric power system. Thus, when the added distributed power source starts communication, processing for synchronizing the internal phases as a whole is performed by the existing distributed power sources as well. The internal phases will thereby be in an unsynchronized state until resynchronization is completed.

In contrast, according to the eighth aspect of the present invention, a method for starting communication and a device that performs the method that are able to resolve the above-mentioned problem are provided.

Figure 44:
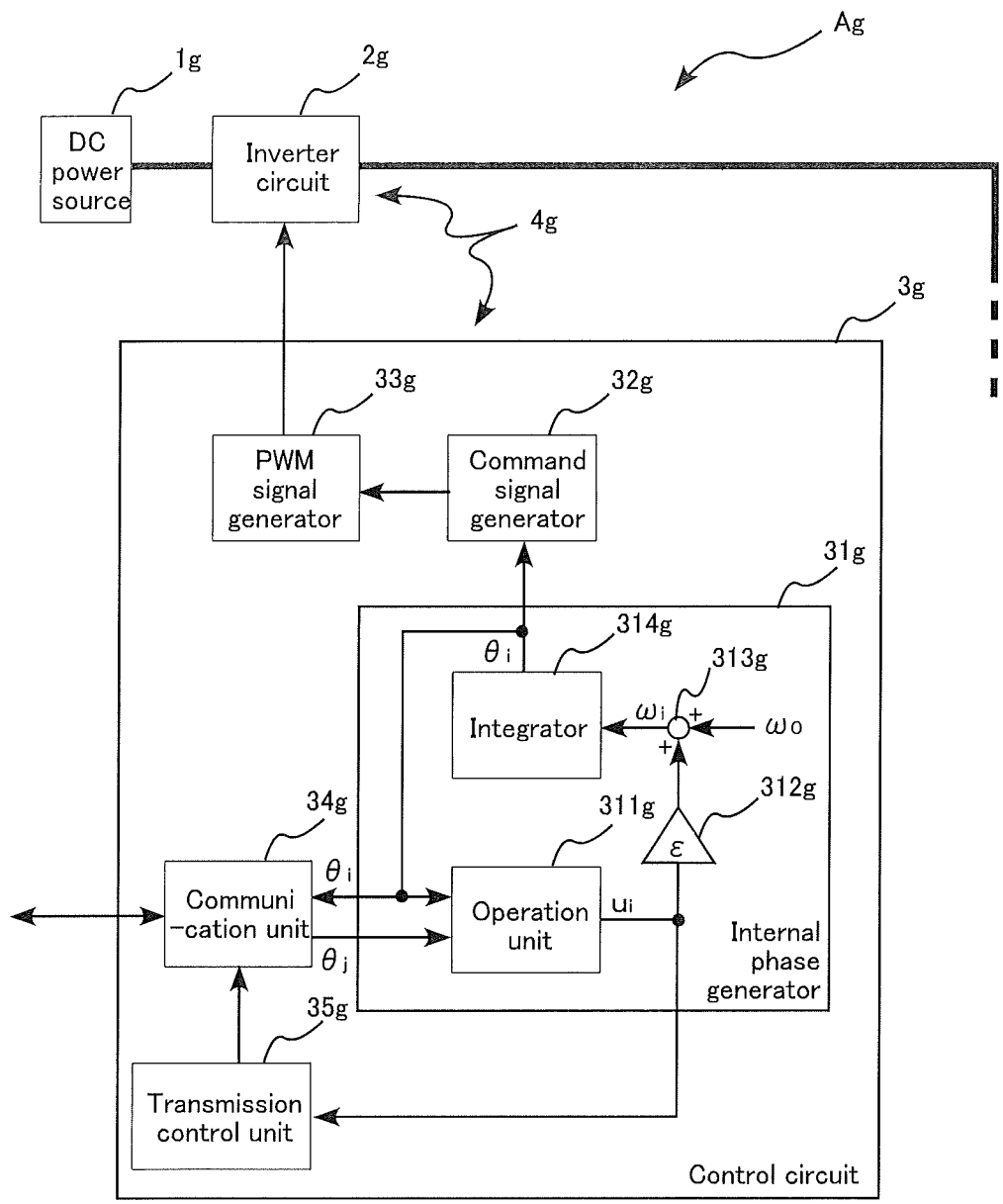
FIG. 44 is a diagram illustrating a distributed power source according to a first embodiment of an eighth aspect.
Figure 45:
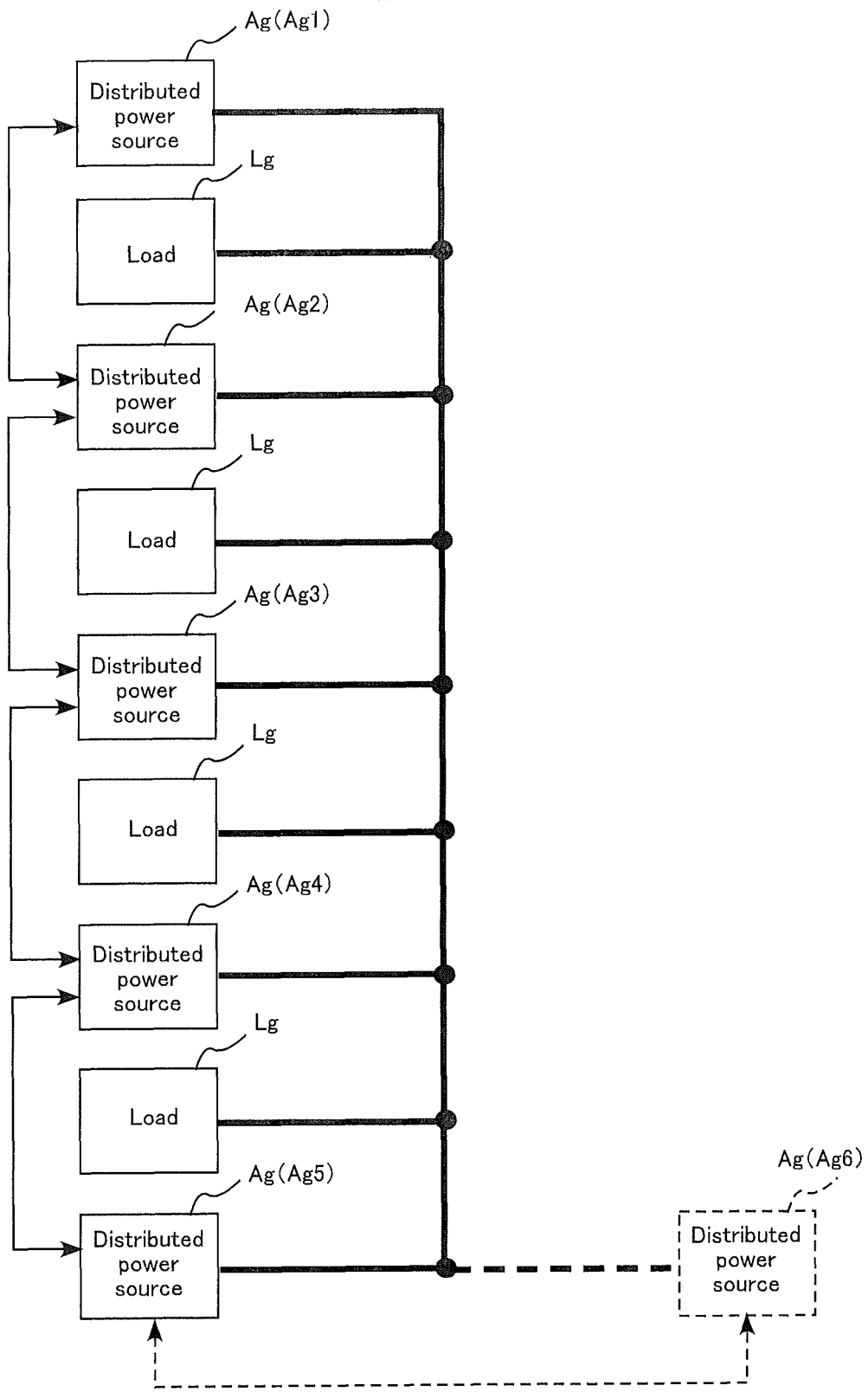
FIG. 45 shows an electric power system in which a plurality of distributed power sources are connected in parallel according to the first embodiment of the eighth aspect.

FIG. 44 is a diagram illustrating a distributed power source according to a first embodiment of the eighth aspect of the present invention. FIG. 45 shows an electric power system in which a plurality of distributed power sources are connected in parallel according to the first embodiment of the eighth aspect.

As shown in FIG. 44, a distributed power source Ag is provided with a DC power source 1g, an inverter circuit 2g, and a control circuit 3g. In the distributed power source Ag, DC power that is output by the DC power source 1g is converted into AC power and output by the inverter circuit 2g. Note that, although not shown, a transformer is provided on the output side of the inverter circuit 2g. In the present embodiment, the inverter circuit 2g and the control circuit 3g are packaged as an inverter device 4g (so-called power conditioner).

The DC power source 1g outputs DC power, and is provided with a solar cell, for example. The DC power source 1g outputs the generated DC power to the inverter circuit 2g. Note that the DC power source 1g may be a fuel cell, a storage battery, an electric double-layer capacitor or a lithium ion battery, instead of a solar cell. Also, the DC power source 1g may include an AC generator (diesel engine generator, micro gas turbine generator, wind turbine generator, etc.). In this case, AC power generated by the AC generator is output after being converted into DC power.

The inverter circuit 2g converts the DC power that is input from the DC power source 1g into AC power and outputs the AC power. The inverter circuit 2g is provided with a PWM control inverter and a filter that are not shown. The PWM control inverter is a three-phase inverter provided with three pairs of six switching elements in total that are not shown, and converts DC power into AC power by switching each switching element ON and OFF based on the PWM signal that is input from the control circuit 3g. The filter removes the high frequency component caused by the switching. Note that the inverter circuit 2g is not limited thereto. For example, the PWM control inverter may be a single-phase inverter or may be a multilevel inverter. Also, instead of PWM control, another method may be used such as phase shift control.

The DC power source 1g outputs DC power, and is provided with a solar cell, for example. The DC power source 1g outputs the generated DC power to the inverter circuit 2g. Note that the DC power source 1g may be a fuel cell, a storage battery, an electric double-layer capacitor or a lithium ion battery, instead of a solar cell. Also, the DC power source 1g may include an AC generator (diesel engine generator, micro gas turbine generator, wind turbine generator, etc.). In this case, AC power generated by the AC generator is output after being converted into DC power.

The control circuit 3g controls the inverter circuit 2g, and is realized by a microcomputer and the like, for example. The control circuit 3g generates the PWM signal based on the input voltage, output voltage, output current, or the like of the inverter circuit 2g that are detected by various sensors provided in the distributed power source Ag, and outputs the generated PWM signal to the inverter circuit 2g. The control circuit 3g is provided with an internal phase generation unit 31g, a command signal generation unit 32g, a PWM signal generation unit 33g, a communication unit 34g, and a transmission control unit 35g.

The internal phase generation unit 31g generates an internal phase $\theta_i$ that is used in order to generate a command signal. The internal phase generation unit 31g will be discussed in detail later.

The command signal generation unit 32g generates a command signal for performing output voltage control. The command signal generation unit 32g performs so-called three-phase to two-phase transformation (αβ transformation) and rotating coordinate transformation (dq transformation) on three-phase voltage signals obtained by detecting the output voltage of the inverter circuit 2g, and transforms the three-phase voltage signals into signals of a d-axis component and a q-axis component. Three-phase to two-phase transformation is processing for transforming three-phase AC signals into equivalent two-phase AC signals, with the three-phase AC signals being transformed into an AC signal of an α-axis component and an AC signal of a β-axis component by being respectively broken down into the components of the orthogonal α-axis and β-axis in a stationary orthogonal coordinate system (hereinafter, "stationary coordinate system") and components of each axis being added together. Also, rotating coordinate transformation is processing for transforming two-phase (α-axis component and β-axis component) signals of a stationary coordinate system into two-phase (d-axis component and q-axis component) signals of a rotating coordinate system. The rotating coordinate system is an orthogonal coordinate system that has a d-axis and a q-axis that are orthogonal, and rotates at a predetermined angular velocity. Rotating coordinate transformation is performed based on the internal phase $\theta_i$ that is input from the internal phase generation unit 31g.

The command signal generation unit 32g extracts only the DC component from the d-axis component and the q-axis component of the voltage signal, performs control processing separately on each, and performs stationary coordinate transformation (inverse dq transformation) and two-phase to three-phase transformation (inverse αβ transformation) on the two compensation signals to obtain three compensation signals. Stationary coordinate transformation involves performing the inverse processing of rotating coordinate transformation, and two-phase to three-phase transformation involves performing the inverse processing of three-phase to two-phase transformation. Stationary coordinate transformation is performed based on the internal phase $\theta_i$ that is input from the internal phase generation unit 31g. The command signal generation unit 32g generates three command signals from the sine wave signal generated based on the internal phase $\theta_i$ that is input from the internal phase generation unit 31g and the three compensation signals, and outputs the generated command signals to the PWM signal generation unit 33g.

The command signal generation unit 32g controls the input voltage of the inverter circuit 2g, although a description of this processing is omitted. Note that, in the present embodiment, the distributed power source Ag is described as being a three-phase system, but may be a single-phase system. In the case of a single-phase system, the command signal generation unit 32g need only be configured to control a single-phase voltage signal obtained by detecting the output voltage of the inverter circuit 2g.

The PWM signal generation unit 33g generates a PWM signal. The PWM signal generation unit 33g generates the PWM signal using the triangular wave comparison method, based on a carrier signal and the command signal that is input from the command signal generation unit 32g. For example, a pulse signal that is high if the command signal is greater than the carrier signal and low if the command signal is less than or equal to the carrier signal is generated as the PWM signal. The generated PWM signal is output to the inverter circuit 2g. Note that the PWM signal generation unit 33g is not limited to the case where the PWM signal is generated using the triangular wave comparison method, and may generate the PWM signal with a hysteresis method, for example.

The communication unit 34g communicates with other distributed power sources Ag. The communication unit 34g receives input of the internal phase $\theta_i$ generated by the internal phase generation unit 31g, and transmits the input internal phase $\theta_i$ to the communication unit 34g of another distributed power source Ag. Also, the communication unit 34g outputs an internal phase $\theta_j$ received from the communication unit 34g of another distributed power source Ag to the internal phase generation unit 31g. Note that the communication method may be wired communication or may be wireless communication.

As shown in FIG. 45, the distributed power source Ag is connected in parallel with other distributed power sources Ag in the electric power system. In FIG. 45, a state in which five distributed power sources Ag (Ag1 to Ag5) and four loads Lg are connected is shown. Note that more distributed power sources Ag and loads Lg are connected in an actual electric power system.

The solid arrows shown in FIG. 45 indicate mutual communication. The distributed power source Ag1 performs mutual communication with only the distributed power source Ag2, and the distributed power source Ag2 performs mutual communication with only the distributed power source Ag1 and the distributed power source Ag3. Also, the distributed power source Ag3 performs mutual communication with only the distributed power source Ag2 and the distributed power source Ag4, the distributed power source Ag4 performs mutual communication with only the distributed power source Ag3 and the distributed power source Ag5, and the distributed power source Ag5 performs mutual communication with only the distributed power source Ag4. Thus, the communication unit 34g of a distributed power source Ag need only communicate with the communication unit 34g of at least one distributed power source Ag (located nearby or with which communication has been established, for example), among the distributed power sources Ag connected to the electric power system, and be in a state where a communication path exists between two arbitrary distributed power sources Ag connected to the electric power system ("interlinked state"), and does not need to communicate with the communication units 34g of all the distributed power sources Ag connected to the electric power system.

For example, in the case of the distributed power source Ag2, the communication unit 34g transmits an internal phase $\theta_2$ generated by the internal phase generation unit 31g to the communication units 34g of the distributed power sources Ag1 and Ag3, receives an internal phase $\theta_1$ from the communication unit 34g of the distributed power source Ag1, and receive an internal phase $\theta_3$ from the communication unit 34g of the distributed power source Ag3.

The transmission control unit 35g controls the transmission function of the communication unit 34g. The transmission control unit 35g outputs a transmission prohibition signal to the communication unit 34g when a distributed power source Ag has just been added to the electric power system. For the duration that the transmission prohibition signal is being input, the communication unit 34g does not transmit the internal phase $\theta_i$ to the communication units 34g of other distributed power sources Ag. In other words, the communication unit 34g does not perform mutual communication, and performs one-way communication to only receive. The transmission control unit 35g judges that the internal phase $\theta_i$ matches the internal phase $\theta_j$ of the other distributed power sources Ag, if a state where an operation result $u_i$ (discussed later) that is input from the internal phase generation unit 31g is "0" continues for a predetermined period of time, and stops output of the transmission prohibition signal. In the present embodiment, the matching condition is given as the "0" state continuing for a predetermined period of time in order to eliminate the case where the operation result $u_i$ is transiently "0", but the present invention is not limited thereto, and the matching condition may be judged to be satisfied if the operation result $u_i$ is "0". The communication unit 34g starts transmission of the internal phase $\theta_i$ when input of the transmission prohibition signal is stopped. That is, the communication unit 34g begins to perform mutual communication.

Figure 46:
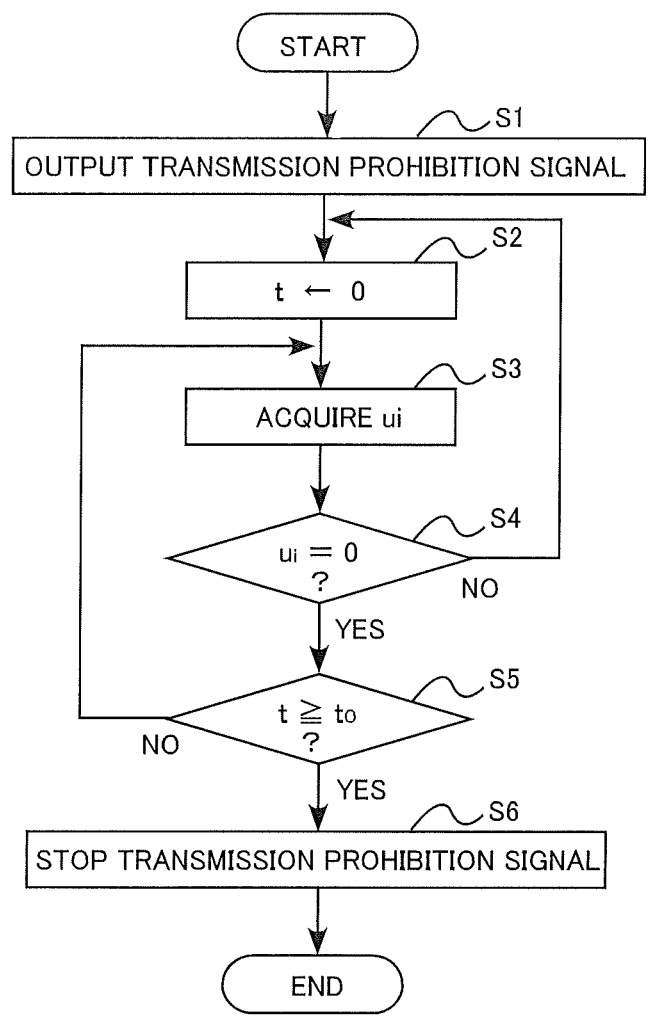
FIG. 46 is a flowchart for illustrating transmission control processing that is performed by a transmission control unit.

FIG. 46 is a flowchart for illustrating processing for controlling the transmission function of the communication unit 34g that is performed by the transmission control unit 35g ("transmission control processing"). Execution of the transmission control processing is started when a distributed power source Ag is added to the electric power system and starts communicating with other distributed power sources Ag.

First, the transmission prohibition signal is output to the communication unit 34g (S1). The transmission prohibition signal is a high-level signal, for example, and maintains a predetermined level until stopped. Next, a timer t is initialized to "0" (S2) and the operation result $u_i$ that is input from the internal phase generation unit 31g is acquired (S3). The timer t is a variable for clocking the state in which the operation result $u_i$ is "0".

Next, it is discriminated whether the operation result $u_i$ is "0" (S4). In the case where the operation result $u_i$ is not "0" (S4: NO), the processing returns to step S2. On the other hand, in the case where the operation result $u_i$ is "0" (S4: YES), it is discriminated whether the timer t has reached a predetermined time period $t_0$ (S5). If the timer t is less than the predetermined time period $t_0$ (S5: NO), the processing returns to step S3. On the other hand, if the timer t is greater than or equal to the predetermined time period $t_0$ (S5: YES), the transmission prohibition signal is stopped (S6) and the transmission control processing is ended. Note that this transmission control processing is exemplary processing, and the present invention is not intended to be limited thereto.

Next, the internal phase generation unit 31g of each distributed power source Ag will be described.

The internal phase generation unit 31g of the present embodiment is substantially the same as the internal phase generation unit 31a in the second aspect of the present invention. That is, the internal phase generation unit 31g of the present embodiment is provided with an operation unit 311g, a multiplier 312g, an adder 313g, and an integrator 314g, as shown in FIG. 44. In such a configuration, the internal phase generation unit 31g generates the internal phase $\theta_i$, using a generated internal phase $\theta_i$ and an internal phase $\theta_j$ of another distributed power source Ag that is input from the communication unit 34g. Even if the internal phase $\theta_i$ differs from the internal phase $\theta_j$, the internal phase $\theta_i$ and the internal phase $\theta_j$ converge to a common internal phase as a result of the operational processing by the internal phase generation unit 31g being repeated. The contents of the operational processing that is performed by each element (i.e., the operation unit 311g, the multiplier 312g, the adder 313g, and the integrator 314g) at this time is substantially the same as that described in the second aspect, and thus description thereof will be omitted.

Next, the action of the transmission control unit 35g when a distributed power source Ag is added to the electric power system will be described.

In the case where a distributed power source Ag is newly added to the electric power system and the communication unit 34g communicates with the communication unit 34g of another distributed power source Ag, synchronization of the internal phase $\theta_i$ of the distributed power source Ag included in the electric power system is disturbed when the communication unit 34g performs mutual communication straight away after being newly added. For example, in the case where a distributed power source Ag6 is newly added to the electric power system and the communication unit 34g communicates with the communication unit 34g of the distributed power source Ag5 in the electric power system shown in FIG. 45, the internal phase $\theta_5$ of the distributed power source Ag5 changes from the synchronized phase when mutual communication is suddenly started. The change in phase also affects the internal phases $\theta_1$ to $\theta_4$, and the internal phases $\theta_i$ change from the synchronized phase. Although the internal phases $\theta_i$ will converge to the same phase again as a result of the processing in the internal phase generation units 31g of the distributed power sources Ag1 to Ag6 being repeated, a state in which the internal phases $\theta_i$ of the distributed power sources Ag1 to Ag5 are not matched occurs when the distributed power source Ag6 starts mutual communication with the distributed power source Ag5.

Figure 47A:
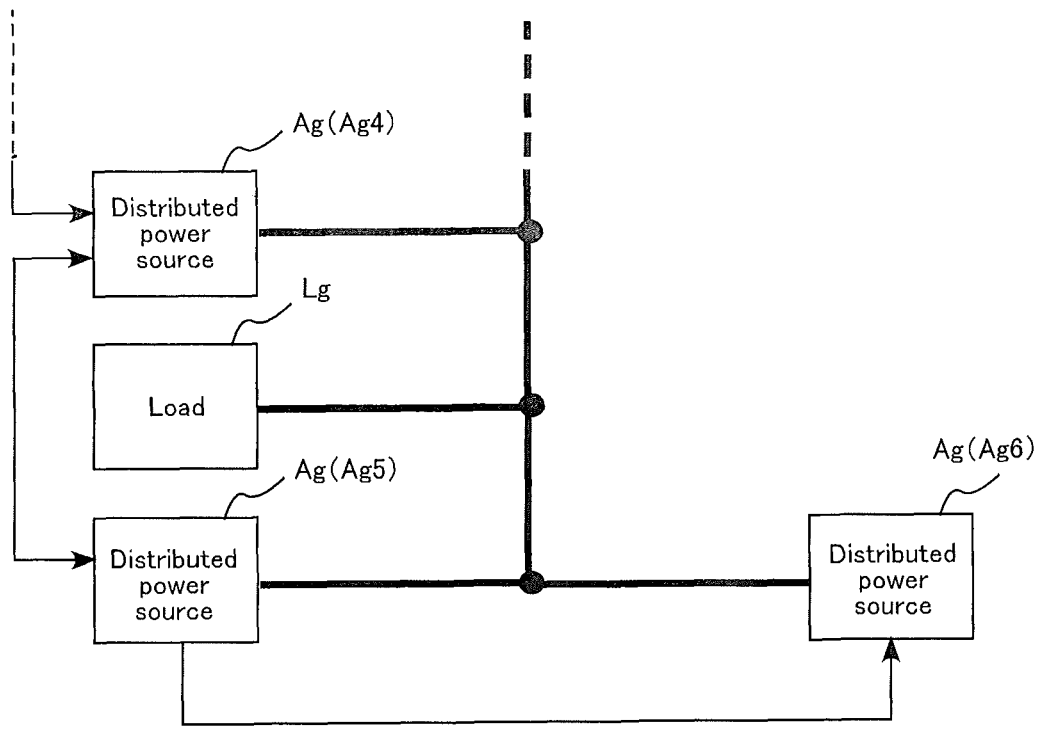
FIGS. 47A and 47B are diagrams illustrating the change in the communication state when newly adding a distributed power source in the electric power system shown in FIG. 45.

The transmission control unit 35g prohibits the communication unit 34g from transmitting the internal phase $\theta_i$ to the communication unit 34g of other distributed power sources Ag when a distributed power source Ag has just been added to the electric power system. This results in the communication unit 34g performing one-way communication to only receive. In the case where the distributed power source Ag6 is newly added to the electric power system and the communication unit 34g of the distributed power source Ag6 communicates with the communication unit 34g of the distributed power source Ag5 in the electric power system shown in FIG. 45, the distributed power source Ag6 will at first be a one-way communication state in which only transmission from distributed power source Ag5 to the distributed power source Ag6 is performed, as shown in FIG. 47A. In this state, because only the internal phase $\theta_5$ of the distributed power source Ag5 is transmitted to the distributed power source Ag6, and the distributed power source Ag5 does not receive the internal phase $\theta_6$ of the distributed power source Ag6, the internal phase $\theta_5$ is not changed by the internal phase $\theta_6$. On the other hand, the internal phase $\theta_6$ of the distributed power source Ag6 is changed by the internal phase $\theta_5$ received from distributed power source Ag5 to match the internal phase $\theta_5$.

Figure 47B:
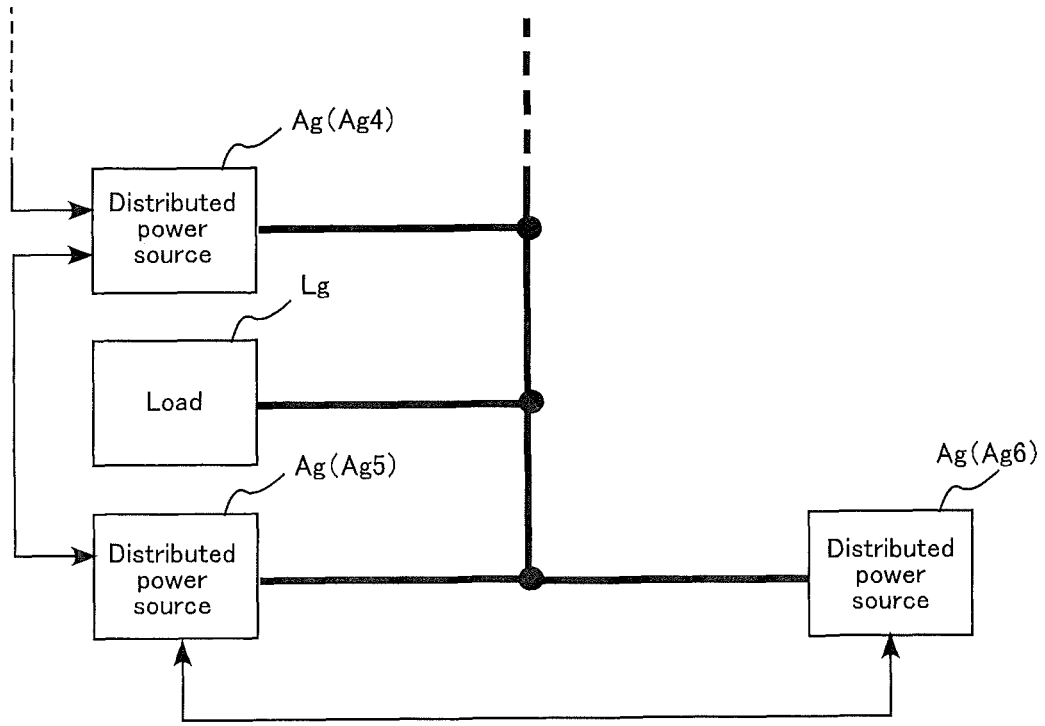

An operation result $u_6$ that is calculated by the internal phase generation unit 31g of the distributed power source Ag5 will be "0" when the internal phase $\theta_6$ matches the internal phase $\theta_5$. The transmission control unit 35g judges that the internal phase $\theta_6$ matches the internal phase $\theta_i$ of the other distributed power sources Ag, in the case where the state where the operation result $u_6$ is "0" continues for the predetermined time period $t_0$, and permits the communication unit 34g to transmit the internal phase $\theta_6$ to the communication unit 34g of the distributed power source Ag5. The communication unit 34g thereby starts performing mutual communication with the distributed power source Ag5 (see FIG. 47B).

According to the present embodiment, the transmission control unit 35g performs control such that the communication unit 34g performs one-way communication to only receive, from when the distributed power source Ag is added to the electric power system and the communication unit 34g starts communication until when the internal phase $\theta_i$ that is generated by the internal phase generation unit 31g matches the internal phases $\theta_i$ of the other distributed power sources Ag. The internal phase $\theta_i$ of the added distributed power source Ag can thereby be matched with the internal phases $\theta_i$ of the other existing distributed power sources Ag, without the internal phases $\theta_i$ of other existing distributed power sources Ag that communicate with the added distributed power source Ag being affected. Accordingly, the synchronization of the internal phases $\theta_i$ of other distributed power sources Ag is not disturbed, even if the communication unit 34g of the added distributed power source Ag starts communication.

In the above embodiment, the case was described where the internal phase of the distributed power source Ag (inverter device 4g) is matched, but the present invention is not limited thereto.

The present invention can also be applied in the case where other phases are matched, or where a prescribed internal value is matched. Also, the present invention can also be applied to devices (e.g., measurement devices, etc.) other than distributed power sources Ag (inverter devices 4g). In other words, the present invention can be applied in the case where internal values are matched by transmitting and receiving the internal values through the communication of a plurality of devices.

The invention claimed is:

1. A method involving at least a first device and a second device that are configured to perform a same function and disposed at respective first and second spaced locations, the method comprising:
    the first device generating a current timing signal defining a current timing of the function performed by the first device;
    the second device generating a current timing signal defining a current timing of the function performed by the second device;
    transmitting the current timing signal generated by the first device to the second device;
    transmitting the current timing signal generated by the second device to the first device;
    the first device generating a new timing signal defining a new timing of the function performed by the first device, the new timing signal being based on the current timing signal generated by the first device and on the current timing signal received from the second device; and
    the second device generating a new timing signal defining a new timing of the function performed by the second device, the new timing signal generated by the second device being based on the current timing signal generated by the second device and on the current timing signal received from the first device,
    wherein the new timing signal generated by the first device and the new timing signal generated by the second device are synchronized to have same physical properties, thereby causing the first device and the second device to perform the same function at a same timing, respectively,
    the method further comprising:
    adding a third device to a transmission network involving the first device and the second device in advance, wherein the third device is disposed at a third location spaced from the first location and the second location and configured to perform the same function as the first device and the second device;
    the third device receiving a new timing signal from at least one of the first device and the second device upon being added to the transmission network while also being prevented from transmitting any timing signal to the first device and the second device upon being added to the transmission network; and
    the third device transmitting a new timing signal generated by the third device to at least one of the first device and the second device after the new timing signal generated by the third device has the same physical property as the new timing signals generated by the first device and the second device.

2. The method according to claim 1, wherein the first device and the second device comprise a first distributed power source and a second distributed power source, respectively, and the physical properties are a phase.

3. The method according to claim 1, wherein the first device and the second device comprise a first inverter device and a second inverter device, respectively, and the physical properties are a phase.

4. The method according to claim 3, wherein the first inverter device comprises a first carrier signal generation unit and a first PWM signal generation unit connected to the first carrier signal generation unit, the first carrier signal generation unit generates a first carrier signal based on the new timing signal generated by the first device, and the first PWM signal generation unit generates a first PWM signal based on the first carrier signal,
    the second inverter device comprises a second carrier signal generation unit and a second PWM signal generation unit connected to the second carrier signal generation unit, the second carrier signal generation unit generates a second carrier signal based on the new timing signal generated by the second device, and the second PWM signal generation unit generates a second PWM signal based on the second carrier signal.

5. The method according to claim 2, wherein the first distribution power source and the second distribution power source comprise a first inverter circuit and a second inverter circuit, respectively, the function of the first device comprises controlling the first inverter circuit, and the function of the second device comprises controlling the second inverter circuit.

6. The method according claim 5, wherein the first distribution power source and the second distribution power source are detachably connected to a common power system.

7. The method according to claim 5, wherein the first inverter circuit and the second inverter circuit are connected to a first direct current power source and a second direct current power source, respectively.

8. The method according to claim 2, wherein the first distribution power source and the second distribution power source comprise a first islanding detection circuit and a second islanding detection circuit, respectively, the function of the first device comprises controlling the first islanding detection circuit, and the function of the second device comprises controlling the second islanding detection circuit.

9. The method according to claim 8, wherein the first distribution power source and the second distribution power source are detachably connected to a common power system.

10. The method according to claim 1, wherein the first device includes a timing signal generator that includes:
    an operation unit that performs an operation that is based on the current timing signal generated by the first device and the current timing signal received from the second device;

an addition unit in communication with the operation unit that adds an operation result that is output by the operation unit to a predetermined angular frequency, and that outputs an addition result as a corrected angular frequency; and an integration unit in communication with the addition unit that calculates the new timing signal by integrating the corrected angular frequency.

11. The method according to claim 10, wherein the operation unit subtracts the current timing signal generated by the first device from the current timing signal received from the second device, and adds together all subtraction results.

12. The method according to claim 10, wherein the operation unit subtracts the current timing signal generated by the first device from the current timing signal received from the second device and adds together all subtraction results to obtain a predetermined addition value, and divides the predetermined addition value by the number of other devices with which the first device communicates.

13. The method according to claim 10, wherein the operation unit subtracts the current timing signal generated by the first device from the current timing signal received from the second device and adds together all subtraction results to obtain a predetermined addition value, and multiplies the predetermined addition value by the current timing signal generated by the first device.

14. The method according to claim 10, wherein the operation unit subtracts the current timing signal generated by the first device from the current timing signal received from the second device and adds together all subtraction results to obtain a predetermined addition value, and multiplies the predetermined addition value by the square of the current timing signal generated by the first device.

* * * * *